(12) United States Patent
Hayashi et al.

(10) Patent No.: US 9,040,992 B2
(45) Date of Patent: May 26, 2015

(54) DISPLAY DEVICE

(71) Applicant: MITSUBISHI ELECTRIC CORPORATION, Tokyo (JP)

(72) Inventors: Masami Hayashi, Kumamoto (JP);
Kenichi Miyamoto, Kumamoto (JP);
Kazushi Yamayoshi, Kumamoto (JP);
Junichi Tsuchimichi, Kumamoto (JP)

(73) Assignee: Mitsubishi Electric Corporation, Tokyo (JP)

( * ) Notice: Subject to any disclaimer, the term of this patent is extended or adjusted under 35 U.S.C. 154(b) by 37 days.

(21) Appl. No.: 13/870,732

(22) Filed: Apr. 25, 2013

(65) Prior Publication Data

US 2013/0285079 A1    Oct. 31, 2013

(30) Foreign Application Priority Data

Apr. 26, 2012  (JP) ................. 2012-101193
Jan. 10, 2013  (JP) ................. 2013-002244

(51) Int. Cl.
| | |
|---|---|
| *H01L 29/04* | (2006.01) |
| *H01L 51/00* | (2006.01) |
| *H01L 33/44* | (2010.01) |
| *G02F 1/1345* | (2006.01) |
| *G02F 1/1362* | (2006.01) |

(52) U.S. Cl.
CPC ............. *H01L 33/44* (2013.01); *G02B 1/116* (2013.01); *G02F 1/1345* (2013.01); *G02F 1/13458* (2013.01); *G02F 1/136286* (2013.01); *G02F 2001/13629* (2013.01)

(58) Field of Classification Search
CPC ........ H01L 33/44; G02B 1/116; G02F 1/1345; G02F 1/13458; G02F 1/136286; G02F 2001/13629

USPC ............. 257/59, 88, 765, E29.147, E29.151, 257/E27.111; 313/311; 359/589; 438/158
See application file for complete search history.

(56) References Cited

U.S. PATENT DOCUMENTS

| | | | |
|---|---|---|---|
| 8,159,749 B2 | 4/2012 | Inoue et al. | |
| 8,482,189 B2 * | 7/2013 | Goto et al. | .............. 313/311 |
| 2005/0224795 A1 * | 10/2005 | Gotoh et al. | .............. 257/59 |
| 2007/0040172 A1 * | 2/2007 | Kawakami et al. | ......... 257/59 |
| 2007/0096098 A1 * | 5/2007 | Ishiga et al. | .............. 257/59 |

FOREIGN PATENT DOCUMENTS

| | | | |
|---|---|---|---|
| JP | 2004-317728 A | 11/2004 | |
| JP | 2007-123672 A | 5/2007 | |
| JP | 2010-079240 A | 4/2010 | |

* cited by examiner

*Primary Examiner* — Dao H Nguyen

(74) *Attorney, Agent, or Firm* — Studebaker & Brackett PC

(57) ABSTRACT

A display device includes a laminated wiring formed of a low-resistance conductive film, and a low-reflection film mainly containing Al and functioning as an antireflective film which are sequentially arranged on a transparent substrate, a wiring terminal part provided at an end part of the laminated wiring and has the same laminated structure as that of the laminated wiring, and an insulating film for covering the laminated wiring and the wiring terminal part, in which the insulating film side serves as a display surface side, the wiring terminal part has a first opening part penetrating the insulating film and the low-reflection film and reaching the low-resistance conductive film, and an outer peripheral portion of the first opening part has a laminated structure of the low-resistance conductive film, the low-reflection film, and the insulating film, in at least one part.

11 Claims, 34 Drawing Sheets

F I G . 1
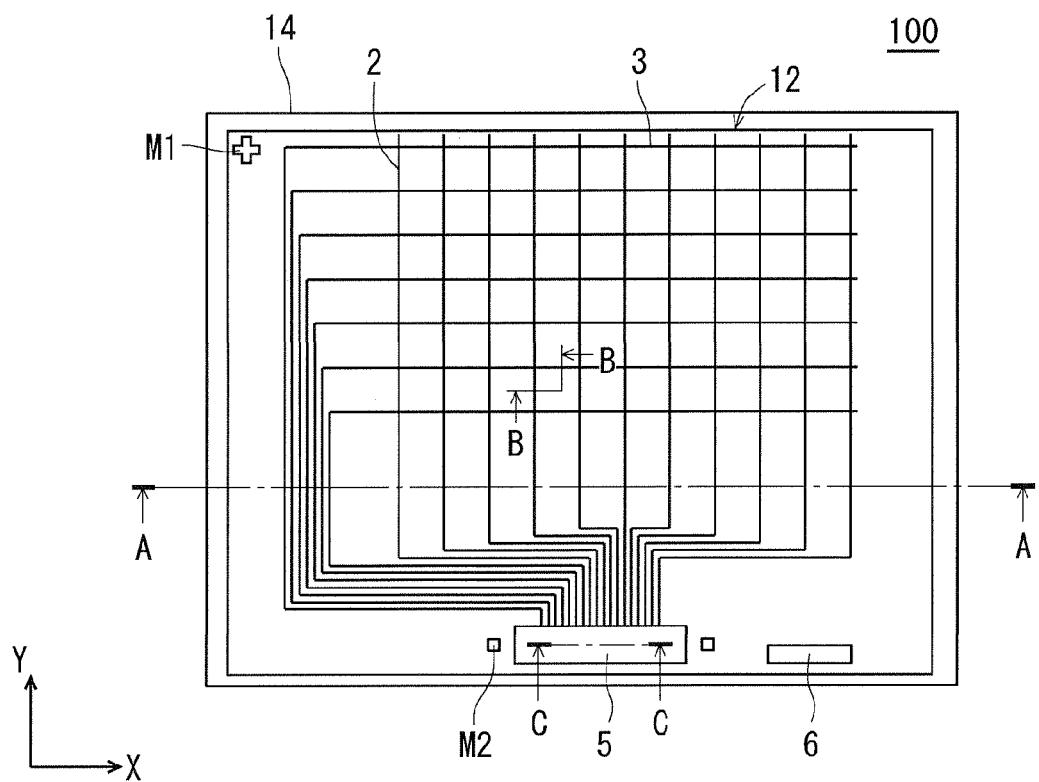
F I G . 2
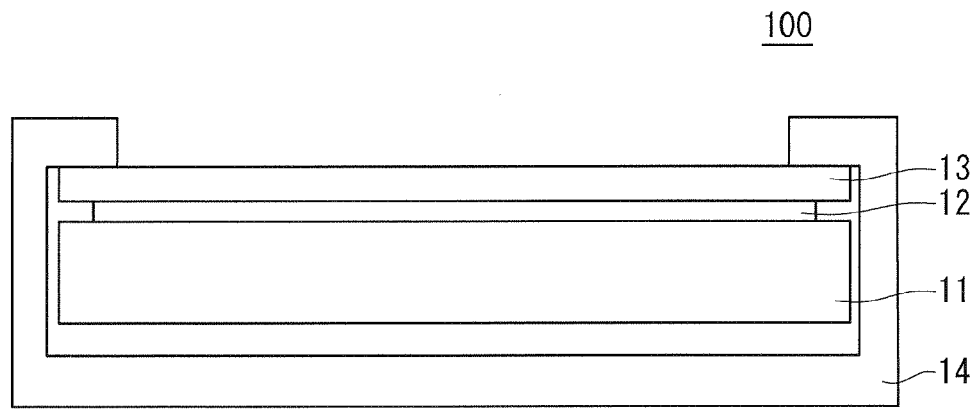

F I G . 1 1
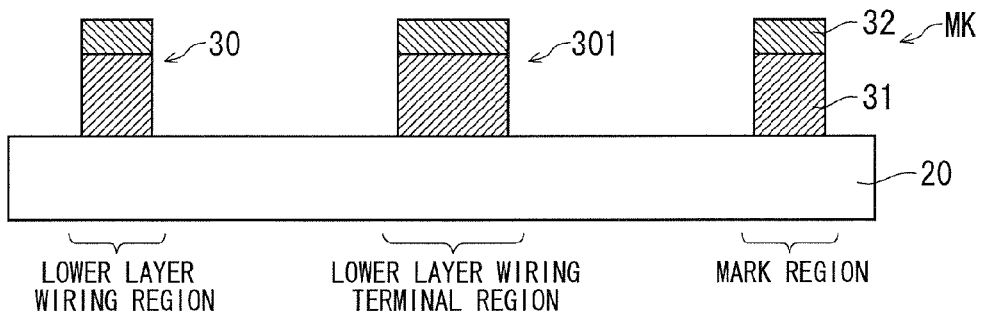
F I G . 1 2
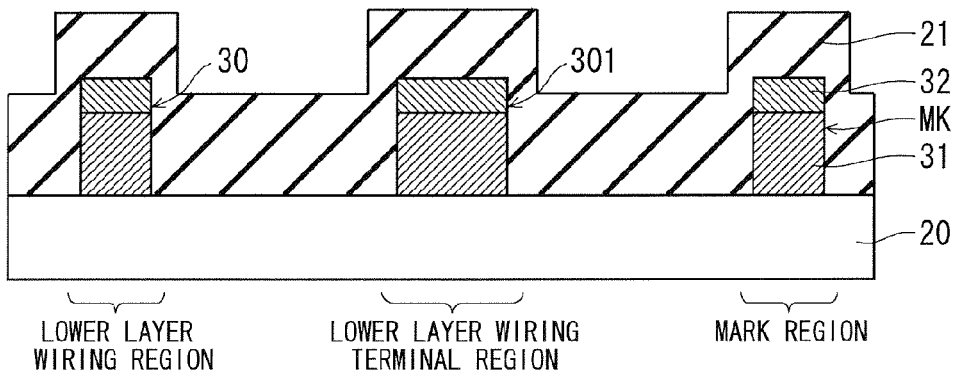
F I G . 1 3
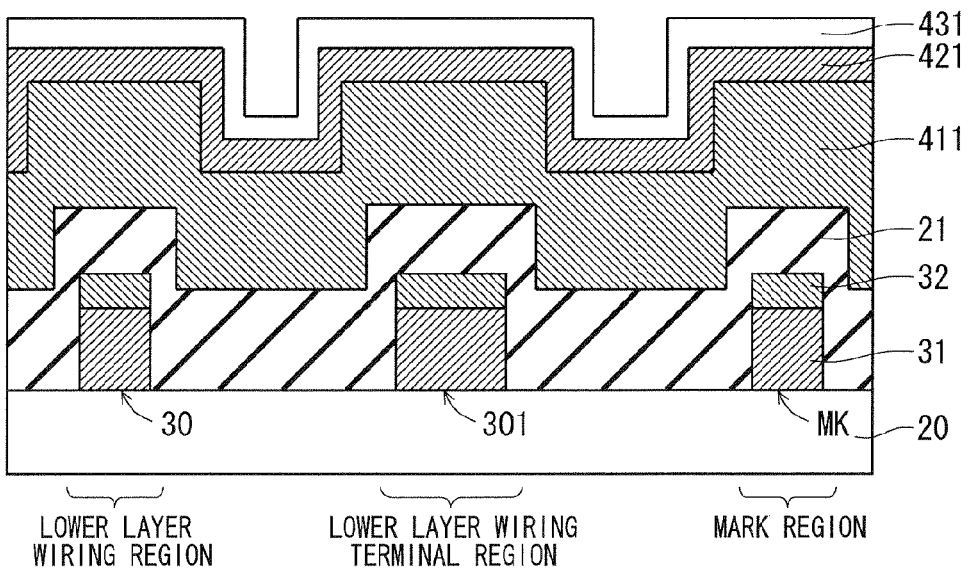

F I G . 6 0
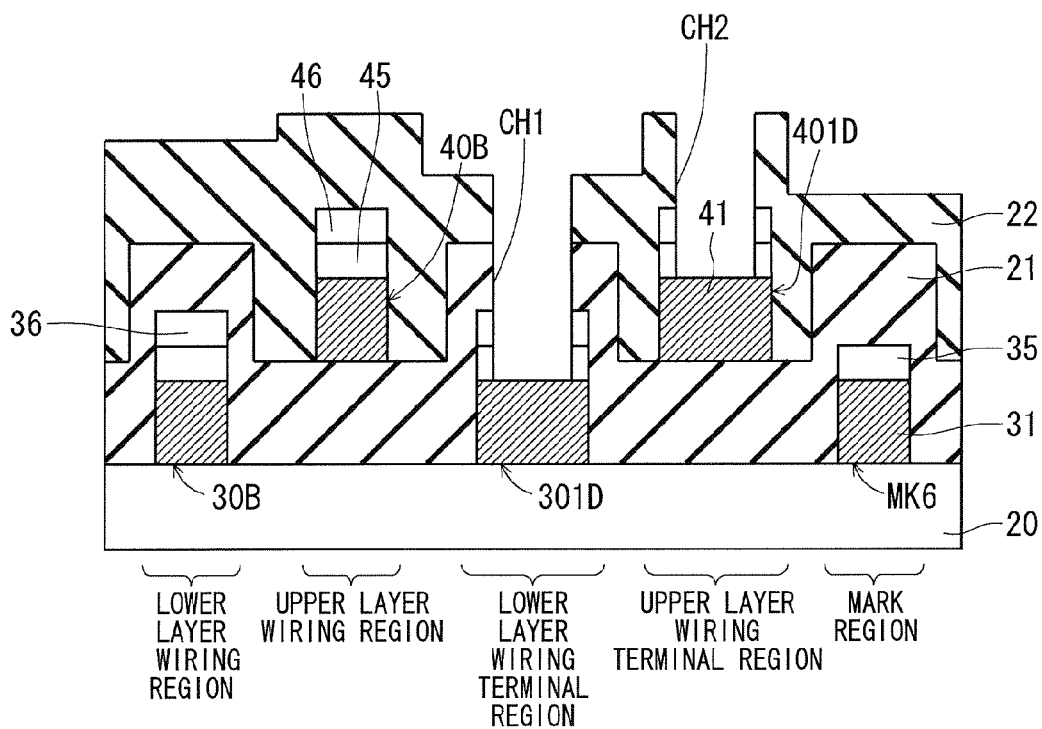
F I G . 6 1
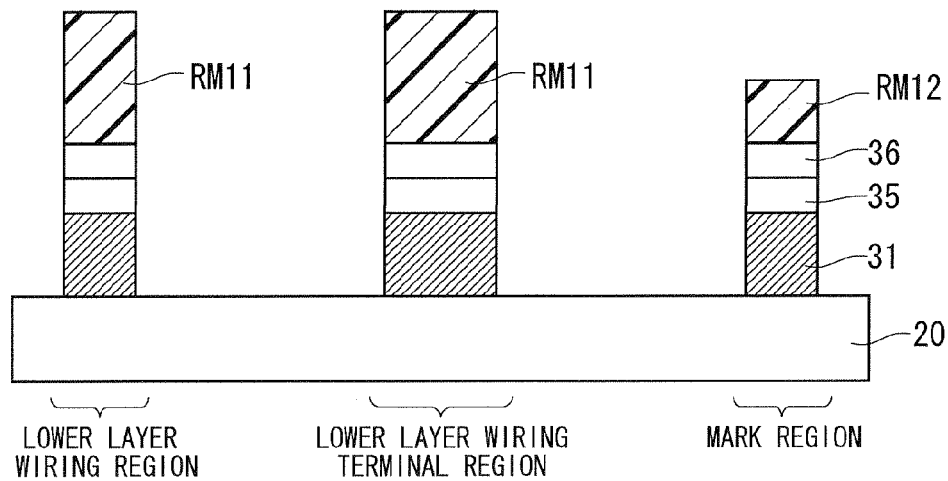

F I G. 6 2
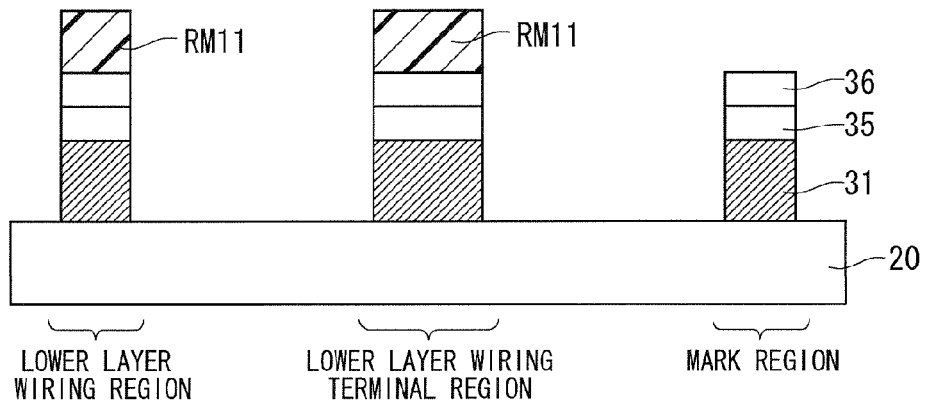
F I G. 6 3
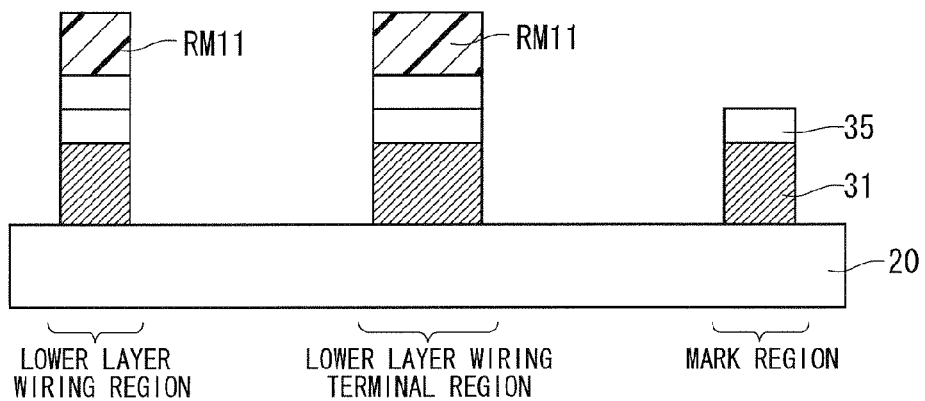
F I G. 6 4
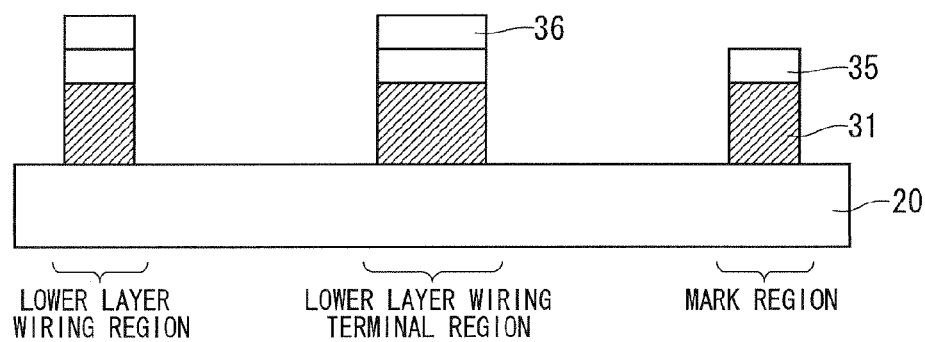

F I G . 6 5
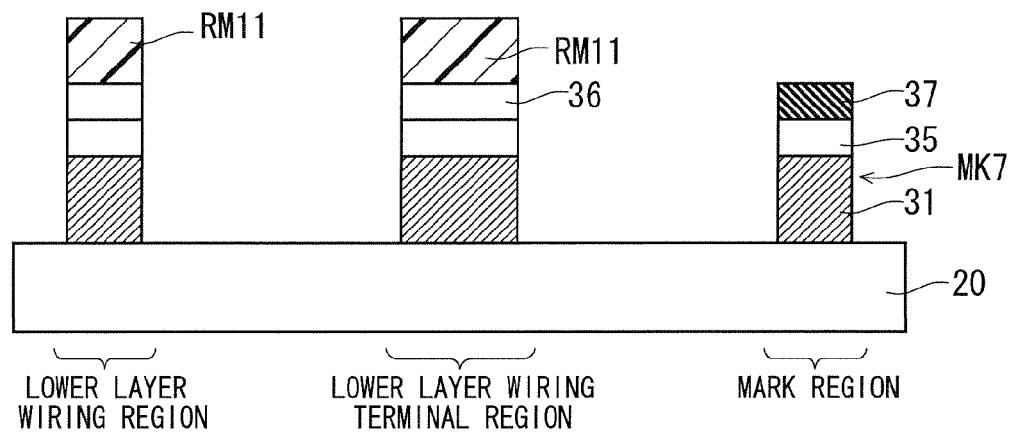
F I G . 6 6
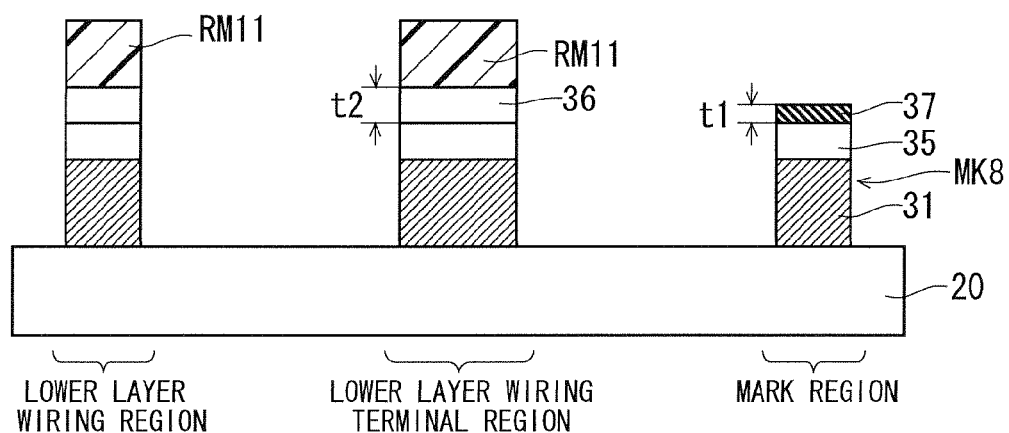

DISPLAY DEVICE

BACKGROUND OF THE INVENTION

1. Field of the Invention

The present invention relates to a display device and a method for manufacturing the same and more particularly, relates to a display device suitable for being used outdoors.

2. Description of the Background Art

As for the display device used outdoors, preferable display characteristics are required in an environment having a large amount of incident light from an outside of the display device such as a case where it is used under sunlight. Meanwhile, a wiring of the display device is required to be low in resistance and easily processed, so that an aluminum (Al) alloy is increasingly used as metal which satisfies the above requirement.

However, the aluminum alloy is high in reflectivity, and the problem is that incident light reflects on an aluminum alloy wiring, in the environment having the large amount of the incident light from the outside of the display device, so that preferable display characteristics cannot be obtained.

In order to reduce the reflection of light inputted from a display surface side, it is proposed that an antireflective film is arranged on the aluminum alloy wiring, and Japanese Patent Application Laid-Open No. 2010-79240 discloses an antireflective film formed of an aluminum film and an aluminum nitride film.

In addition, Japanese Patent Application Laid-Open No. 2007-123672 discloses a conductor structure in which an aluminum alloy film containing nickel and nitrogen is formed as an upper layer film.

Meanwhile, in the case where the antireflective film is formed on the wiring in order to reduce the reflection of the light inputted from the outside as described above, when an identification (ID) mark to identify a panel or an array substrate in steps of forming the wiring is to be formed at the same time, the problem is that a focusing operation could not be performed in an exposure apparatus for forming the ID, and various kinds of ID patterns could not be stably formed because reflectivity is low and intensity of the reflected light is low.

Furthermore, Japanese Patent Application Laid-Open No. 2004-317728 discloses a configuration in which an interlayer insulating film of an upper layer of an alignment mark is removed in order to optically detect the alignment mark formed on a wiring layer having a low-reflectivity titanium layer as its uppermost layer.

As described above, when the antireflective film is provided on the wiring layer in order to obtain preferable display characteristics in the environment having the large amount of light inputted from the outside of the display device, the problem is that the ID pattern cannot be stably formed on the wiring layer.

SUMMARY OF THE INVENTION

It is an object of the present invention to provide a display device capable of stably forming various kinds of ID patterns, even when having a configuration to reduce reflection on a wiring surface to be used outdoors.

A display device according to the present invention includes a laminated wiring formed of a conductive film and an antireflective film which are sequentially arranged on a base layer, a wiring terminal part provided at an end part of the laminated wiring and having a same laminated structure as that of the laminated wiring, and an insulating film for covering the laminated wiring and the wiring terminal part, in which the insulating film side serves as a display surface side, the wiring terminal part has a first opening part penetrating the insulating film and the antireflective film and reaching the conductive film, and an outer peripheral portion of the first opening part has a laminated structure of the conductive film, the antireflective film, and the insulating film, in at least one part.

According to the display device, the outer peripheral portion of the first opening part has the laminated structure of the conductive film, the antireflective film, and the insulating film, in at least one part, so that high contrast can be ensured due to weak reflected light on the outer peripheral portion of the first opening part, and strong reflected light on the conductive film exposed to a bottom part of the first opening part. When this configuration is applied to a mark used in a post-step, recognition precision of the mark can be improved, and yield is prevented from being reduced due to a cutting defect of a mother substrate and a connection defect of a FPC. Furthermore, when this is applied to an ID pattern, misidentification of the ID pattern by a reading apparatus can be reduced, so that working efficiency can be enhanced, and a manufacturing line can be stably implemented.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a plan view showing an entire configuration of a display device according to the present invention;

FIG. 2 is a cross-sectional view of the display device according to the present invention;

FIG. 8 to FIG. 18 are cross-sectional views for describing steps of manufacturing a touch panel of a first preferred embodiment according to the present invention;

FIG. 60 is a cross-sectional view showing a configuration of a touch panel of a fifth preferred embodiment according to the present invention;

FIG. 61 to FIG. 64 are cross-sectional views for describing steps of manufacturing the touch panel of the fifth preferred embodiment according to the present invention;

FIG. 65 and FIG. 66 are cross-sectional views for describing steps of manufacturing variations of the touch panel of the fifth preferred embodiment according to the present invention;

DESCRIPTION OF THE PREFERRED EMBODIMENTS

<Entire Configuration of Display Device>

Figure 3:
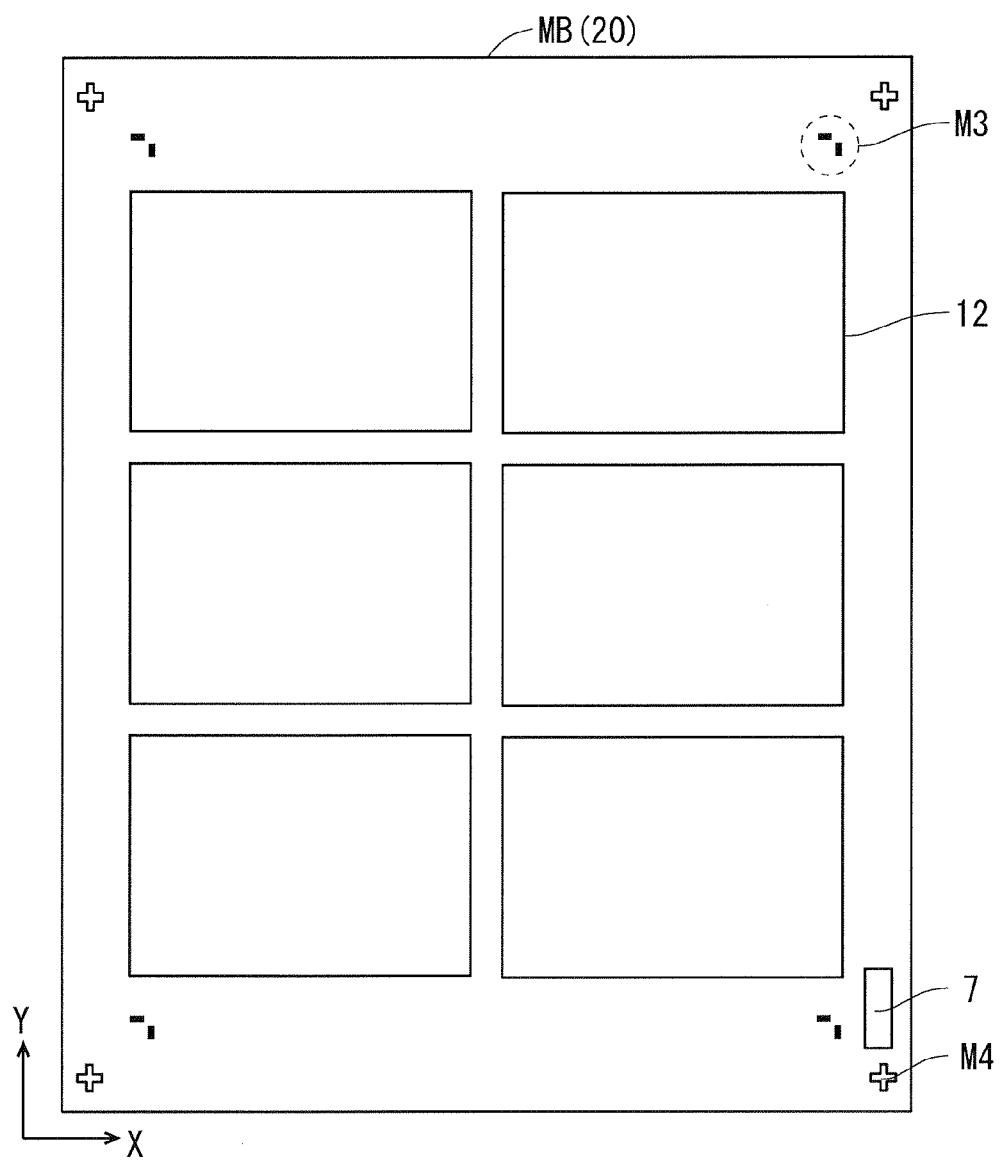
FIG. 3 is a view showing one example of an array substrate.

FIG. 1 is a plan view showing an entire configuration of a display device 100 according to the present invention, and FIG. 2 is a cross-sectional view taken along a line A-A in FIG. 1.

The display device 100 shown in FIG. 1 and FIG. 2 has a configuration capable of inputting data through a touch panel on the assumption that it is used outdoors, and has a pointing function with a finger, etc.

As shown in FIG. 2, the display device 100 is provided with a display module 11 such as a liquid crystal display, a touch panel 12 arranged on a display surface side of the display module 11, a protective glass 13 for protecting a surface of the touch panel 12 from being damaged, and a casing 14 for housing those components. When the touch panel 12 and the display module serving as a graphical user interface (GUI) device are combined and used, the display device can have the pointing function.

The touch panel 12 is a projected capacitive touch panel having a matrix wiring formed of an X position detecting wiring 2 arranged on a transparent substrate composed of glass or polyethylene terephthalate (PET) so as to extend in a column direction (Y direction in FIG. 1), and a Y position detecting wiring 3 arranged above the X position detecting wiring 2 so as to extend in a row direction (X direction in FIG. 1) and intersect with the X position detecting wiring 2 in a three-dimensional manner.

As shown in FIG. 1, the X position detecting wiring 2 and the Y position detecting wiring 3 are electrically connected to a terminal part 5 provided at a peripheral portion of the touch panel 12 so as to externally input or output a signal, through a lead-out wiring 4, so that the touch panel 12 is electrically connected to a control substrate (not shown) through the terminal part 5.

In addition, a description will be given assuming that the X position detecting wiring 2 serves as a lower layer wiring (provided on the transparent substrate side), and the Y position detecting wiring 3 serves as an upper layer wiring in the following preferred embodiment, but they may be reversely arranged.

In addition, a mark M1 for a post-step, an FPC aligning mark M2, and a panel identification mark (panel ID) 6 are formed on the touch panel 12. That is, according to the example in FIG. 1, the mark M1 for recognizing the post-step process is formed in each of two corners in an upper part of the touch panel 12 in the Y direction, the FPC aligning mark M2 is formed in the vicinity of an each end of the terminal part 5 extending in the X direction, and the panel ID 6 is formed in a peripheral portion of a lower part of the touch panel 12 in the Y direction.

The mark M1 for recognizing the post-step process is used in a step after the X position detecting wiring 2 and the Y position detecting wiring 3 have been formed, the FPC aligning mark M2 is used for aligning the FPC when the FPC (flexible printed circuit) is connected to the terminal part 5, and the panel ID 6 is a mark for identifying the touch panel 12.

Here, it is to be noted that according to a method for manufacturing the touch panel or the liquid crystal panel, the plurality of panels are arranged and formed on one mother substrate, several kinds of steps are performed on the plurality of panels at the same time, and then, the mother substrate is divided to divide the touch panels individually after completion of a predetermined step.

In this way, the mother substrate having the plurality of panels is referred to as an array substrate, and in the steps with the array substrate, each panel is identified by the panel ID, and the array substrate is identified by a sheet ID which is attached on a certain position in the array substrate.

FIG. 3 shows one example of the array substrate. FIG. 3 shows that the six touch panels 12 are formed on one mother substrate MB, and the six touch panels 12 are arranged such that three of them are arranged in the Y direction, and two of them are arranged in the X direction. Thus, in certain positions of the mother substrate MB, there are a sheet ID 7, an alignment mark M3 used in a photolithography process performed when an upper layer wiring pattern is overlapped on a lower layer wiring pattern, and in a photolithography process performed when a terminal opening pattern is aligned with the lower layer wiring pattern and the upper layer wiring pattern, and a cutting mark M4 used for cutting the mother substrate MB to isolate the touch panels 12 individually. That is, according to the example shown in FIG. 3, the cutting mark M4 is formed in each of the four corners of the mother substrate MB, the alignment mark M3 is formed in the vicinity of each of the four cutting marks M4, and the sheet ID 7 is formed in the vicinity of the cutting mark M4 which is positioned in a lower part in the Y direction and in a peripheral portion in the X direction in the mother substrate MB.

<First Preferred Embodiment>

Figure 4:
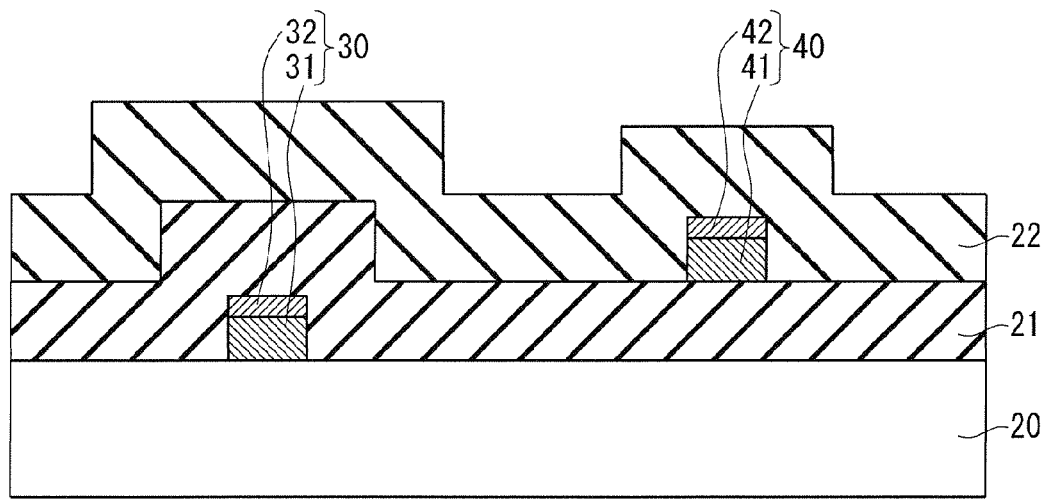
FIG. 4 and FIG. 5 are cross-sectional views of a touch panel of the display device according to the present invention.

Hereinafter, a first preferred embodiment according to the present invention will be described with reference to cross-sectional configurations of the touch panel 12. FIG. 4 is a view showing one cross-sectional configuration of the touch panel 12 taken along a line B-B in FIG. 1.

As shown in FIG. 4, the touch panel 12 has a configuration in which a lower layer wiring 30 is formed of laminated films of a low-resistance conductive film 31 serving as a lower layer, and a low-reflection film 32 serving as an upper layer, on a transparent substrate 20 (equivalent to the mother substrate) composed of glass or PET, and an interlayer insulating film 21 is provided so as to cover the lower layer wiring 30. The lower layer wiring 30 corresponds to the X position detecting wiring 2 shown in FIG. 1. In addition, the transparent substrate 20 serves as a base for forming the lower layer wiring 30, so that it is referred to as a base layer occasionally. Furthermore, the low-reflection film 32 is referred to as an antireflective film occasionally.

An upper layer wiring 40 is formed of laminated films of a low-resistance conductive film 41 serving as a lower layer, and a low-reflection film 42 serving as an upper layer, on the interlayer insulating film 21, and a protective film 22 is provided so as to cover the upper layer wiring 40. The upper layer wiring 40 corresponds to the Y position detecting wiring 3 shown in FIG. 1. In addition, the interlayer insulating film 21 serves as a base for forming the upper layer wiring 40, so that it is referred to as a base layer occasionally.

The low-resistance conductive film 31 is composed of Al series alloy serving as a low resistance material such as AlNiNd, and has a thickness of 300 nm, for example.

The low-reflection film 32 is formed of an aluminum (Al) nitride film having a high degree of nitridation in which a degree of nitridation is 30 at % to 50 at % (atomic %) as a composition ratio of nitrogen, and has a thickness of 50 nm, for example.

The interlayer insulating film 21 is composed of $SiO_2$, and has a thickness of 600 nm, for example.

The low-resistance conductive film 41 is composed of aluminum (Al) series alloy serving as a low resistance material such as AlNiNd, and has a thickness of 400 nm, for example.

The low-reflection film 42 is formed of an aluminum (Al) nitride film having a high degree of nitridation in which a degree of nitridation is 30 at % to 50 at % (atomic %) as a composition ratio of nitrogen, and has a thickness of 50 nm, for example.

In addition, reflectivity of the Al nitride film can be 50% or less by appropriately selecting the degree of nitridation from the condition of 30 at % to 50 at % as the composition ratio of nitrogen, and the reflectivity can be 30% or less by setting the degree of nitridation at about 45 at % as the composition ratio of the nitrogen. In addition, an optimal low-reflection film can be provided by adjusting its film thickness based on the degree of nitridation.

The protective film 22 is composed of $SiO_2$, and has a thickness of 300 nm, for example.

In addition, the description has been given of the example in which the low-reflection films 32 and 42 are composed of AlN in the above, but they may be formed of metal (metal nitride) which is provided by nitriding an Al series alloy mainly containing Al and also containing another metal, instead of AlN. Another metal includes Fe, Co, and Ni as group 8 transition metals, and Nd as a rare earth element.

In addition, the upper layer wiring 40 serving as the Y position detecting wiring 3 is longer than the lower layer wiring 30 in the above, so that the low-resistance conductive film 41 is thicker than the low-resistance conductive film 31 in order to reduce wiring resistance, but the film thicknesses of the conductive films of the lower layer wiring 30 and the upper layer wiring 40 may be arbitrarily determined based on required resistance.

In addition, the description has been given of the case where the low-resistance conductive films 31 and 41 are composed of Al series alloy, but they are not limited thereto and may be composed of Ag instead.

In addition, a variation in reflection distribution of the low-reflection films 32 and 42 can be reduced by keeping their film thickness distribution with respect to set film thicknesses at the time of completion of the process under the condition that a minimum film thickness/a maximum film thickness >0.6.

In addition, according to this preferred embodiment, the reflectivity is set to the extent that the alignment mark can be recognized in the photolithography processes for aligning the upper layer wiring on the lower layer wiring and for forming the opening part in the terminal, in the steps (array step) for the array substrate.

The film thickness of the interlayer insulating film 21 may be arbitrarily determined based on desired electrostatic capacitance, and as for the protective film 22, its film thickness may be determined based on etching selectivity with respect to a resist film and a process time at the time of a dry etching process, but when the thickness is large, differences in color and reflectivity from the lower layer wiring 30 can be small in many cases, so that it may be set at about 1 μm, and preferably set at 1.3 μm or more.

Figure 5:
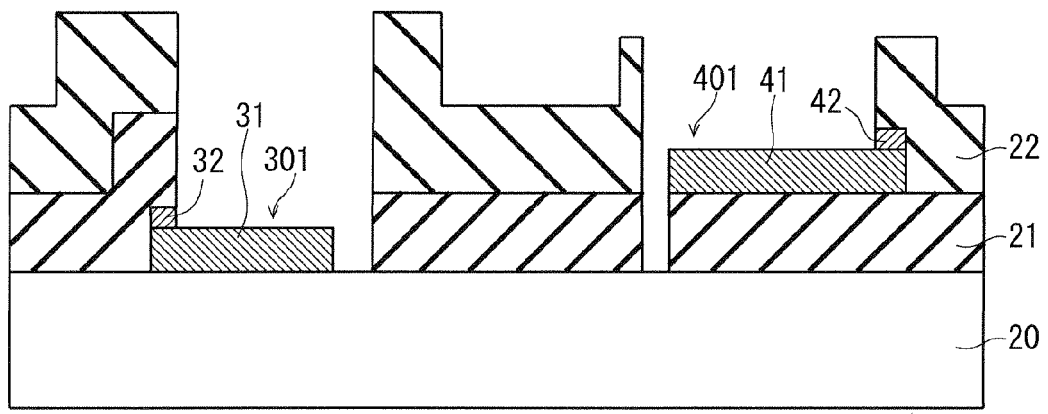

FIG. 5 is a view showing a cross-sectional configuration taken along a line C-C in the terminal part 5 of the touch panel 12 shown in FIG. 1. The terminal part 5 has a lower layer wiring terminal 301 connected to the lower layer wiring 30, and an upper layer wiring terminal 401 connected to the upper layer wiring 40, and the lower layer wiring terminal 301 is formed in the same step as the lower layer wiring 30, and the upper layer wiring terminal 401 is formed in the same step as the upper layer wiring 40.

As show in FIG. 5, the lower layer wiring terminal 301 is formed of the low-resistance conductive film 31 arranged on the transparent substrate 20 and the low-reflection film 32 arranged thereon, in which a contact hole CH1 is formed so as to penetrate the interlayer insulating film 21 and the protective film 22 provided in an upper part of the lower layer wiring terminal 301. In addition, the low-reflection film 32 provided just below the contact hole CH1 has been removed, and the contact hole CH1 reaches the low-resistance conductive film 31. In addition, the contact hole is also referred to as the opening part.

In addition, the upper layer wiring terminal 401 is formed of the low-resistance conductive film 41 arranged on the interlayer insulating film 21 and the low-reflection film 42 arranged thereon, in which a contact hole CH2 is formed so as to penetrate protective film 22 provided in an upper part of the upper layer wiring terminal 401. In addition, the low-reflection film 42 provided just below the contact hole CH2 has been removed, and the contact hole CH2 reaches the low-resistance conductive film 41. The control substrate is electrically connected to the FPC through the contact holes CH1 and CH2.

In addition, as another configuration, in a case where connection resistance is low and there is no problem in the operation of the touch panel even when the FPC is connected through the low-reflection films 32 and 42, the low-reflection films 32 and 42 are not necessarily removed completely from the bottom parts of the contact holes CH1 and CH2, and the reflectivity can be closer to that of the low-resistance conductive films 41 and 42 when the low-reflection films 32 and 42 are thinned.

Next, a description will be given of configurations of the cutting mark M4, the FPC aligning mark M2, and the panel ID 6, with reference to FIG. 6 and FIG. 7.

Figure 6:
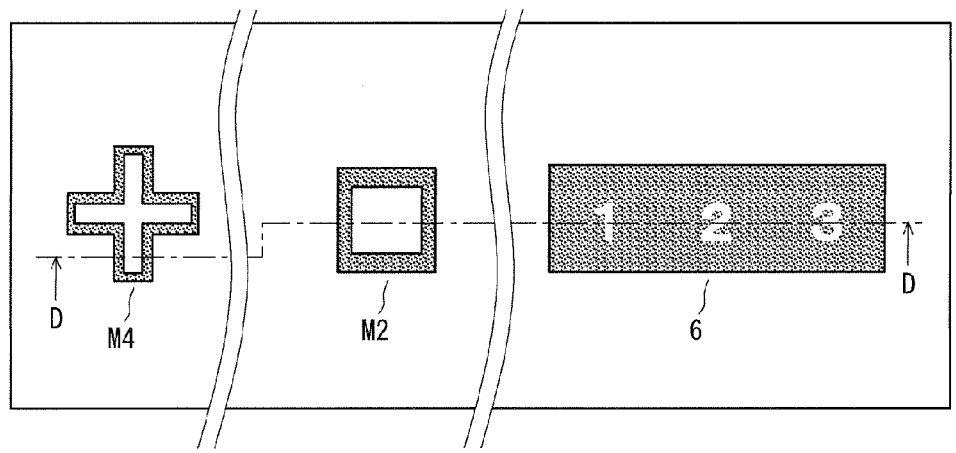
FIG. 6 is a plan view showing configurations of a mark and an ID.
Figure 7:
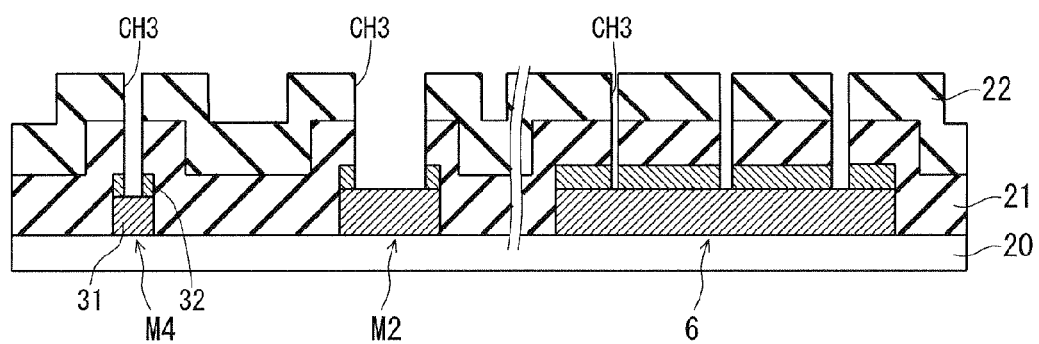
FIG. 7 is a cross-sectional view showing the configurations of the mark and the ID.

FIG. 6 shows one example of planar shapes of the cutting mark M4, the FPC aligning mark M2, and the panel ID 6, and FIG. 7 is a view showing cross-sectional configurations taken along a line D-D in FIG. 6.

As shown in FIG. 6, a planar shape of the cutting mark M4 is a cross shape, and its peripheral portion serving as an outline of the cross shape is formed of the laminated films of the low-reflection film 32, the low-resistance conductive film 31, the interlayer insulating film 21, and the protective film 22, and its center portion of the cross shape is formed of the low-resistance conductive film 31 such that the low-resistance conductive film 31 is exposed to a bottom part of a contact hole CH3 which penetrates the interlayer insulating film, the protective film 22, and the low-reflection film 32, as shown in FIG. 7.

As shown in FIG. 6, a planar shape of the FPC aligning mark M2 is a square shape, and its peripheral portion serving as an outline of the square shape is formed of the laminated films of the low-reflection film 32, the low-resistance conductive film 31, the interlayer insulating film 21, and the protective film 22, and its center part of the square shape is formed of the low-resistance conductive film 31 such that the low-resistance conductive film 31 is exposed to the bottom part of the contact hole CH3 which penetrates the interlayer insulating film 21, the protective film 22, and the low-reflection film 32, as shown in FIG. 7.

In addition, as shown in FIG. 6, the panel ID 6 is configured such that arranged numbers are patterned in the low-reflection film 32 having a rectangular shape in a planar view, and as shown in FIG. 7, the number part is formed of the low-reflection film 32, and the other part is formed of the laminated films of the low-reflection film 32, the low-resistance conductive film 31, the interlayer insulating film 21, and the protective film 22. In addition, a shape of the number is defined by a planar shape of the contact hole CH3 which penetrates the interlayer insulating film 21, the protective film 22, and the low-reflection film 32, as shown in FIG. 7.

Thus, by exposing the low-resistance conductive film 31 to the bottom part of the contact hole CH3, high contrast can be ensured due to strong reflected light on the low-resistance conductive film 31, and weak reflected light on the low-reflection film 32, so that recognition precision of the mark used in the post-step can be improved, and as a result, yield is prevented from being reduced due to a cutting defect of the mother substrate and a connection defect of the FPC. In addition, an error in recognition of the ID pattern by an apparatus for reading the ID pattern can be reduced, so that working efficiency can be enhanced and a manufacturing line can be stably implemented.

Furthermore, in the above description, the low-resistance conductive film 31 is exposed to the bottom part of the contact hole CH3, and peripheries of the mark and the ID pattern are surrounded with the low-reflection film 32, but as another configuration, the mark and the ID pattern may be provided such that the low-resistance conductive film 31 is exposed to the contact hole CH3 which is formed around the low-reflection film 32. The former and the latter have negative and positive relationship.

Next, a method for manufacturing the display device in the first preferred embodiment according to the present invention will be described, with reference to FIG. 8 to FIG. 18 which are cross-sectional views sequentially showing steps of manufacturing the touch panel 12.

Figure 8:
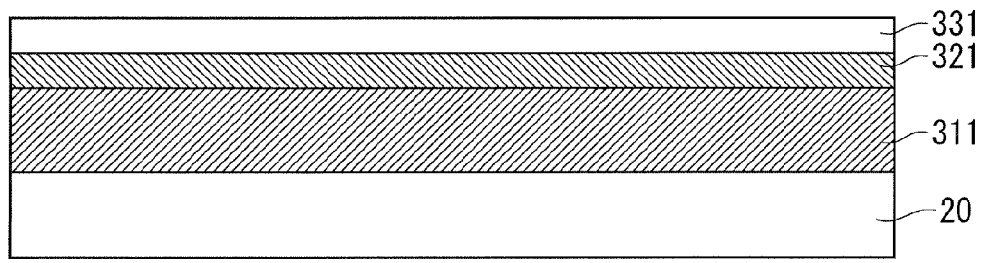

First, in a step shown in FIG. 8, an AlNiNd film 311 having a thickness of 300 nm is formed with AlNiNd target, on the transparent substrate 20 composed of glass or PET, by sputtering. Then, in the same film forming apparatus, an Al nitride alloy film 321 having a high degree of nitridation and a thickness of 50 nm is formed with AlNiNd target, on the AlNiNd film 311 in an atmosphere containing $N_2$ gas, by sputtering.

In addition, when the degree of nitridation of the Al nitride alloy film 321 is low, the film becomes a reflective film and the low-reflection film cannot be formed, but on the contrary, when the degree of nitridation is high, the film becomes the transparent film and the low-reflection film cannot be formed, so that it is preferable to previously obtain a relationship between a $N_2$ partial pressure and reflection characteristics in the film forming apparatus to be used, and determine a film formation condition so that a low-reflection film having a desired reflectivity can be provided.

Then, an amorphous indium tin oxide (ITO) film 331 is formed on the Al nitride alloy film 321 by sputtering to have a thickness of 30 nm to 50 nm. In addition, instead of sputtering, a method such as coating may be used.

Then, a resist material is applied to the ITO film 331, pattern of the lower layer wiring, the lower layer wiring terminal, and the mask are exposed and developed to pattern a resist mask (shown as a resist mask RM1 in FIG. 9) having patterns of the lower layer wiring, the lower layer wiring terminal, and the mark kind (such as the mark and the ID). In addition, in the following drawings, a region in which the lower layer wiring is formed is referred to as a lower layer wiring region, a region in which the lower layer wiring terminal is formed is referred to as a lower layer wiring terminal region, and a region in which the mark kind is formed is referred to as a mark region. Furthermore, the lower layer wiring region, the lower layer wiring terminal region, and the mark region are formed in alignment in FIG. 9 to FIG. 18, but this is only for convenience in describing the concept of the present invention in a plain way.

Figure 9:
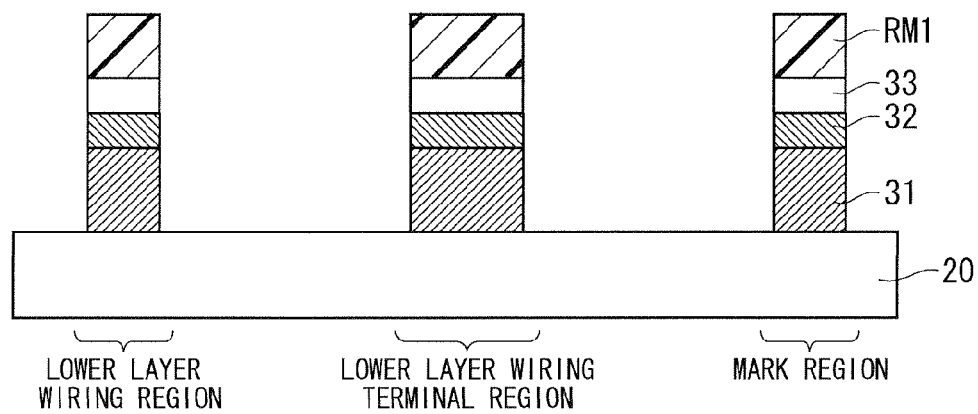

Then, as shown in FIG. 9, with the resist mask RM1 used as an etching mask, the ITO film 331 is etched, for example with oxalic acid solution to pattern a cap film 33 (functioning as an etching protective film). Then, with the resist mask RM1 and the cap film 33 used as etching masks, the Al nitride alloy film 321 and the AlNiNd film 311 are etched, for example with mixed acid of phosphoric acid, nitric acid, and acetic acid to pattern the low-reflection film 32 and the low-resistance conductive film 31, respectively.

In addition, in the case where the Al nitride alloy film 321 and the AlNiNd film 311 are etched at the same time, the degree of nitridation of the Al nitride alloy film 321 is to be set within the extent that the etching can be performed with the above-described mixed acid.

Figure 10:
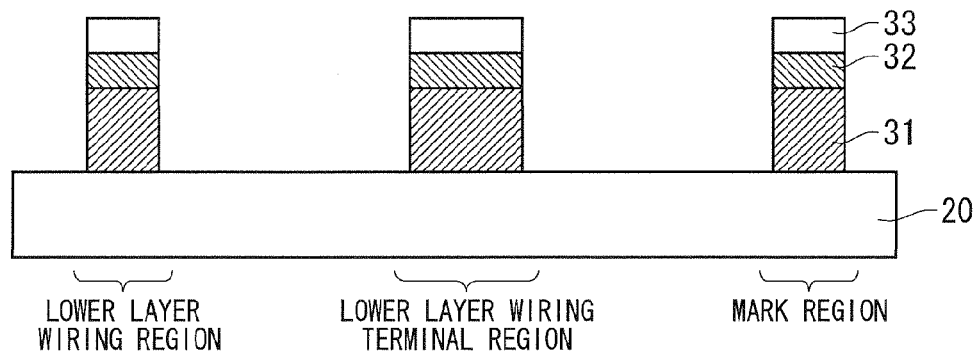

Then, as shown in FIG. 10, the resist mask RM1 is removed, for example with mixed solution of monoethanolamine and dimethylsulfoxide, and then the cap film 33 is removed, for example with oxalic acid solution, whereby the lower layer wiring 30, the lower layer wiring terminal 301, and a mark kind MK are formed as shown in FIG. 11.

Then, as shown in FIG. 12, the interlayer insulating film 21 is formed by forming a $SiO_2$ film having a thickness of about 600 nm so as to cover the lower layer wiring 30, the lower layer wiring terminal 301, and the mark kind MK by chemical vapor deposition (CVD).

Then, as shown in FIG. 13, an AlNiNd film 411 having a thickness of 400 nm is formed with AlNiNd target, on the interlayer insulating film 21, by sputtering. Then, in the same film forming apparatus, an Al nitride alloy film 421 having a high degree of nitridation and a thickness of 50 nm is formed with AlNiNd target, on the AlNiNd film 411 in an atmosphere containing $N_2$ gas, by sputtering. In addition, the degree of nitridation of the Al nitride alloy film 421 may be selected from the same condition as that of the Al nitride alloy film 321.

Then, an amorphous indium tin oxide (ITO) film 431 having a thickness of 30 nm to 50 nm is formed on the Al nitride alloy film 421 by sputtering. In addition, instead of sputtering, a method such as coating may be used.

Then, a resist material is applied to the ITO film 431, patterns of the upper layer wiring, and the upper layer wiring terminal are exposed and developed to pattern a resist mask (shown as a resist mask RM2 in FIG. 14) having the patterns of the upper layer wiring, and the upper layer wiring terminal.

Figure 14:
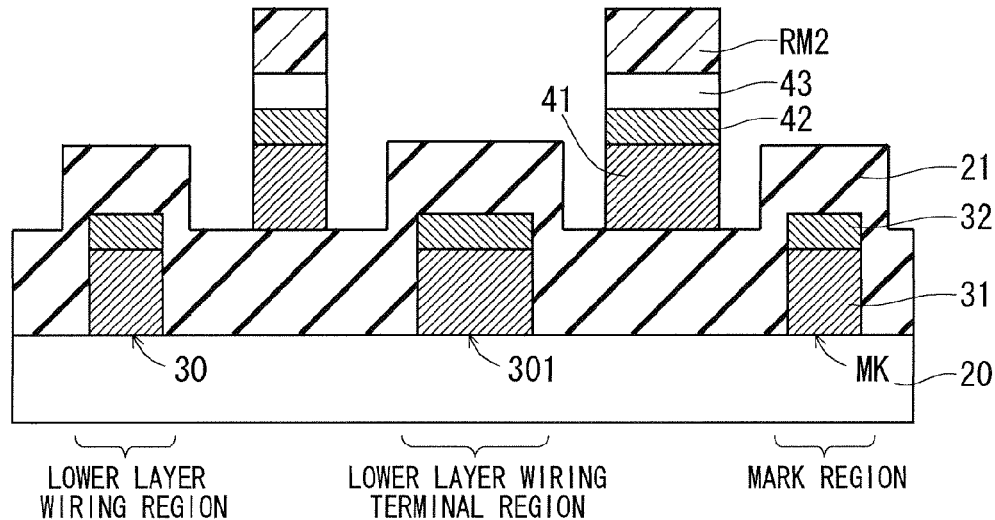

Then, as shown in FIG. 14, with the resist mask RM2 used as an etching mask, the ITO film 431 is etched, for example with oxalic acid solution to pattern the cap film 43 (functioning as an etching protective film). Then, with the resist mask RM2 and the cap film 43 used as etching masks, the Al nitride alloy film 421 and the AlNiNd film 411 are etched, for example with mixed acid of phosphoric acid, nitric acid, and acetic acid to pattern the low-reflection film 42 and the low-resistance conductive film 41, respectively.

In addition, in the case where the Al nitride alloy film 421 and the AlNiNd film 411 are etched at the same time, the degree of nitridation of the Al nitride alloy film 421 is to be set within the extent that the etching can be performed with the above-described mixed acid.

Figure 15:
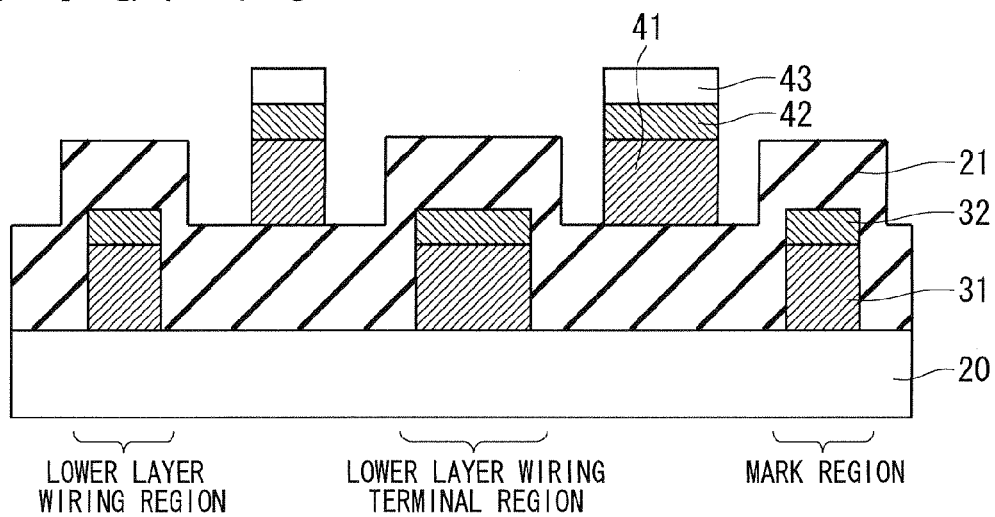
Figure 16:
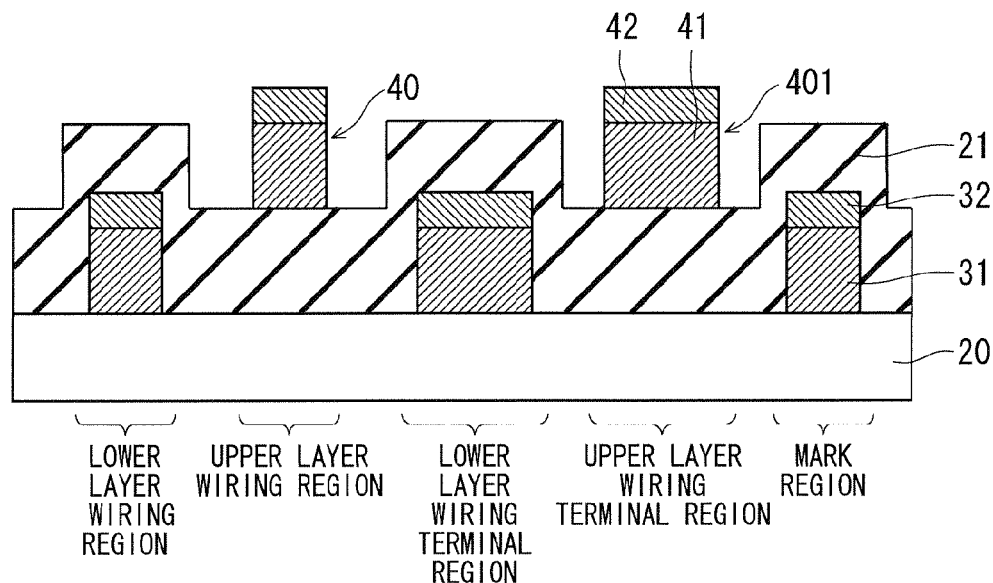

Then, as shown in FIG. 15, the resist mask RM2 is removed, for example with mixed solution of monoethanolamine and dimethylsulfoxide, and then the cap film 43 is removed, for example with oxalic acid solution, whereby the upper layer wiring 40, and the upper layer wiring terminal 401 are formed as shown in FIG. 16. In addition, in the following drawings, a region in which the upper layer wiring is formed is referred to as an upper layer wiring region, and a region in which the upper layer wiring terminal is formed is referred to as an upper layer wiring terminal region.

Figure 17:
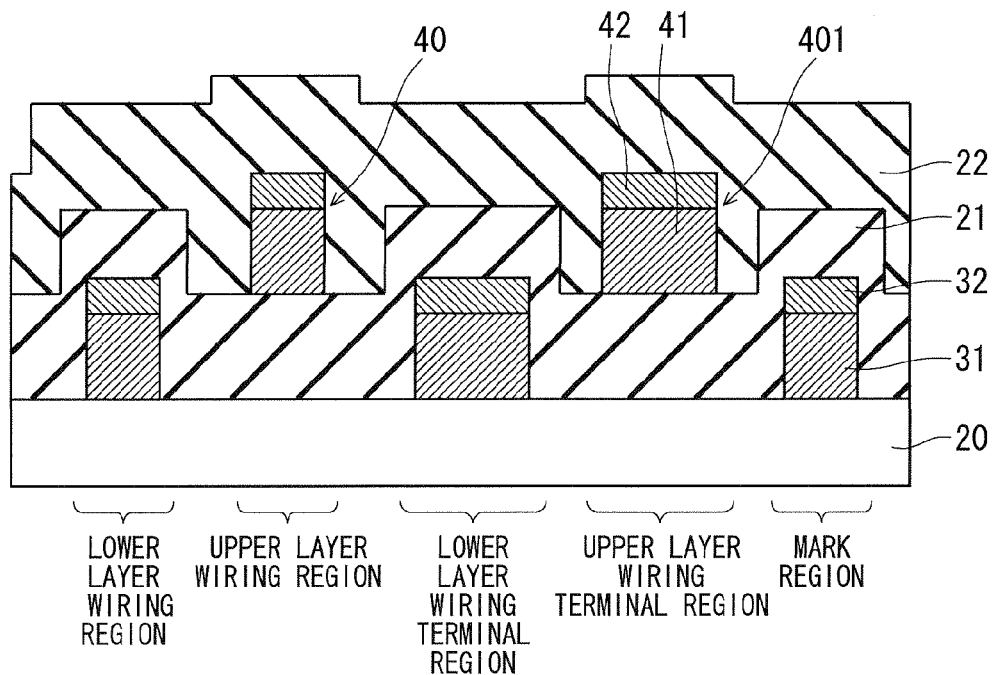

Then, as shown in FIG. 17, the protective film 22 is formed by forming a $SiO_2$ film having a thickness of about 300 nm so as to cover the upper layer wiring 40, and the upper layer wiring terminal 401 by CVD.

Then, a resist material is applied to the protective film 22, opening patterns of the lower layer wiring terminal 301, the upper layer wiring terminal 401, and the mark kind MK are exposed and developed to pattern a resist mask (shown as a resist mask RM3 in FIG. 18) having the opening patterns of the lower layer wiring terminal 301, the upper layer wiring terminal 401, and the mark kind MK. In addition, when the resist mask RM3 is formed, the photolithography process is performed by use of the alignment mark contained in the mark kind MK.

Figure 18:
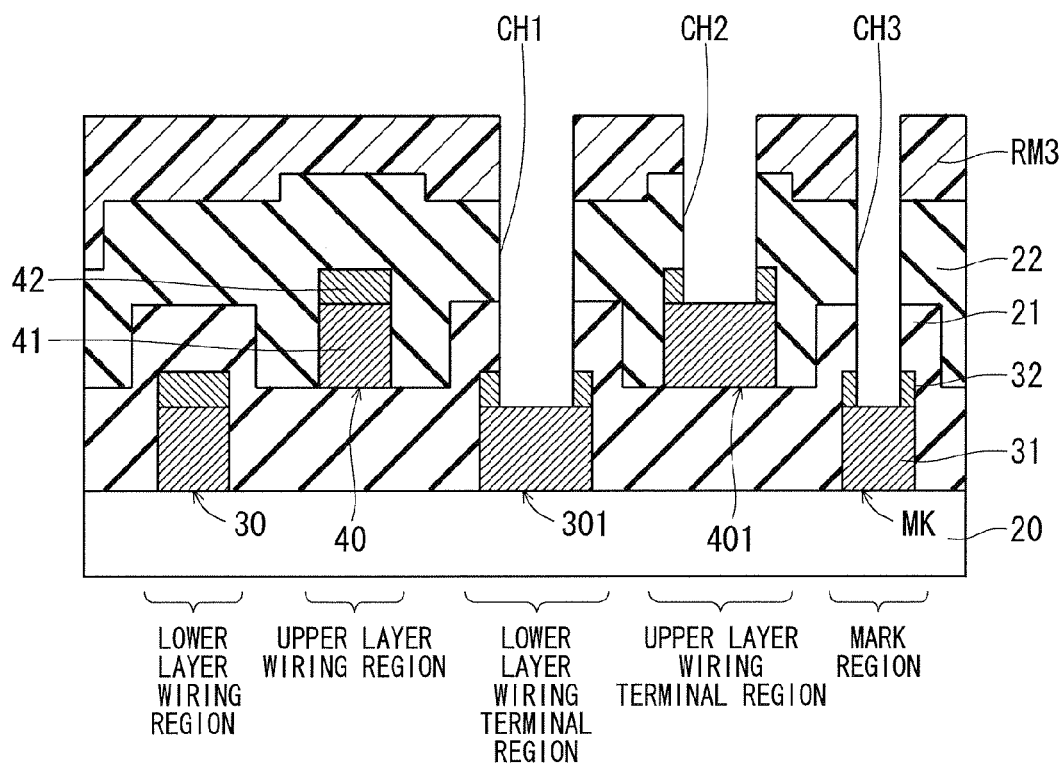

Then, with the resist mask RM3 used as an etching mask, as shown in FIG. 18, the protective film 22 and the interlayer insulating film 21 provided above the lower layer wiring terminal 301, and the mark kind MK are removed by dry etching to form the contact holes CH1 and CH3 which reach the low-reflection film 32, and the protective film 22 provided above the upper layer wiring terminal 401 is removed to form the contact hole CH2 which reaches the low-reflection film 42.

Then, the low-reflection film 32 exposed to the bottom part of each of the contact holes CH1 and CH3 is removed by dry etching, and the low-reflection film 42 exposed to the bottom part of the contact hole CH2 is removed, so that the low-resistance conductive film 31 is exposed to the bottom part of each of the contact holes CH1 and CH3, and the low-resistance conductive film 41 is exposed to the bottom part of the contact hole CH2. Thus, in the lower layer wiring terminal 301 and the mark kind MK, high contrast can be ensured due to the strong reflected light on the low-resistance conductive film 31 and the weak reflected light on the low-reflection film 32, and in the upper layer wiring terminal 401, high contrast can be ensured due to the strong reflected light on the low-resistance conductive film 41 and the weak reflected light on the low-reflection film 42.

Finally, the resist mask RM3 is removed, whereby the touch panel is completed. In addition, the FPC is connected to the lower layer wiring terminal 301 and the upper layer wiring terminal 401 through the contact holes CH1 and CH2, respectively, that is, the FPC is directly connected to the low-resistance conductive film 31 and the low-resistance conductive film 41 without passing through the low-reflection films 32 and 42, so that connection resistance can be reduced. Here, as another configuration, the low-reflection films 32 and 42 can be etched at the same time as the protective film 22 and the interlayer insulating film 21 are removed by dry etching. In this dry etching, a mixture gas of $CF_4$ and $O_2$ is used, for example.

According to the manufacturing method described above, the mark kind and the wiring terminal each having the high contrast can be formed without adding a new step.

In the above description, the cap film is formed of the amorphous ITO film, but the present invention is not limited to this, and the cap film may be composed of material which can be removed without damaging the low-reflection film and the low-resistance conductive film when the cap film is removed. For example, when the cap film is composed of amorphous indium zinc oxide (IZO), it can be removed with oxalic acid series solution, and when the cap film is composed of chrome (Cr), it can be removed with ceric ammonium nitrate series solution. In either case, the low-reflection film and the low-resistance conductive film are not damaged.

In addition, the description has been given of the case where the Al nitride alloy film is etched with mixed acid of phosphoric acid, nitric acid, and acetic acid, but it may be etched with alkali solution, or dry etching may be used. In a case where the Al nitride alloy film is etched with solution with which the low-resistance conductive film cannot be etched, the Al nitride alloy film can be formed to have the higher degree of nitridation as compared with the case where the above mixed acid is used, so that the reflectivity can be further lowered.

In addition, the description has been given of the case where the low-reflection film and the low-resistance conductive film are patterned with the resist mask, but in a case where the cap film is composed of material having high etching selectivity with respect to the low-reflection film and the low-resistance conductive film, the resist mask may be removed after the cap film has been patterned, and the low-reflection film and the low-resistance conductive film may be patterned with the patterned cap film used as the etching mask.

Furthermore, in a case where the cap film is composed of material having high etching selectivity only with respect to the low-resistance conductive film, the resist mask may be removed after the low-reflection film has been patterned, and the low-resistance conductive film may be patterned with the patterned cap film used as the etching mask.

Still furthermore, the description has been given of the case where the Al nitride alloy is used as the low-reflection film, and the cap film is provided as the protective film when the resist is removed from the Al nitride alloy, but as another manufacturing method, another low-reflection material may be used and the cap film may not be used.

<First Variation>

According to the first preferred embodiment described above, the cap film is removed from the low-reflection film in the final stage, but as another configuration, when the cap film is formed of transparent material, the cap film may be left on the low-reflection film. Hereinafter, this configuration will be described with reference to FIG. 19 to FIG. 21.

Figure 19:
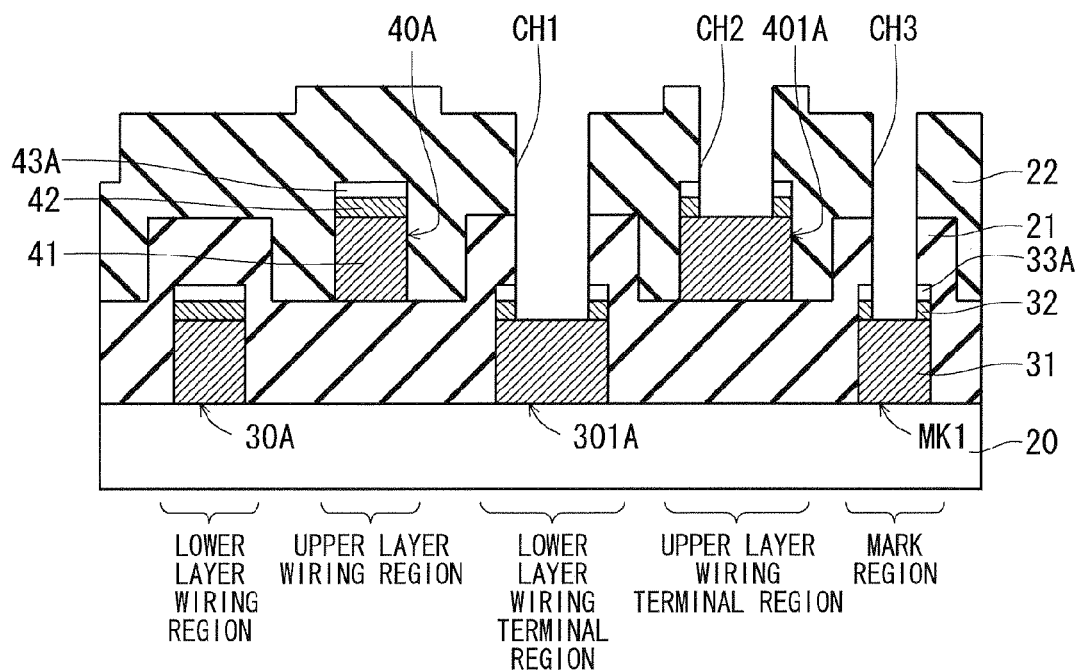
FIG. 19 is a cross-sectional view showing a configuration of a variation of the touch panel of the first preferred embodiment according to the present invention.

FIG. 19 is a view corresponding to a state in which the resist mask shown in FIG. 18 in the first preferred embodiment is removed, and a transparent cap film 33A (functioning as an etching protective film) is left on the low-reflection film 32, and a transparent cap film 43A (functioning as an etching protective film) is left on the low-reflection film 42. In addition, as for the same configuration as in FIG. 18, the same reference is affixed thereto and its description is omitted.

The transparent cap film 33A is composed of material having an refractive index higher than that of the interlayer insulating film 21 (or the protective film in the case of the upper wiring), such as about 1.7 to 2.4 and having a film thickness of 30 nm to 70 nm, so that a light path length can be set to 0.05 μm to 0.17 μm, and the reflectivity of the laminated wiring can be further reduced.

As shown in FIG. 19, the contact holes CH1 and CH3 are provided above the lower layer wiring terminal 301 and a mark kind MK1, respectively, and each of them penetrates the transparent cap film 33A and the low-reflection film 32 and reaches the low-resistance conductive film 31, and the contact hole CH2 is provided above the upper layer wiring terminal 401 and penetrates the transparent cap film 43A and the low-reflection film 42 and reaches the low-resistance conductive film 41. Each of the transparent cap films 33A and 43A is formed of amorphous indium zinc oxide (IZO) and has a thickness of about 50 nm.

A method for manufacturing this configuration will be described with reference to FIG. 20 and FIG. 21. In the step described with reference FIG. 8, instead of the ITO film 331 formed on the Al nitride alloy film 321, an IZO film is formed by sputtering. Then, a resist material is applied to the IZO film, a resist mask is patterned as described with reference to FIG. 8, and the IZO film is etched by wet etching with the resist mask used as an etching mask to pattern the transparent cap film 33A.

Then, the Al nitride alloy film 321 and the AlNiNd film 311 are etched with the resist mask and the transparent cap film 33A used as etching masks to pattern the low-reflection film 32 and the low-resistance conductive film 31, respectively, whereby a lower layer wiring 30A, a lower layer wiring terminal 301A, and the mark kind MK1 are provided.

The interlayer insulating film 21 is formed by forming a $SiO_2$ film so as to cover the lower layer wiring 30A, the lower layer wiring terminal 301A, and the mark kind MK1.

Then, in the step described with reference to FIG. 13, instead of the ITO film 431 formed on the Al nitride alloy film 421, an IZO film is formed by sputtering. Then, a resist material is applied to the IZO film, a resist mask is patterned as described with reference to FIG. 14, and the IZO film is etched by wet etching with the resist mask used as an etching mask to pattern the transparent cap film 43A.

Then, the Al nitride alloy film 421 and the AlNiNd film 411 are etched with the resist mask and the transparent cap film 43A used as etching masks to pattern the low-reflection film 42 and the low-resistance conductive film 41, respectively, whereby an upper layer wiring 40A, and an upper layer wiring terminal 401A are provided.

Then, as described with reference to FIG. 17, the protective film 22 is formed by forming a $SiO_2$ film having a thickness of about 300 nm so as to cover the upper layer wiring 40A and the upper layer wiring terminal 401A. Then, a resist material is applied to the protective film 22, and opening patterns of the lower layer wiring terminal 301A, the upper layer wiring terminal 401A, and the mark kind MK1 are exposed and developed to pattern a resist mask (shown as the resist mask RM3 in FIG. 20) having the opening part patterns of the lower layer wiring terminal 301A, the upper layer wiring terminal 401A, and the mark kind MK1. In addition, when the resist mask RM3 is formed, the photolithography process is performed by use of the alignment mark contained in the mark kind MK.

Figure 20:
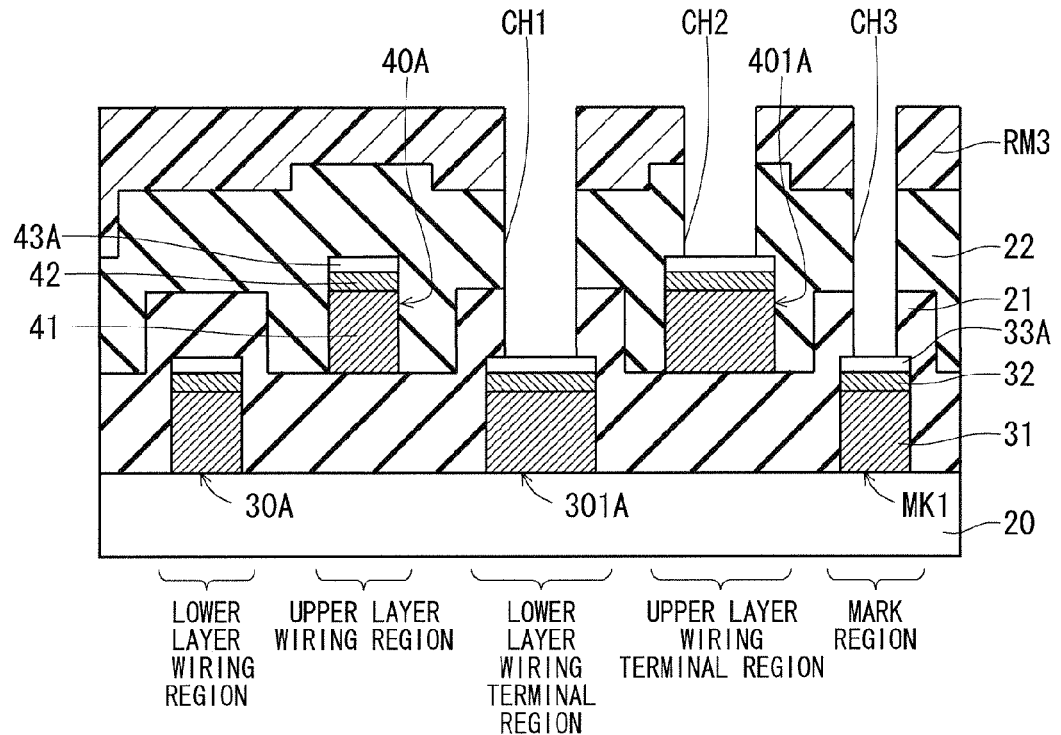
FIG. 20 and FIG. 21 are cross-sectional views for describing steps of manufacturing the variation of the touch panel of the first preferred embodiment according to the present invention.

Then, as shown in FIG. 20, with the resist mask RM3 used as an etching mask, the protective film 22 and the interlayer insulating film 21 provided above the lower layer wiring terminal 301A, and the mark kind MK1 are removed by dry etching to form the contact holes CH1 and CH3 which reach the transparent cap film 33A, and the protective film 22 provided above the upper layer wiring terminal 401A is removed to form the contact hole CH2 which reaches the transparent cap film 43A.

Figure 21:
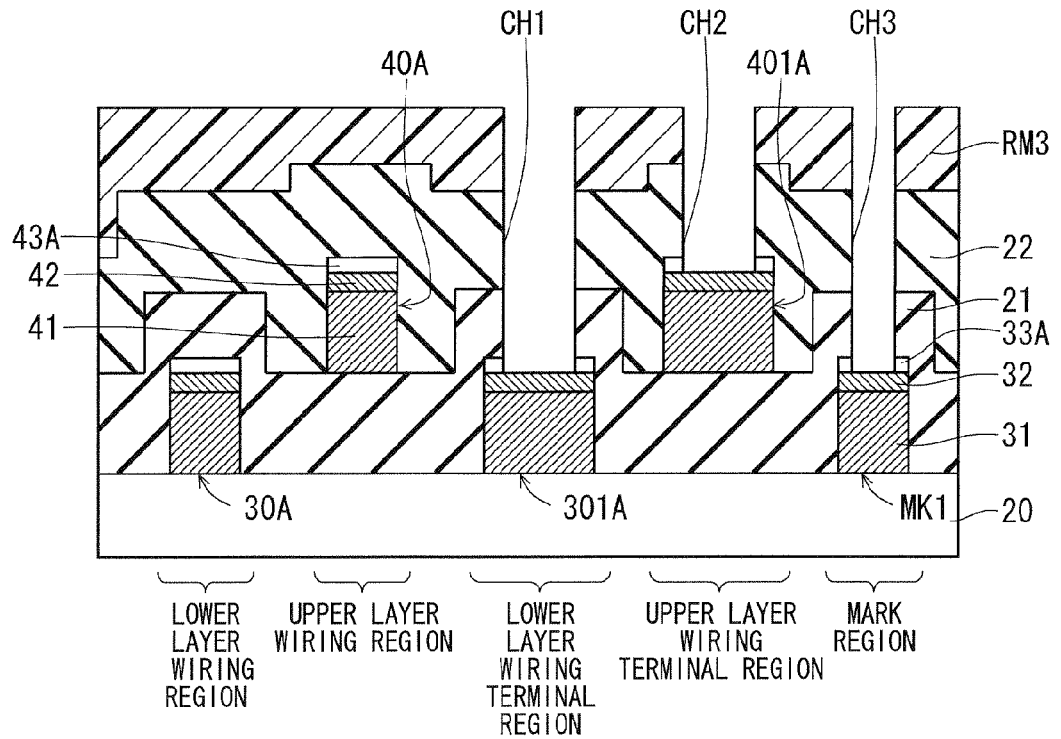

Then, for example with oxalic acid solution, the transparent cap film 33A exposed to the bottom part of each of the contact holes CH1 and CH3 is removed, and the transparent cap film 43A exposed to the bottom part of the contact hole CH2 is removed, whereby as shown in FIG. 21, the low-reflection film 32 is exposed to the bottom part of each of the contact holes CH1 and CH3, and the low-reflection film 42 is exposed to the bottom part of the contact hole CH2.

Then, the low-reflection film 32 exposed to the bottom part of each of the contact holes CH1 and CH3 is removed by dry etching, and the low-reflection film 42 exposed to the bottom part of the contact hole CH2 is removed, so that the low-resistance conductive film 31 is exposed to the bottom part of each of the contact holes CH1 and CH3, and the low-resistance conductive film 41 is exposed to the bottom part of the contact hole CH2.

Thus, in the lower layer wiring terminal 301 and the mark kind MK1, high contrast can be ensured due to the strong reflected light on the low-resistance conductive film 31 and the weak reflected light on the low-reflection film 32, and in the upper layer wiring terminal 401, high contrast can be ensured due to the strong reflected light on the low-resistance conductive film 41 and weak reflected light on the low-reflection film 42. In addition, the FPC is directly connected to the low-resistance conductive film 31 and the low-resistance conductive film 41 without passing through the low-reflection films 32 and 42, so that connection resistance can be reduced.

Since the transparent cap film is not removed, the transparent cap film need not regard etch selectivity with respect to the Al nitride alloy film and low-resistance conductive film, so that choices can be widened for a material of the transparent cap film and its process, and manufacturing costs can be reduced.

In addition, in the above description, the IZO film is used as the transparent cap films 33A and 43A, but an insulating film having a high refractive index such as a SiN film may be used, and in this case, the transparent cap films 33A and 43A can be etched at the same time as the dry etching of the protective film 22 and the interlayer insulating film 21, and the process can be performed in the same etching apparatus, so that the number of the manufacturing steps can be reduced.

<Second Variation>

As the configuration example in which the cap film is formed of the transparent material, and left on the low-reflection film, a configuration which will be described with reference to FIG. 22 and FIG. 24 below may be employed. In addition, as for the same configuration as in FIG. 19, the same reference is affixed thereto and its description is omitted.

Figure 22:
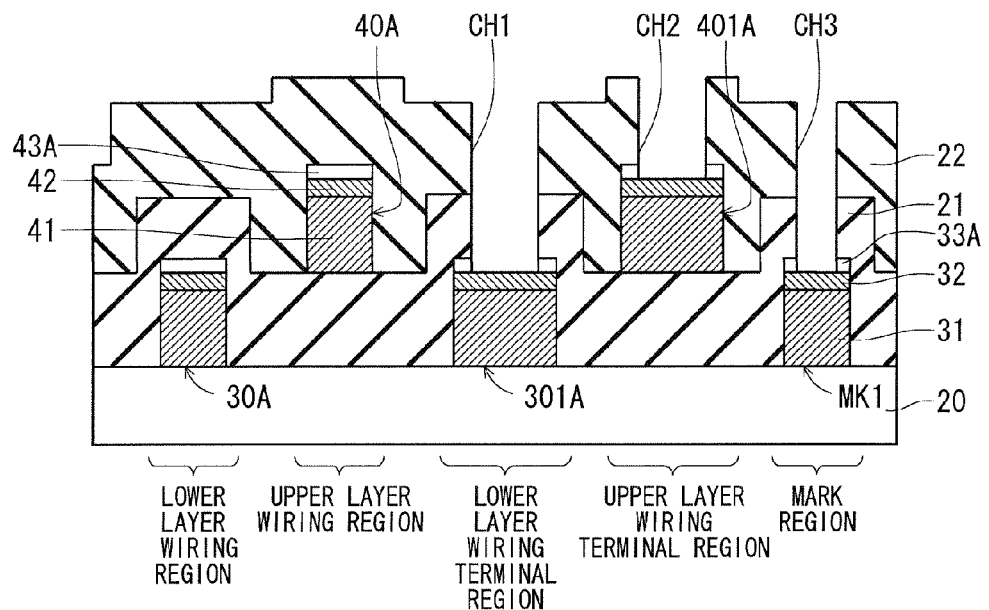
FIG. 22 is a cross-sectional view showing a configuration of a variation of the touch panel of the first preferred embodiment according to the present invention.

FIG. 22 shows a configuration in which each of the contact holes CH1 and CH3 penetrates the transparent cap film 33A and reaches the low-reflection film 32, and the contact hole CH2 penetrates the transparent cap film 43A and reaches the low-reflection film 42, but each of the contact holes CH1 and CH3 does not penetrate the low-reflection film 32, and the contact hole CH2 does not penetrate the low-reflection film 42.

In this configuration, in the lower layer wiring terminal 301A and the upper layer wiring terminal 401A, the low-resistance conductive films 31 and 41 are covered with the low-reflection films, respectively.

Figure 23:
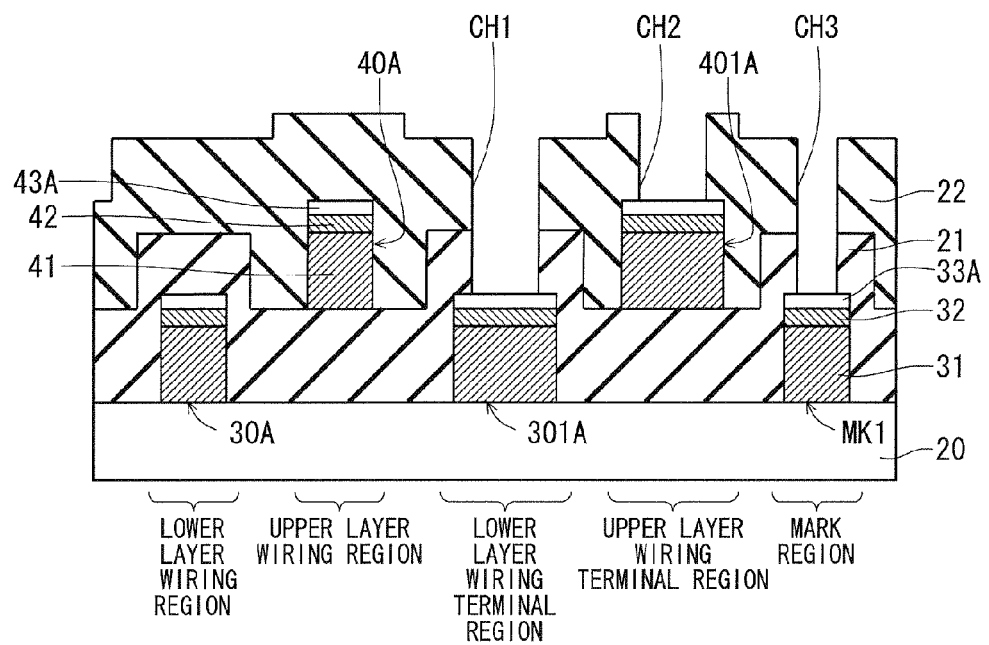
FIG. 23 is a cross-sectional view for describing a step of manufacturing the variation of the touch panel of the first preferred embodiment according to the present invention.

A method for manufacturing this configuration will be described with reference to FIG. 23. Through the step described with reference to FIG. 20, each of the contact holes CH1 and CH3 is formed so as to reach the transparent cap film 33A, and the contact hole CH2 is formed so as to reach the transparent cap film 43A, and then the resist mask RM3 is removed with resist removing solution. This state is shown in FIG. 23.

Then, for example with oxalic acid solution, the transparent cap film 33A exposed to the bottom part of each of the contact holes CH1 and CH3 is removed with the contact holes CH1 and CH3 used as masks, respectively, and the transparent cap film 43A exposed to the bottom part of the contact hole CH2 is removed with the contact hole CH2 used as a mask, whereby the configuration shown in FIG. 22 is provided.

Figure 24:
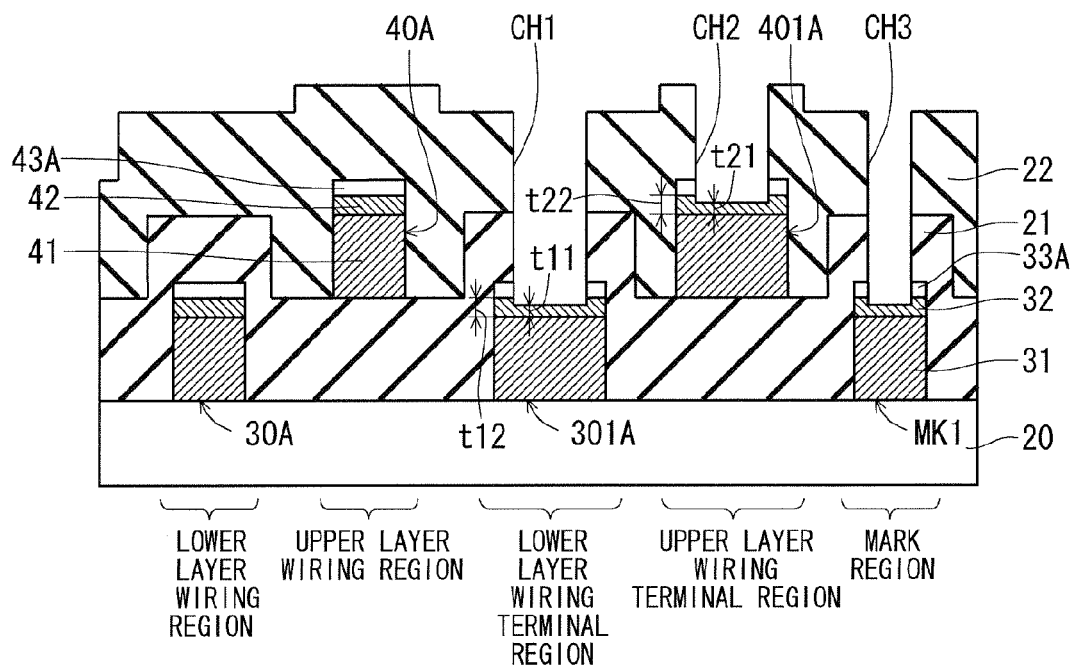
FIG. 24 is a cross-sectional view showing a configuration of a variation of the touch panel of the first preferred embodiment according to the present invention.

In addition, in FIG. 22, thicknesses of the low-reflection films 32 and 42 in the vicinity of the contact holes CH1 and CH3 in which the opening part is not provided are the same as those of the low-reflection films 32 and 42 in the opening part of the contact holes, respectively, but as shown in FIG. 24, the low-reflection films 32 and 42 may be removed from the bottom parts of the contact holes CH1, CH3, and CH2 to the extent that they are not completely removed.

In this configuration, a film thickness t11 of the low-reflection film 32 in the bottom part of each of the contact holes CH1 and CH3 is thinner than a film thickness t12 of the low-reflection film 32 in the lower layer wiring region in the vicinity of the contact holes CH1 and CH3 in which the opening part is not provided, and a film thickness t21 of the low-reflection film 42 in the bottom part of the contact hole CH2 is thinner than a film thickness t22 of the low-reflection film 42 in the upper layer wiring region in the vicinity of the contact hole CH2 in which the opening part is not provided.

According to a method for manufacturing this configuration, through the step described with reference to FIG. 21, after the low-reflection film 32 has been exposed to the bottom part of each of the contact holes CH1 and CH3, and the low-reflection film 42 is exposed to the bottom part of the contact hole CH2, the resist mask RM3 is removed with resist removing solution.

Here, when the low-reflection film is composed of material which is dissolved in an alkali solution, such as Al nitride alloy having a high degree of nitridation, a surface layer of the low-reflection film 32 exposed to the bottom part of each of the contact holes CH1 and CH3, and a surface layer of the low-reflection film 42 exposed to the bottom part of the contact hole CH2 can be removed with the resist removing solution when the resist mask RM3 is removed, and can be thinner than the low-reflection film provided on the wiring.

In addition, in a case where the film thickness of the low-reflection film is further thinned, or the low-reflection film is not dissolved in the alkali solution, dry etching may be used in such a manner that etching is stopped before the low-resistance conductive film is exposed.

As described above, when the terminal has the configuration in which each of the low-resistance conductive films 31 and 41 is covered with the low-reflection film, an effect is provided as will be described below.

That is, in a case where the low-resistance conductive films 31 and 41 are composed of intermetallic compound such as an Al alloy containing Ni or the like, or material having an eutectic structure, pitting is likely to be generated due to a local battery reaction when a terminal opening part is cleaned with water, but when the surface of the low-resistance conductive film is covered with the low-reflection film, the local battery reaction can be prevented, and a connection defect between the FPC and the wiring caused by the generation of the pitting can be prevented.

Furthermore, as compared with the laminated structure of the transparent cap film and the low-reflection film, the reflectivity can be increased in the mark kind having the contact hole CH3 in which the transparent cap film is removed from the bottom part, so that mark can be easily recognized in the post-step. In addition, a resistance value between the FPC and the low-resistance conductive film can be reduced by a contact resistance between the transparent cap film and the low-reflection film can be reduced.

<Second Preferred Embodiment>

Figure 25:
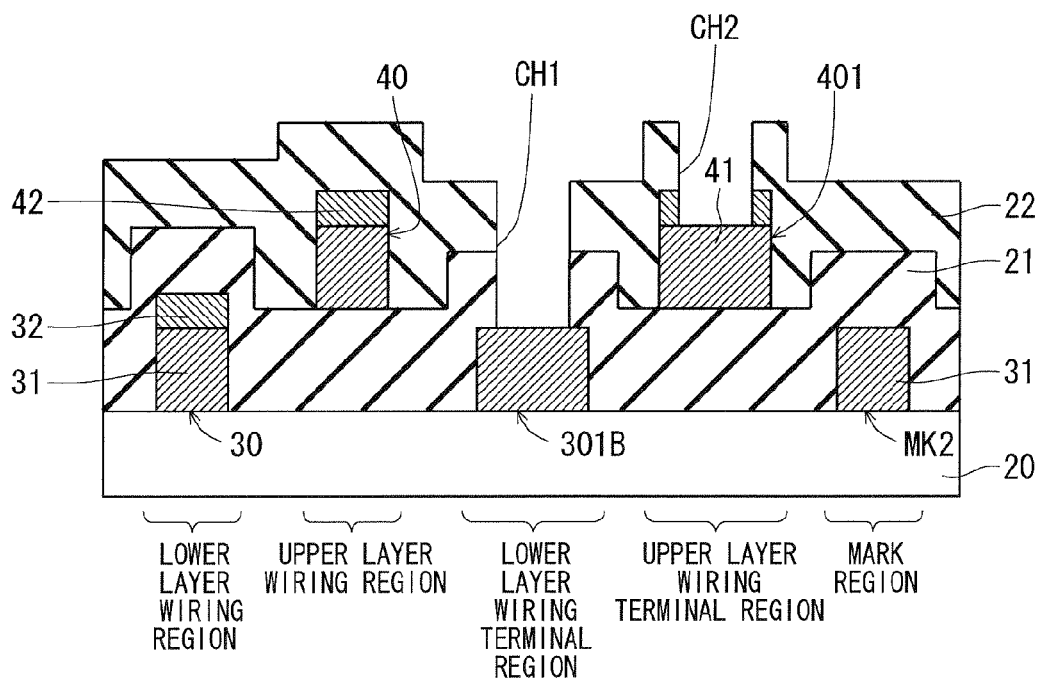
FIG. 25 is a cross-sectional view showing a configuration of a touch panel of a second preferred embodiment according to the present invention.

Next, a second preferred embodiment according to the present invention will be described with reference to FIG. 25 to FIG. 30. FIG. 25 is a view corresponding to a state in which the resist mask shown in FIG. 18 in the first the present invention is removed. In addition, as for the same configuration as in FIG. 18, the same reference is affixed thereto and its description is omitted.

As shown in FIG. 25, each of a lower layer wiring terminal 301B and a mark kind MK2 does not have the low-reflection film 32. The contact hole CH1 provided above the lower layer wiring terminal 301B penetrates the interlayer insulating film 21 and the protective film 22 and reaches the low-resistance conductive film 31, and the contact hole CH2 provided above the upper layer wiring terminal 401 penetrates the protective film 22 and reaches the low-resistance conductive film 41. In addition, the contact hole is not provided above the mark kind MK2. The contact hole may not be provided above the mark kind MK2 as long as the mark kind MK2 is formed of only the planar shape of the low-resistance conductive film 31 such as the alignment mark and does not need the identification mark such as the panel ID.

The low-resistance conductive film 31 is composed of Al series alloy serving as a low resistance material such as AlNiNd, and has a thickness of 300 nm, for example.

The low-reflection film 32 is formed of an aluminum (Al) nitride film having a high degree of nitridation in which a degree of nitridation is 30 at % to 50 at % (atomic %) as a composition ratio of nitrogen, and has a thickness of 50 nm, for example.

The interlayer insulating film 21 is composed of $SiO_2$, and has a thickness of 600 nm, for example.

The low-resistance conductive film 41 is composed of aluminum (Al) series alloy serving as a low resistance material such as AlNiNd, and has a thickness of 400 nm, for example.

The low-reflection film 42 is formed of an aluminum (Al) nitride film having a high degree of nitridation in which a degree of nitridation is 30 at % to 50 at % (atomic %) as a composition ratio of nitrogen, for example, and has a thickness of 50 nm, for example.

The protective film 22 is composed of $SiO_2$, for example, and has a thickness of 300 nm, for example.

Thus, the mark kind MK2 is formed of the low-resistance conductive film 31 and does not have the low-reflection film 32, so that when the alignment mark is formed of the highly reflective low-resistance conductive film 31, the contrast can be high, and the alignment mark can be stably recognized.

Meanwhile, the lower layer wiring 30 and the upper layer wiring 40 have the low-reflection film 32 and the low-reflection film 42, respectively, so that the reflection of the light inputted from the outside can be suppressed, and visibility of an image can be high.

In addition, the mark kind MK2 is covered with the interlayer insulating film 21 and the protective film 22, so that it is hardly damaged at the time of a repairing process in the post-step, and yield can be prevented from being reduced due to pattern disappearance.

Next, a method for manufacturing a display device of the second preferred embodiment of the present invention will be described with reference to FIG. 26 to FIG. 30.

Figure 26:
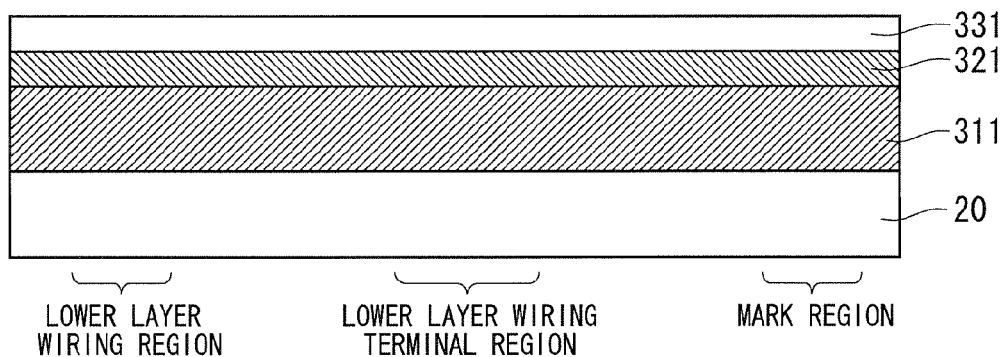
FIG. 26 to FIG. 30 are cross-sectional views for describing steps of manufacturing the touch panel of the second preferred embodiment according to the present invention.

First, in steps to attain a state shown in a cross-sectional view shown in FIG. 26, the AlNiNd film 311 having a thickness of 300 nm is formed with AlNiNd target, on the transparent substrate 20 composed of glass or PET, by sputtering. Then, in the same film forming apparatus, the Al nitride alloy film 321 having a high degree of nitridation and a thickness of 50 nm is formed with AlNiNd target, on the AlNiNd film 311 in an atmosphere containing $N_2$ gas, by sputtering.

Then, the amorphous indium tin oxide (ITO) film 331 having a thickness of 30 nm to 50 nm is formed on the Al nitride alloy film 321 by sputtering. In addition, instead of sputtering, a method such as coating may be used.

Then, as shown in FIG. 26, a resist material is applied to the ITO film 331, a thick resist mask RM11 is patterned in the lower layer wiring region, and a thin resist mask RM12 is patterned above each of the lower layer wiring terminal region and the mark region, by use of multistage exposure (half-tone exposure or gray-tone exposure).

Figure 27:
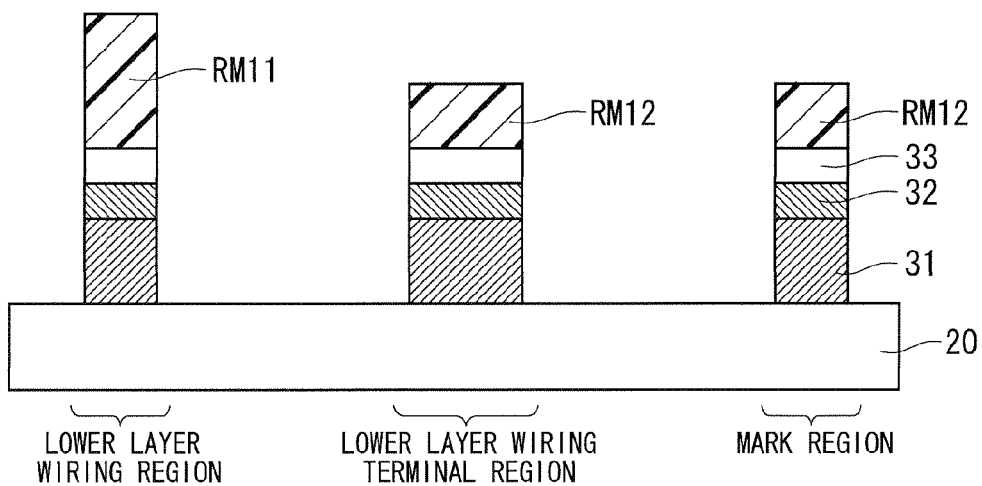

Then, with the resist masks RM11 and RM12 used as etching masks, the ITO film 331 is etched with oxalic acid solution to pattern the cap film 33. Then, with the resist masks RM11 and RM12, and the cap film 33 used as etching masks, the Al nitride alloy film 321 and the AlNiNd film 311 are etched, for example with mixed acid of phosphoric acid, nitric acid, and acetic acid to pattern the low-reflection film 32 and the low-resistance conductive film 31, respectively, so that a state shown in FIG. 27 is provided.

Figure 28:
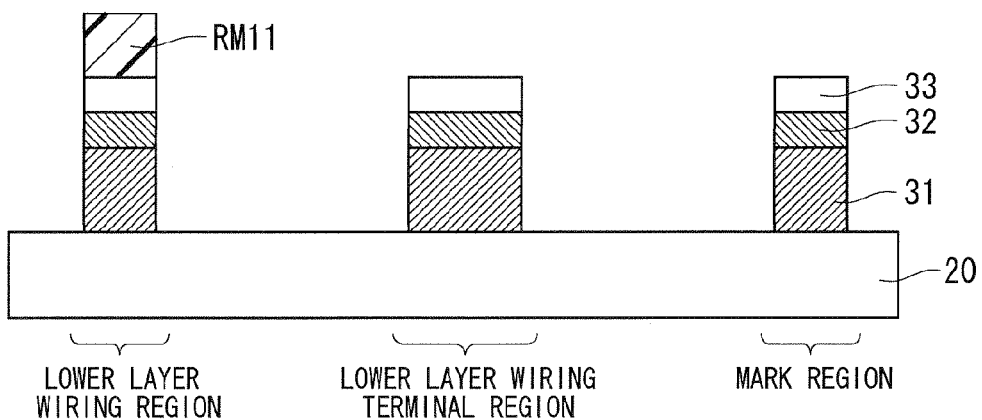

Then, as shown in FIG. 28, the thin resist mask RM12 is removed by ashing under the process condition that the thick resist mask RM11 is left as the pattern.

Figure 29:
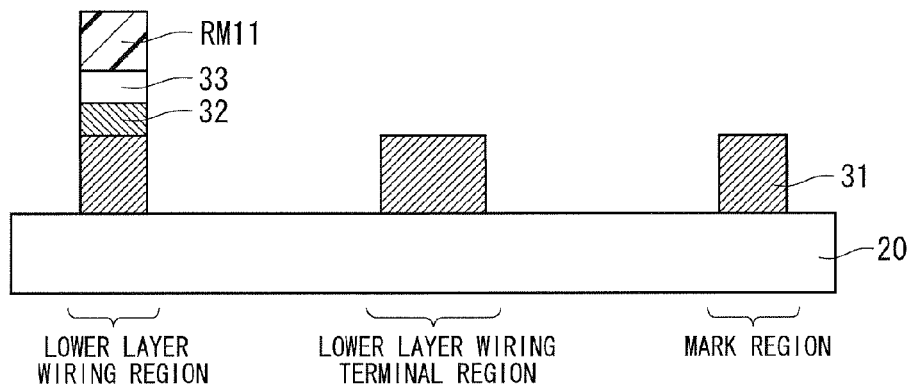

Then, as shown in FIG. 29, the cap film 33 which is not covered with the resist mask is removed with oxalic acid solution, and then the low-reflection film 32 which is not covered with the cap film 33 is etched away by dry etching.

Figure 30:
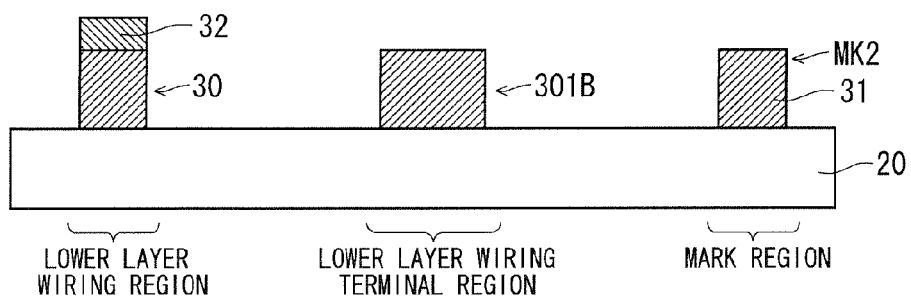

Then, the resist mask RM11 is removed, for example with mixed solution of monoethanolamine and dimethylsulfoxide, and then the cap film 33 is removed, for example with oxalic acid solution, whereby the lower layer wiring 30, the lower layer wiring terminal 301B, and the mark kind MK2 are formed as shown in FIG. 30.

Then, the interlayer insulating film 21 is formed by forming a $SiO_2$ film having a thickness of about 600 nm so as to cover the lower layer wiring 30, the lower layer wiring terminal 301B, and the mark kind MK2 by CVD, and then the upper layer wiring 40 and the upper layer wiring terminal 401 are formed on the interlayer insulating film 21, but since the manufacturing method is the same as that of the first preferred embodiment described with reference to FIG. 13 to FIG. 18 except that the contact hole is not provided above the mark kind MK2, its description is omitted.

When the manufacturing method described in the above is employed, the mark kind and the wiring terminal having the high reflectivity can be formed without adding a new step, so that the photolithography processes for the interlayer insulating film 21 and the protective film 22 can be stably performed, and a manufacturing line can be configured at low costs.

In addition, as for the lower layer wiring terminal 301B, it is only necessary to etch the protective film 22 and the interlayer insulating film 21 when the contact hole CH1 is formed, and it is not necessary to etch the low-reflection film 32 on the lower layer wiring terminal 301B, so that a dry etching time in an opening process of the terminal part can be shortened, and the number of manufacturing steps can be reduced.

<Variation>

Figure 31:
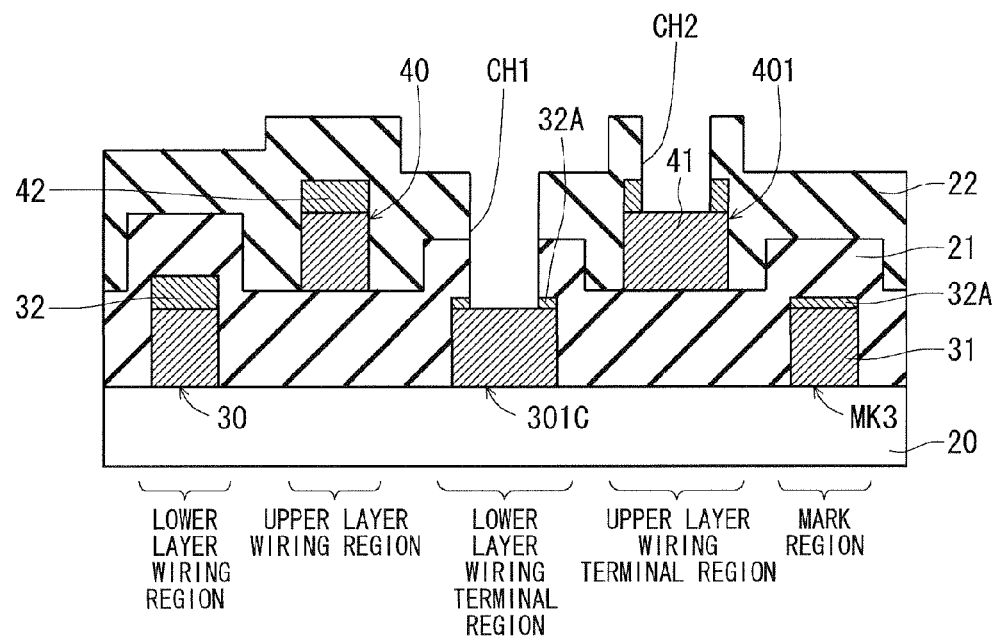
FIG. 31 is a cross-sectional view showing a configuration of a variation of the touch panel of the second preferred embodiment according to the present invention.

According to the second preferred embodiment described above, the low-reflection film 32 is completely removed in the lower layer wiring terminal 301B and the mark kind MK2, but as another configuration, as shown in FIG. 31, a thin low-reflection film 32A may be provided on the low-resistance conductive film 31 so that its reflectivity becomes closer to that of the low-resistance conductive film 31. In addition, the low-reflection film 32A is referred to as the antireflective film occasionally.

In this configuration, the mark kind and the wiring terminal having the high reflectivity can be formed without adding a new step, so that the photolithography processes for the interlayer insulating film 21 and the protective film 22 can be stably performed, and a manufacturing line can be configured at low costs.

Referring to FIG. 31, the thin low-reflection film 32A is provided on the low-resistance conductive film 31 in each of a lower layer wiring terminal 301C and a mark kind MK3, and the contact hole CH1 penetrates the low-reflection film 32A and reaches the low-resistance conductive film 31. In addition, as for the same configuration as in FIG. 25, the same reference is affixed thereto and its description is omitted.

Figure 32:
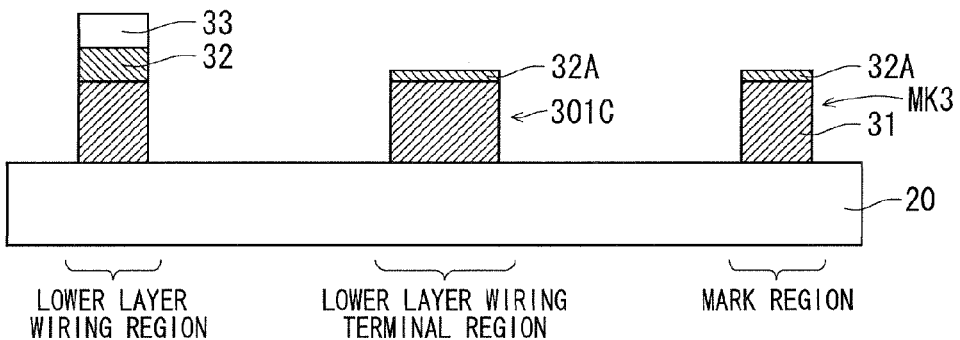
FIG. 32 and FIG. 33 are cross-sectional views for describing steps of manufacturing the variation of the touch panel of the second preferred embodiment according to the present invention.

A method for manufacturing this configuration will be described with reference to FIG. 32 and FIG. 33. After the thin resist mask RM12 has been removed by ashing as described with reference to FIG. 28, the cap film 33 not covered with the resist mask is removed, for example with oxalic acid solution, and then the resist mask RM11 is removed. At this time, when the resist mask RM11 is removed with alkali solution such as mixed solution of monoethanolamine and dimethylsulfoxide, the low-reflection film not covered with the cap film 33 is thinned, and it is left as the thin low-reflection film 32A on the low-resistance conductive film 31 as shown in FIG. 32.

Figure 33:
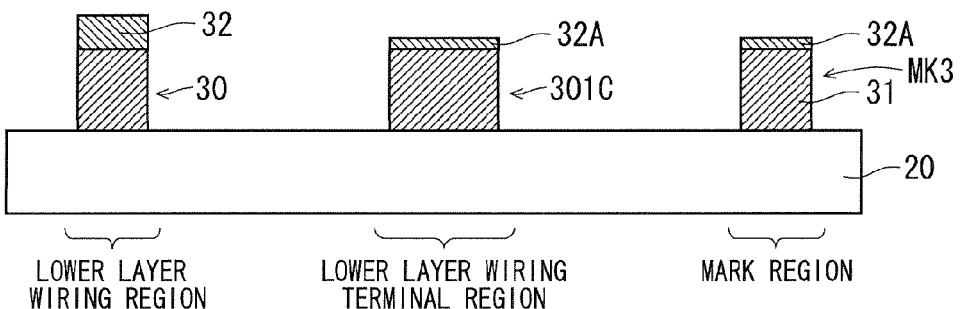

Then, the cap film 33 on the lower layer wiring 30 is removed, whereby the lower layer wiring 30 is formed of the laminated films of the low-reflection film 32 and the low-resistance conductive film 31 as shown in FIG. 33, and each of the lower layer wiring terminal 301C and the mark kind MK3 is formed of the laminated films of the low-reflection film 32A thinner than the low-reflection film 32, and the low-resistance conductive film 31. In addition, a thickness of the low-reflection film 32A is 30 nm or less, and preferably 20 nm or less.

In addition, in the above, the resist mask RM11 is removed with alkali solution, so that the thin low-reflection film 32A can be provided at the same time, but as another configuration, the resist mask RM11 may be removed by dry etching and the thin low-reflection film 32A may be provided at the same time as long as the low-resistance conductive film 31 is not influenced.

In addition, as for the dry etching performed to form the contact hole in the protective film 22 and the interlayer insulating film 21, in a case where an etching rate of the low-reflection film 32 is high, the thick resist mask RM11 is used instead of the resist mask RM12 used for forming the lower layer wiring terminal, so that the lower layer wiring terminal has the same laminated structure as the lower layer wiring, and after the contact hole CH1 has been formed, the peripheral portion of the lower layer wiring terminal serving as an outline thereof may be formed of the laminated films of the low-reflection film 32 and the low-resistance conductive film 31. That is, only the mark kind MK3 may have the configuration in which the thin low-reflection film 32A is provided on the low-resistance conductive film 31.

<Third Preferred Embodiment>

Figure 34:
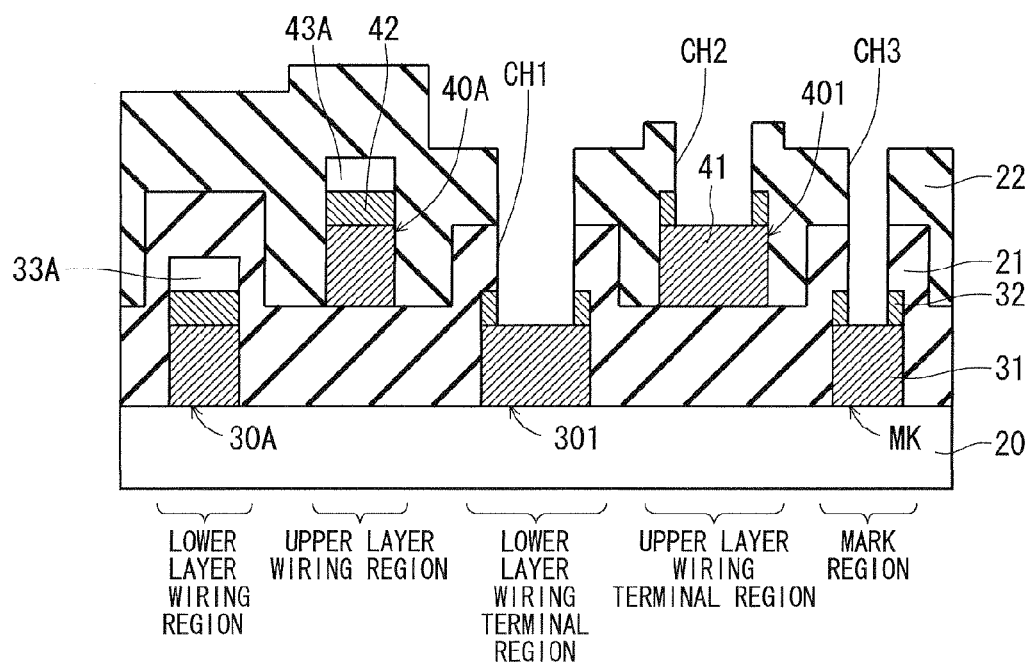
FIG. 34 is a cross-sectional view showing a configuration of a touch panel of a third preferred embodiment according to the present invention.

Next, a third preferred embodiment according to the present invention will be described with reference to FIG. 34 to FIG. 45. FIG. 34 is a view corresponding to a state in which the resist mask shown in FIG. 18 in the first preferred embodiment is removed, and in the lower layer wiring 30A, the transparent cap film 33A is arranged on the low-reflection film 32, and in the upper layer wiring 40A, the transparent cap film 43A is arranged on the low-reflection film 42. In addition, as for the same configuration as in FIG. 18, the same reference is affixed thereto and its description is omitted.

Each of the contact holes CH1 and CH3 provided above the lower layer wiring terminal 301 and the mark kind MK, respectively penetrates the low-reflection film 32 and reaches the low-resistance conductive film 31, and the contact hole CH2 provided above the upper layer wiring terminal 401 penetrates the low-reflection film 42 and reaches the low-resistance conductive film 41. For example, each of the transparent cap films 33A and 43A is formed of amorphous indium zinc oxide (IZO) to have a thickness of about 50 nm.

Thus, by exposing the low-resistance conductive film 31 to the bottom part of the contact hole CH3, high contrast can be provided due to the strong reflected light on the low-resistance conductive film 31, and the weak reflected light on the low-reflection film 32, so that recognition precision of the mark used in the post-step can be improved, and as a result, yield is prevented from being reduced due to a cutting defect of the mother substrate or a connection defect of the FPC. In addition, an error in recognition of the ID pattern by an apparatus for reading the ID pattern can be reduced, so that working efficiency can be enhanced and a manufacturing line can be stably implemented.

Next, a method for manufacturing a display device of the third preferred embodiment according to the present invention will be described with reference to FIG. 35 to FIG. 45.

Figure 35:
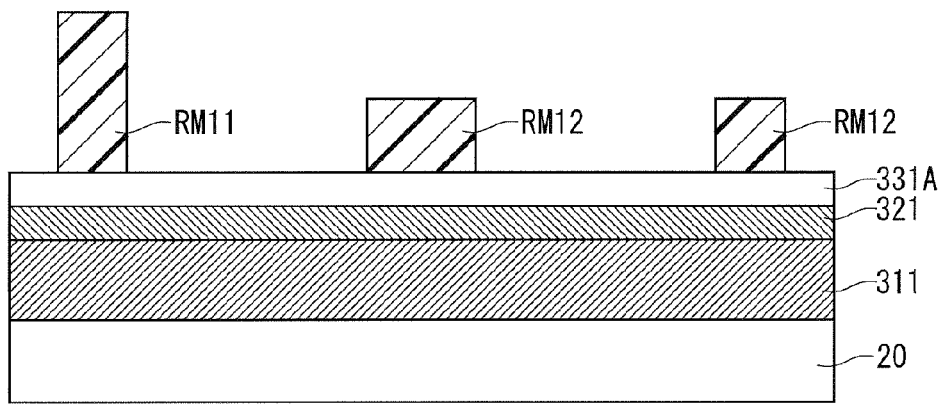
FIG. 35 to FIG. 45 are cross-sectional views for describing steps of manufacturing the touch panel of the third preferred embodiment according to the present invention.

First, in steps to obtain the cross-sectional view shown in FIG. 35, the AlNiNd film 311 having a thickness of 300 nm is formed with AlNiNd target, on the transparent substrate 20 composed of glass or PET, by sputtering. Then, in the same film forming apparatus, the Al nitride alloy film 321 having a high degree of nitridation and a thickness of 50 nm is formed with AlNiNd target, on the AlNiNd film 311 in an atmosphere containing $N_2$ gas, by sputtering. In addition, the degree of nitridation of the Al nitride alloy film 321 is the same as that of the first preferred embodiment.

In addition, an amorphous IZO film 331A having a thickness of 30 nm to 50 nm is formed on the Al nitride alloy film 321 by sputtering.

Then, after a resist material has been applied to the IZO film 331A, the thick resist mask RM11 is patterned above the lower layer wiring region, and the thin resist mask RM12 is patterned above each of the lower layer wiring terminal region and the mark region, by use of multistage exposure (half-tone exposure or gray-tone exposure), whereby the state shown in FIG. 35 is provided.

Figure 36:
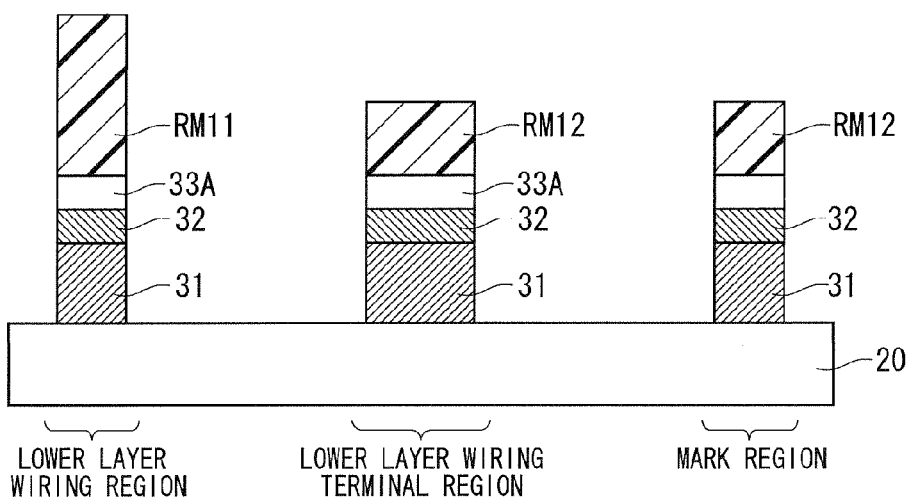

Then, as shown in FIG. 36, with the resist masks RM11 and RM12 used as etching masks, the IZO film 331A is etched with oxalic acid solution to pattern the transparent cap film 33A. Then, with the resist masks RM11 and RM12, and the transparent cap film 33A used as etching masks, the Al nitride alloy film 321 and the AlNiNd film 311 are etched, for example with mixed acid of phosphoric acid, nitric acid, and acetic acid to pattern the low-reflection film 32 and the low-resistance conductive film 31, respectively.

Figure 37:
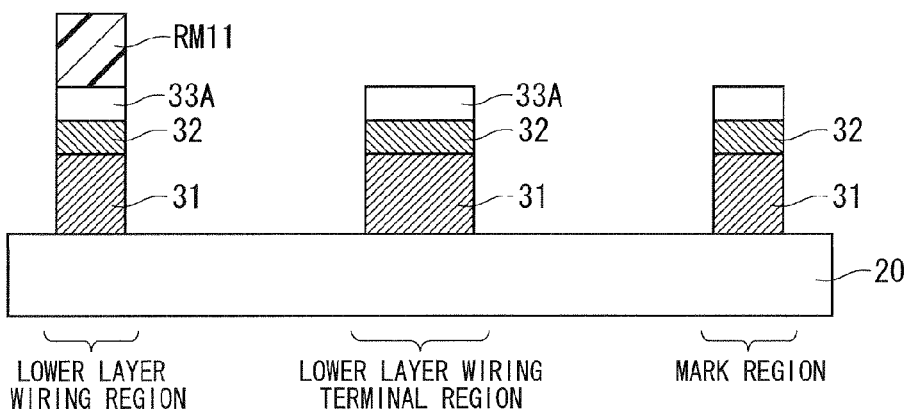

Then, as shown in FIG. 37, the thin resist mask RM12 is removed by ashing under the process condition that the thick resist mask RM11 is left as the pattern.

Figure 38:
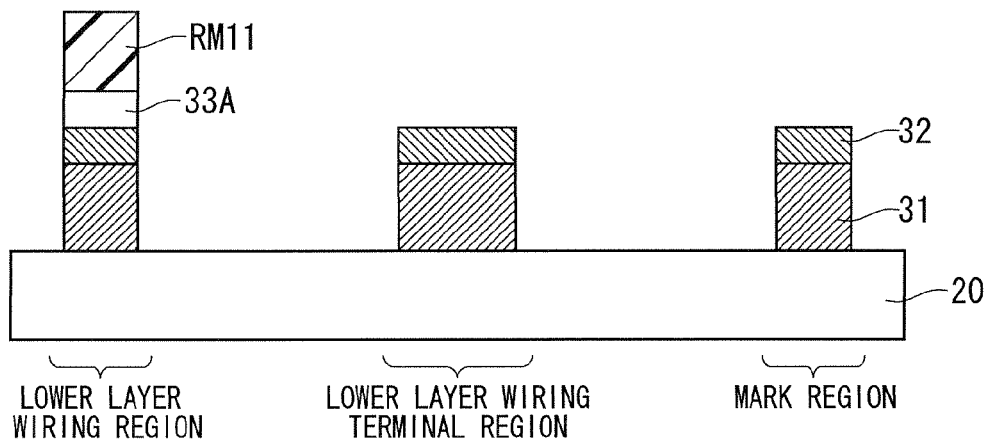

Then, as shown in FIG. 38, the transparent cap film 33A not covered with the resist mask is removed, for example with oxalic acid solution.

Figure 39:
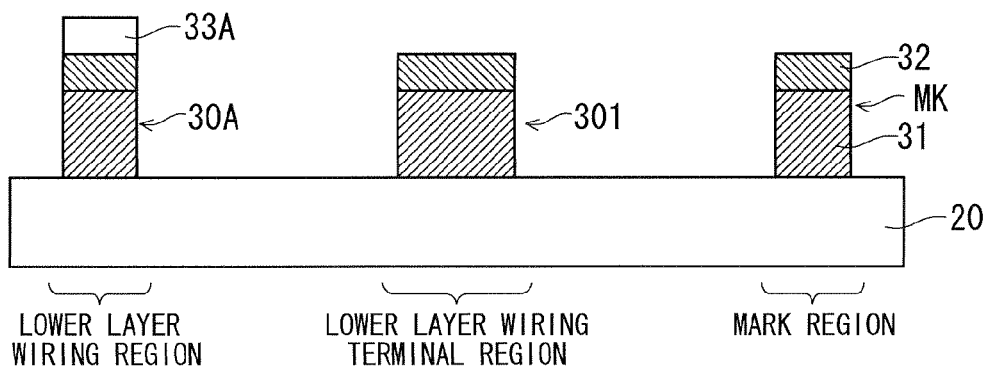

Then, as shown in FIG. 39, the resist mask RM11 is removed, for example with mixed solution of monoethanolamine and dimethylsulfoxide.

Figure 40:
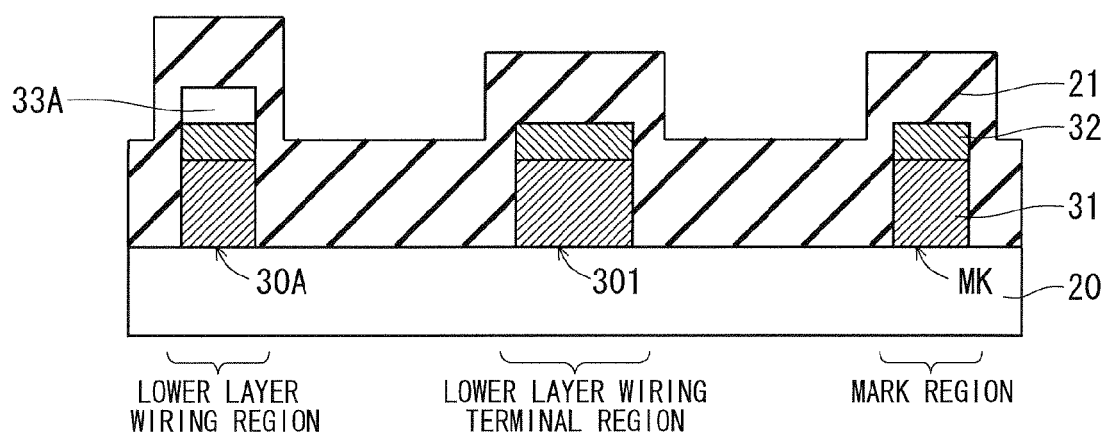

Then, as shown in FIG. 40, the interlayer insulating film 21 is formed by forming a $SiO_2$ film having a thickness of about 600 nm so as to cover the lower layer wiring 30A, the lower layer wiring terminal 301, and the mark kind MK by CVD, for example.

Then, an AlNiNd film having a thickness of 400 nm is formed with AlNiNd target, on the interlayer insulating film 21, by sputtering. Then, in the same film forming apparatus, an Al nitride alloy film having a high degree of nitridation and a thickness of 50 nm is formed with AlNiNd target, on the AlNiNd film in an atmosphere containing $N_2$ gas, by sputtering. In addition, the degree of nitridation of the Al nitride alloy film is the same as that of the first preferred embodiment.

In addition, an amorphous IZO film having a thickness of 30 nm to 50 nm is formed on the Al nitride alloy film by sputtering.

Then, after a resist material has been applied to the IZO film, a thick resist mask (shown as a resist mask RM21 in FIG. 41) is patterned above the upper layer wiring region, and a thin resist mask (shown as a resist mask RM22 in FIG. 41) is patterned above each of the upper layer wiring terminal region and the mark region, by use of multistage exposure (half-tone exposure or gray-tone exposure).

Figure 41:
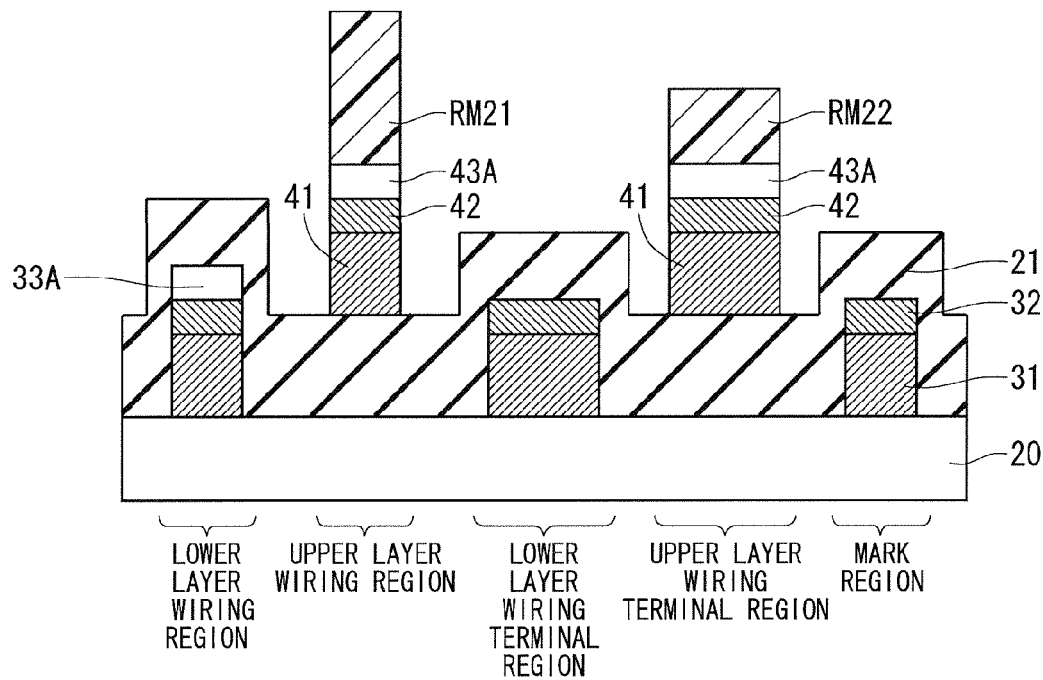

Then, as shown in FIG. 41, with the resist masks RM21 and RM22 used as etching masks, the IZO film is etched, for example with oxalic acid solution to pattern the transparent cap film 43A. Then, with the resist masks RM21 and RM22, and the transparent cap film 43A used as etching masks, the Al nitride alloy film and the AlNiNd film are etched, for example with mixed acid of phosphoric acid, nitric acid, and acetic acid to pattern the low-reflection film 42 and the low-resistance conductive film 41, respectively.

Figure 42:
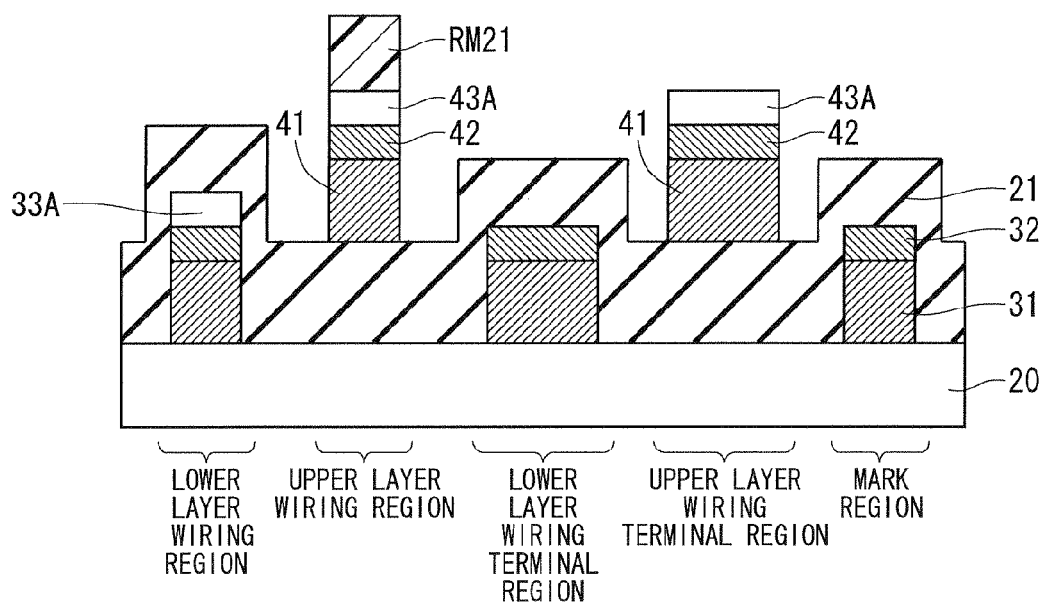

Then, as shown in FIG. 42, the thin resist mask RM22 is removed by ashing under the process condition that the thick resist mask RM21 is left as the pattern.

Figure 43:
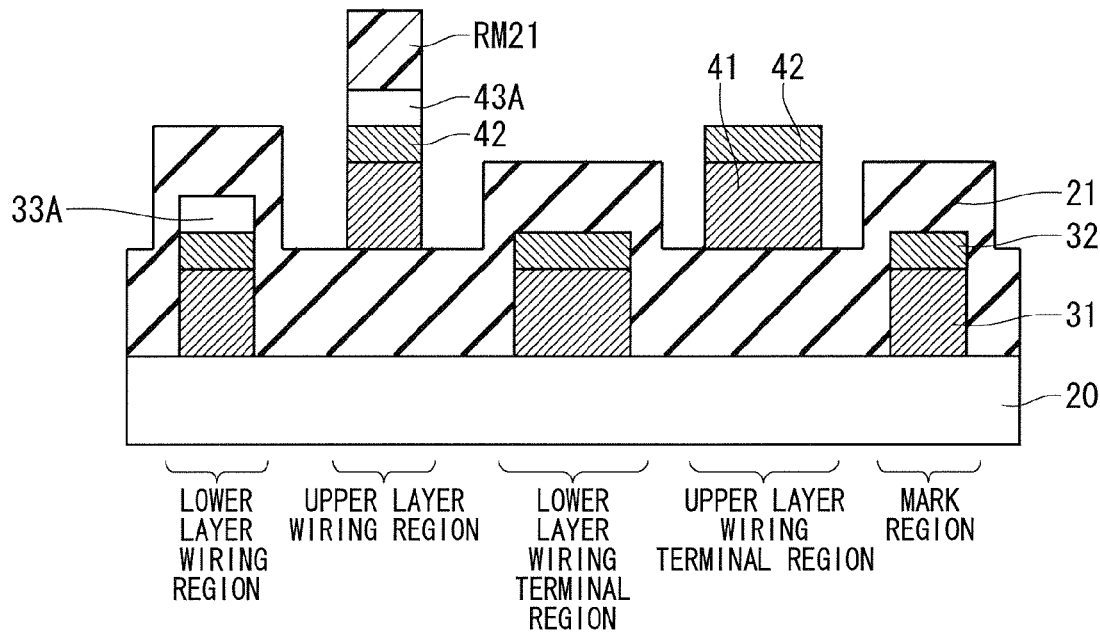

Then, as shown in FIG. 43, the transparent cap film 43A not covered with the resist mask is removed, for example with oxalic acid solution.

Figure 44:
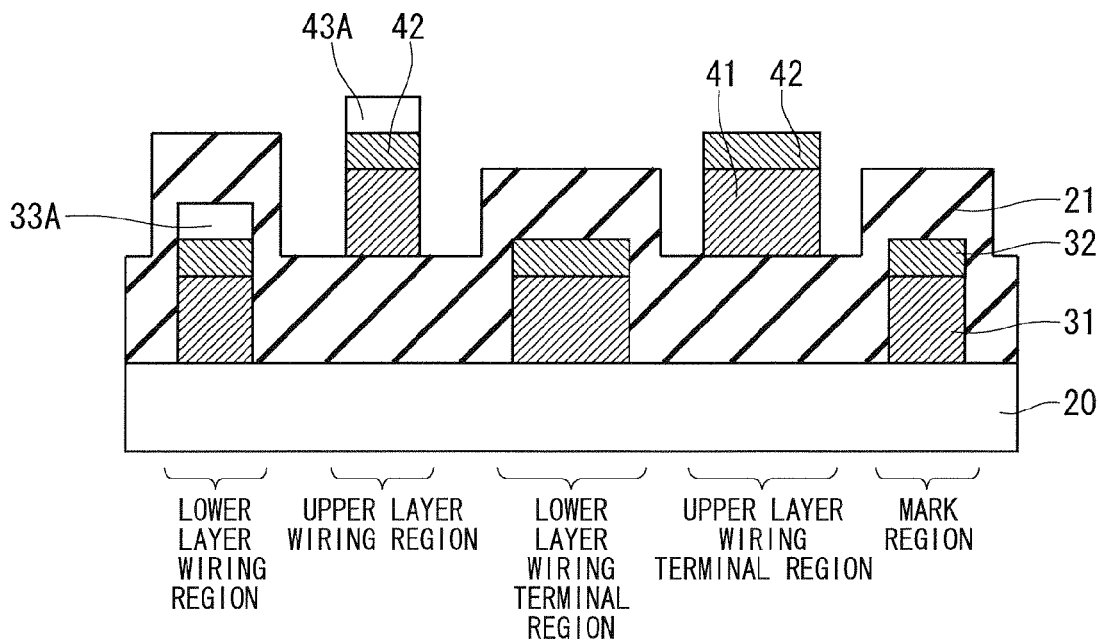

Then, as shown in FIG. 44, the resist mask RM21 is removed, for example with mixed solution of monoethanolamine and dimethylsulfoxide.

Figure 45:
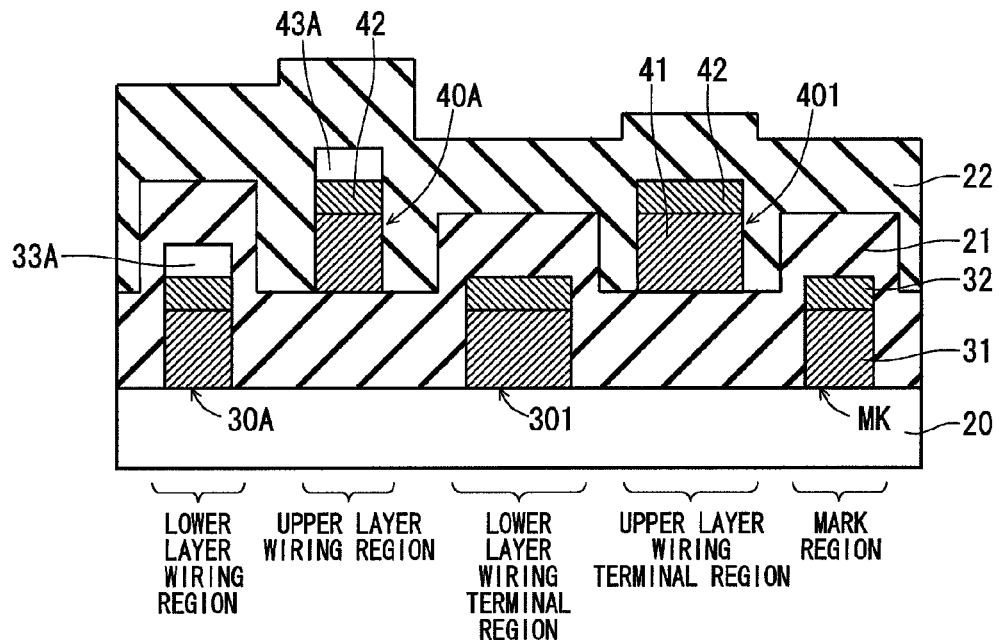

Then, as shown in FIG. 45, the protective film 22 is formed by forming a $SiO_2$ film having a thickness of about 300 nm so as to cover the upper layer wiring 40A and the upper layer wiring terminal 401 by CVD, for example.

Then, after a resist material has been applied to the protective film 22, the opening patterns of the lower layer wiring terminal 301, the upper layer wiring terminal 401, and the mark kind MK are exposed and developed to pattern a resist mask having the opening patterns of the lower layer wiring terminal 301, the upper layer wiring terminal 401, and the mark kind MK. Then, with the resist mask used as an etching mask, the protective film 22, the interlayer insulating film 21, and the low-reflection film 32 provided above the lower layer wiring terminal 301 and the mark kind MK are removed by dry etching to form the contact holes CH1 and CH3 each reaching the low-resistance conductive film 31, and the protective film 22 and the low-reflection film 42 provided above the upper layer wiring terminal 401 is removed to form the contact hole CH2 reaching the low-resistance conductive film 41, whereby the configuration shown in FIG. 34 is provided.

As described above, the transparent cap film 33A is arranged on the low-reflection film 32 in the lower layer wiring 30A, and the transparent cap film 43A is arranged on the low-reflection film 42 in the upper layer wiring 40A. Thus, since the transparent cap film is not removed, the transparent cap film need not regard the etch selectivity with respect to the Al nitride alloy film and low-resistance conductive film, so that choices can be widened for a material of the transparent cap film and its process, and manufacturing costs can be reduced.

<First Variation>

Figure 46:
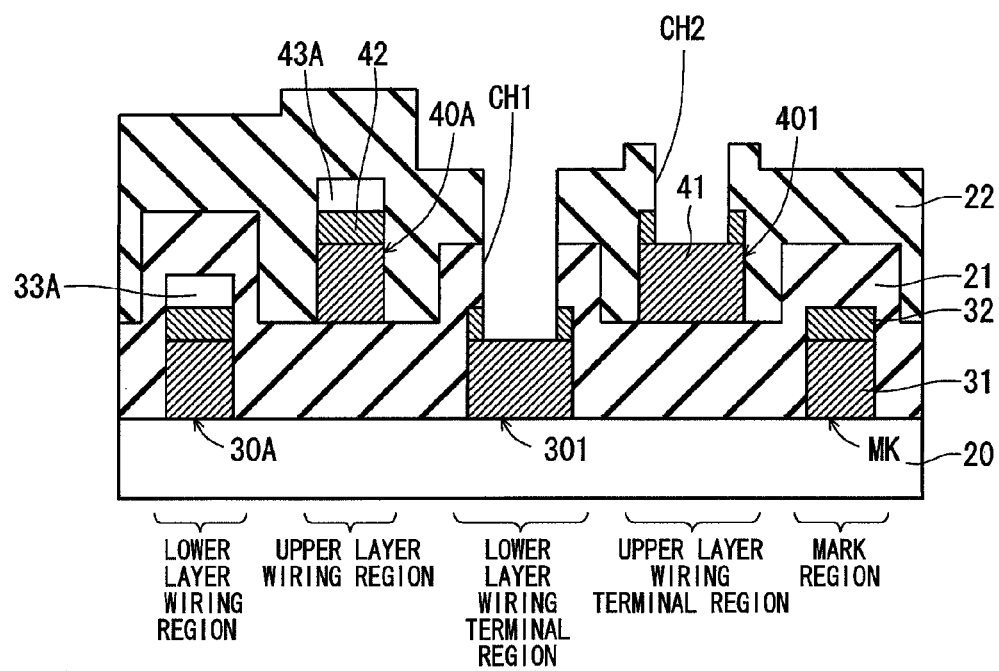
FIG. 46 to FIG. 48 are cross-sectional views for describing configurations of variations of the touch panel of the third preferred embodiment according to the present invention.

According to the third preferred embodiment described above, the contact hole CH3 is provided above the mark kind MK, but as another configuration, as shown in FIG. 46, the contact hole may not be provided above the mark kind MK. The contact hole may not be provided above the mark kind MK as long as the mark kind MK is formed of only the planar shape of the low-resistance conductive film 31 such as the alignment mark and does not need the identification mark such as the panel ID.

Figure 47:
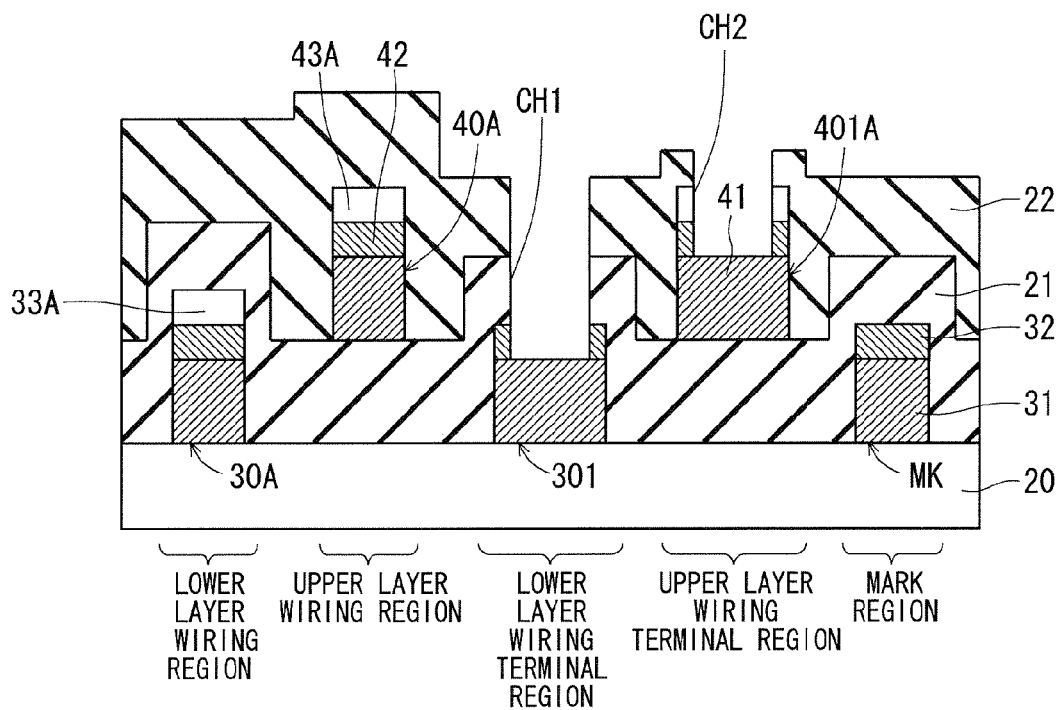

According to the third preferred embodiment described above, the transparent cap film is not provided above the low-reflection film 42 in the upper layer wiring terminal 401, but, as another configuration, as shown in FIG. 47, the transparent cap film 43A is provided on the low-reflection film 42 in the upper layer wiring terminal 401A, and the contact hole CH2 penetrates the transparent cap film 43A and the low-reflection film 42 and reaches the low-resistance conductive film 41.

In this case, the transparent cap film 43A may be composed of IZO similar to the transparent cap film 33A, but when it is composed of material which has a high refractive index and can be processed by dry etching such as SiN, the contact hole CH2 can be formed in the one etching step without needing the plurality of processes, so that manufacturing costs can be reduced.

In addition, when the transparent cap film 43A is formed also in the upper layer wiring terminal, it is not necessary to use the multistage exposure in forming the resist mask, so that process costs can be reduced.

Figure 48:
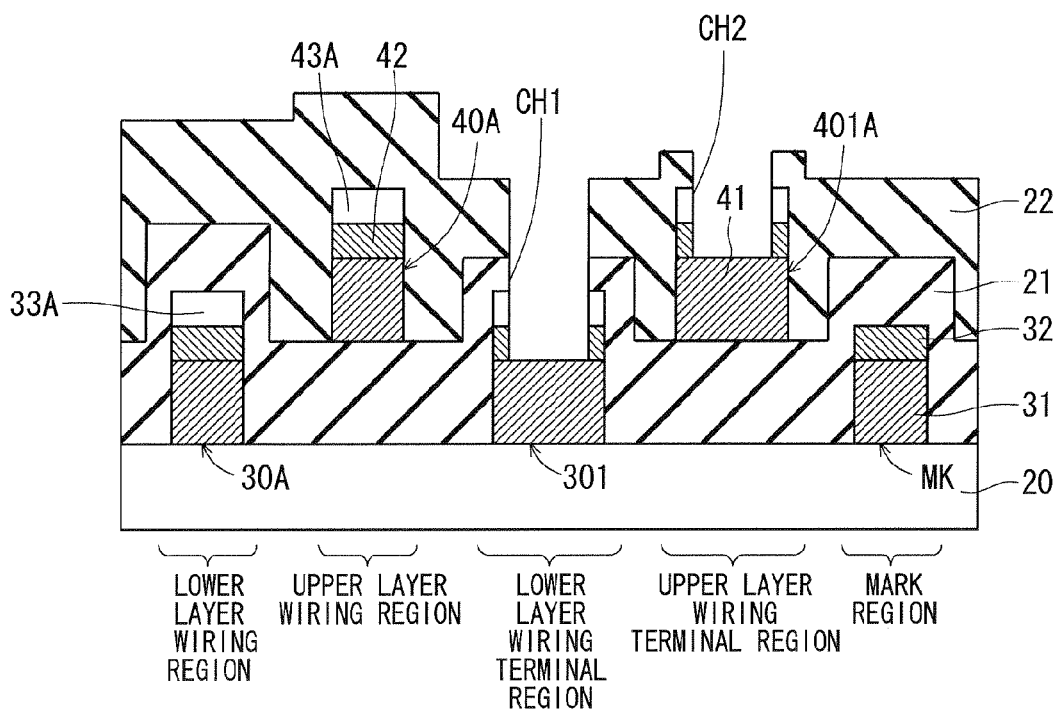

Furthermore, as another configuration, as shown in FIG. 48, the transparent cap film 33A is provided on the low-reflection film 32 in the lower layer wiring terminal 301A, and the contact hole CH1 penetrates the transparent cap film 33A and the low-reflection film 32 and reaches the low-resistance conductive film 31.

In this case also, choices can be widened for a material of the transparent cap film and its process, and manufacturing costs can be reduced.

<Second variation>

Figure 49:
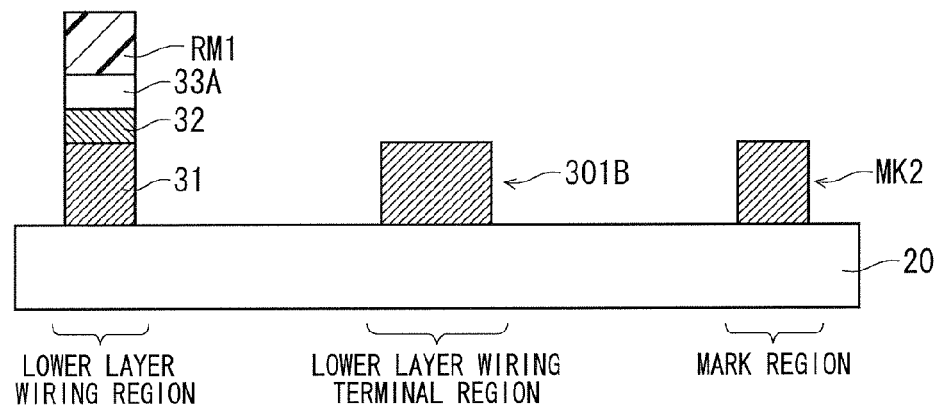
FIG. 49 is a cross-sectional view for describing a step of manufacturing the variation of the touch panel of the third preferred embodiment according to the present invention.
Figure 50:
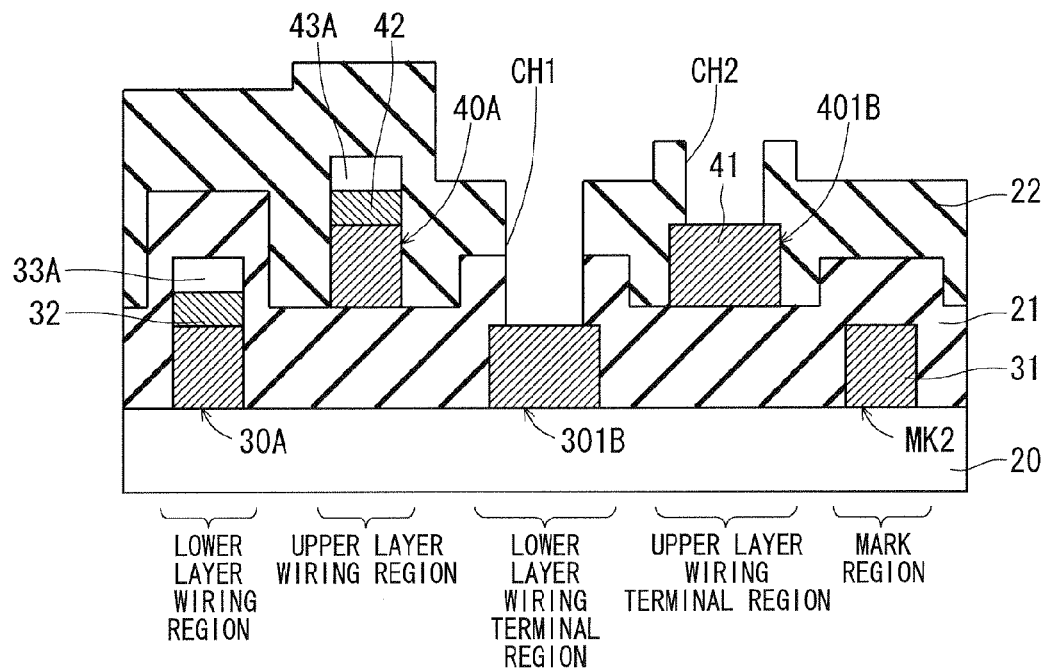
FIG. 50 and FIG. 51 are cross-sectional views for describing configurations of the variations of the touch panel of the third preferred embodiment according to the present invention.

According to the third preferred embodiment described above, as described with reference to FIG. 37, the thin resist mask RM12 is removed by ashing under the process condition that the thick resist mask RM11 is left as the pattern, and the transparent cap film 33A not covered with the resist mask RM11 is removed, but as another configuration, as shown in FIG. 49, the low-reflection film 32 not covered with the resist mask RM11 is also removed. FIG. 50 shows a configuration provided by this method.

FIG. 50 is a view corresponding to FIG. 46 in the third preferred embodiment, and each of the lower layer wiring terminal 301B and the mark kind MK2 does not have the low-reflection film 32. In addition, an upper layer wiring terminal 401B does not have the low-reflection film 42.

Thus, the reflectivity of the mark kind MK2 is increased, and recognition precision of the mark used in the post-step can be improved, and as a result, yield is prevented from being reduced due to a cutting defect of the mother substrate and a connection defect of the FPC. In addition, an error in recognition of the ID pattern by an apparatus for reading the ID pattern can be reduced, so that working efficiency can be enhanced and a manufacturing line can be stably implemented.

The contact hole CH1 provided above the lower layer wiring terminal 301B penetrates the interlayer insulating film 21 and the protective film 22 and reaches the low-resistance conductive film 31, and the contact hole CH2 provided above the upper layer wiring terminal 401B penetrates the protective film 22 and reaches the low-resistance conductive film 41. In addition, the contact hole is not provided above the mark kind MK2. In addition, as for the same configuration as in FIG. 46, the same reference is affixed thereto and its description is omitted.

Figure 51:
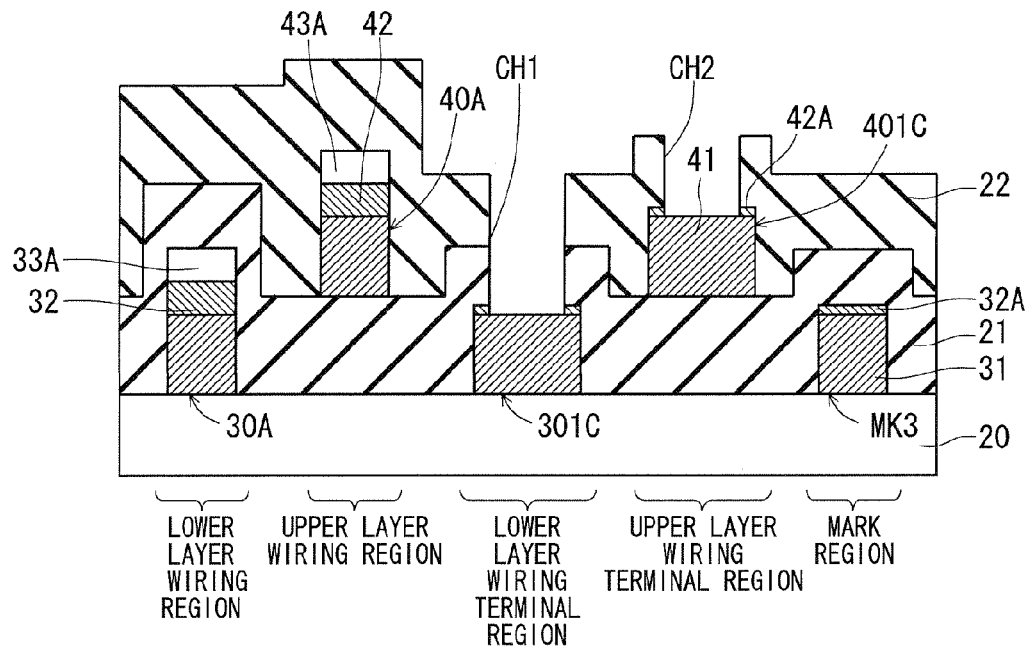

In addition, in FIG. 50, the low-reflection film 32 is completely removed in the lower layer wiring terminal 301B, the mark kind MK2, and the upper layer wiring terminal 401B, but as another configuration, as shown in FIG. 51, the thin low-reflection film 32A is provided on the low-resistance conductive film 31 in the mark kind MK3, and a thin low-reflection film 42A is provided on the low-resistance conductive film 41 in an upper layer wiring terminal 401C so that the reflectivity comes closer to that of the low-resistance conductive films 31 and 41.

Thus, the reflectivity of the mark kind MK3 is increased, and recognition precision of the mark used in the post-step can be improved, and as a result, yield is prevented from being reduced due to a cutting defect of the mother substrate or a connection defect of the FPC. In addition, an error in recognition of the ID pattern by an apparatus for reading the ID pattern can be reduced, so that working efficiency can be enhanced and a manufacturing line can be stably implemented.

In FIG. 51, the thin low-reflection film 32A is provided on the low-resistance conductive film 31 in each of the lower layer wiring terminal 301C and the mark kind MK3, and the contact hole CH1 penetrates the low-reflection film 32A and reaches the low-resistance conductive film 31. In addition, the contact hole CH2 penetrates the low-reflection film 42A and reaches the low-resistance conductive film 41. In addition, as for the same configuration as in FIG. 46, the same reference is affixed thereto and its description is omitted.

Figure 52:
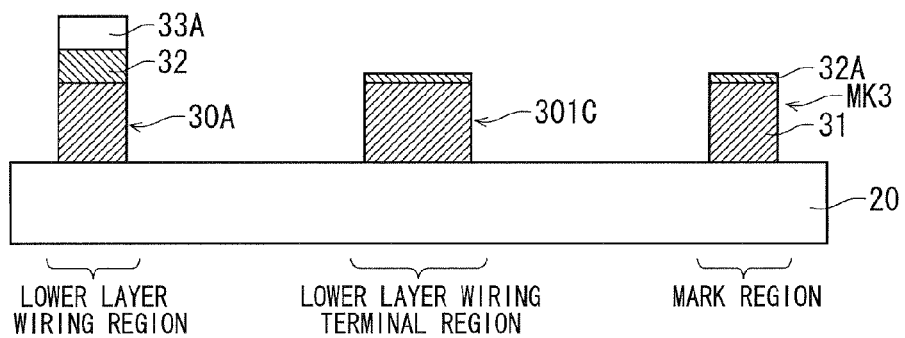
FIG. 52 is a cross-sectional view for describing a step of manufacturing the variation of the touch panel of the third preferred embodiment according to the present invention.

A method for manufacturing this configuration will be described with reference to FIG. 52. As described with reference to FIG. 37, the thin resist mask RM12 is removed by ashing under the process condition that the thick resist mask RM11 is left as the pattern, and the transparent cap film 33A not covered with the resist mask RM11 is removed. Then, the resist mask RM11 is removed with alkali solution such as mixed solution of monoethanolamine and dimethylsulfoxide, so that the low-reflection film not covered with the cap film 33 is thinned, and it is left on the low-resistance conductive film 31 as the thin low-reflection film 32A as shown in FIG. 52.

Thus, each of the lower layer wiring terminal 301C and the mark kind MK3 is formed of the laminated films of the low-reflection film 32A thinner than the low-reflection film 32 and the low-resistance conductive film 31. In addition, as for the upper layer wiring terminal 401C also, through the same steps, it is formed of the laminated films of the low-reflection film 42A thinner than the low-reflection film 42 and the low-resistance conductive film 41. In addition, the thicknesses of the low-reflection films 32A and 42A is 30 nm or less, and preferably 20 nm or less.

<Fourth Preferred Embodiment>

Figure 53:
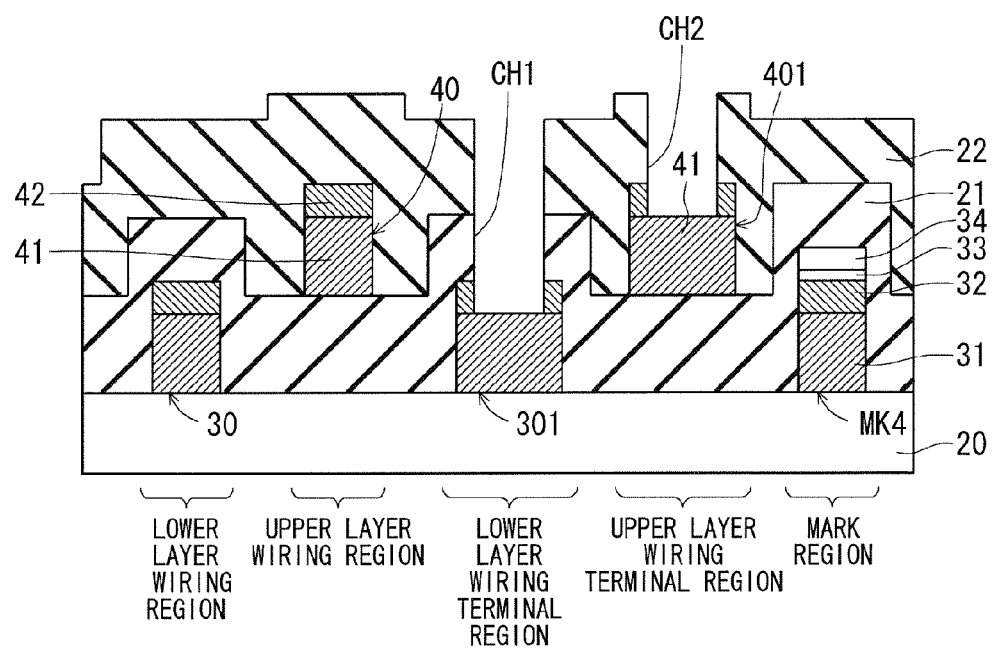
FIG. 53 is a cross-sectional view showing a configuration of a touch panel of a fourth preferred embodiment according to the present invention.

Then, a fourth preferred embodiment according to the present invention will be described with reference to FIG. 53 to FIG. 58. FIG. 53 is a view corresponding to a state in which the resist mask shown in FIG. 18 in the first preferred embodiment is removed. The contact hole CH1 provided above the lower layer wiring terminal 301 penetrates the low-reflection film 32 and reaches the low-resistance conductive film 31, and the contact hole CH2 provided above the upper layer wiring terminal 401 penetrates the low-reflection film 42 and reaches the low-resistance conductive film 41. In addition, a mark kind MK4 is formed of laminated films of the low-resistance conductive film 31, the low-reflection film 32, the cap film 33, and a non-low-reflection film 34, and a contact hole is not provided above the mark kind MK4. In addition, as for the same configuration as in FIG. 18, the same reference is affixed thereto and its description is omitted.

The low-resistance conductive film 31 is composed of Al series alloy serving as a low resistance material such as AlNiNd, and has a thickness of 300 nm.

The low-reflection film 32 is formed of an aluminum (Al) nitride film having a high degree of nitridation in which a degree of nitridation is 30 at % to 50 at % (atomic %) as a composition ratio of nitrogen, and has a thickness of 50 nm, for example.

The interlayer insulating film 21 is composed of $SiO_2$, and has a thickness of 600 nm, for example.

The low-resistance conductive film 41 of the upper layer wiring 40 is composed of aluminum (Al) series alloy serving as a low resistance material such as AlNiNd, and has a thickness of 400 nm, for example.

The low-reflection film 42 is formed of an Al nitride film having a high degree of nitridation in which a degree of nitridation is 30 at % to 50 at % (atomic %) as a composition ratio of nitrogen, and has a thickness of 50 nm, for example.

The protective film 22 is composed of $SiO_2$, and has a thickness of 300 nm, for example.

The cap film 33 is composed of amorphous ITO, and has a thickness of about 50 nm, and the non-low-reflection film 34 is composed of chrome (Cr), and has a thickness of about 50 nm.

In addition, the material of the cap film 33 is not limited to ITO as long as it can be selectively etched with the non-low-reflection film 34, and can be selectively etched at high level with the low-reflection film 32 and the low-resistance conductive film 31 when the cap film 33 is etched.

In addition, the non-low-reflection film 34 is preferably composed of material which can be selectively etched at high level with the low-reflection film 32 and the low-resistance conductive film 31, and its reflectivity is 30% or more at the end of its film formation, higher than the reflectivity of the low-reflection film after the interlayer insulating film 21 and the protective film 22 have been formed so that the alignment mark can be recognized after the resist has been applied, and 20% or more with respect to a wavelength of a light source used for a focusing operation of an exposure apparatus for forming the ID.

Next, a method for manufacturing a display device of the fourth preferred embodiment according to the present invention will be described with reference to FIG. 54 to FIG. 58.

Figure 54:
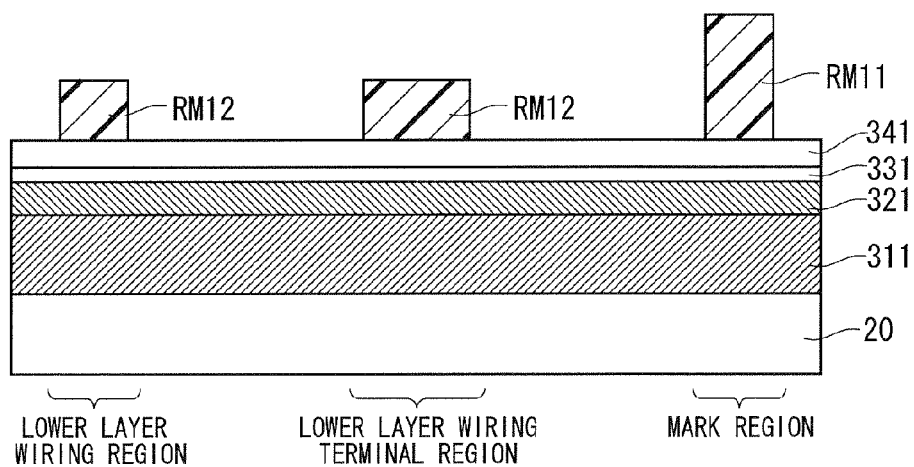
FIG. 54 to FIG. 58 are cross-sectional views for describing steps of manufacturing the touch panel of the fourth preferred embodiment according to the present invention.

First, in steps to attain a state shown in a cross-sectional view shown in FIG. 54, the AlNiNd film 311 having a thickness of 300 nm is formed with AlNiNd target, on the transparent substrate 20 composed of glass or PET, by sputtering. Then, in the same film forming apparatus, the Al nitride alloy film 321 having a high degree of nitridation and a thickness of 50 nm is formed with AlNiNd target, on the AlNiNd film 311 in an atmosphere containing $N_2$ gas, by sputtering. In addition, the degree of nitridation of the Al nitride alloy film 321 is the same as that of the first preferred embodiment.

Then, the ITO film 331 having a thickness of 50 nm is formed on the Al nitride alloy film 321 by sputtering.

Then, a Cr film 341 having a thickness of 10 nm to 30 nm is formed on the ITO film 331 by sputtering.

Then, a resist material is applied to the Cr film 341, the thick resist mask RM11 is patterned above the mark region, and the thin resist mask RM12 is patterned above each of the lower layer wiring region and the lower layer wiring terminal region, by use of multistage exposure (half-tone exposure or gray-tone exposure), so that the state shown in FIG. 54 is provided.

Figure 55:
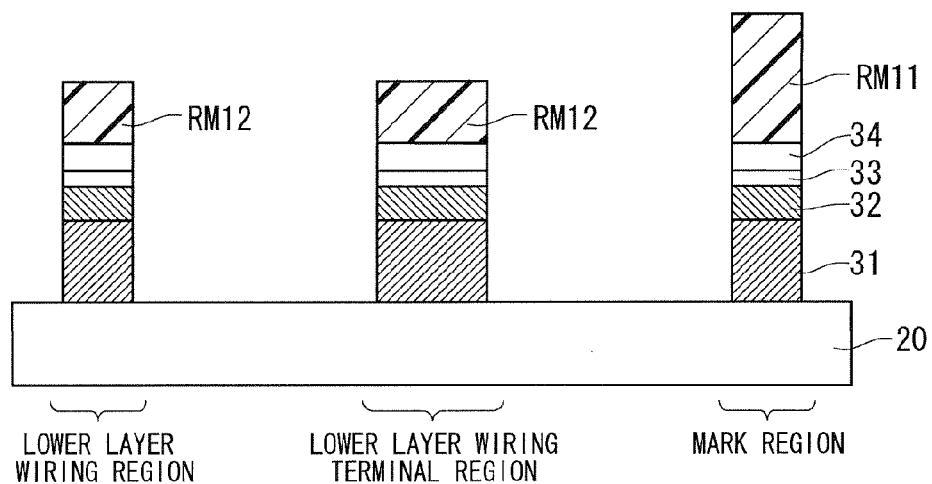

Then, as shown in FIG. 55, with the resist masks RM11 and RM12 used as etching masks, the Cr film 341 is etched, for example with mixed solution of nitrate acid and ceric ammonium nitrate to pattern the non-low-reflection film 34. Here, the term "non-low-reflection" means that its reflectivity is higher than a minimum reflectivity at which the exposure apparatus for forming the ID can perform the focusing operation.

Then, with the resist masks RM11 and RM12, and the non-low-reflection film 34 as etching masks, the cap film 33 used as etching masks, the ITO film 331 is etched, for example with oxalic acid solution to pattern the cap film 33.

Then, with the resist masks RM11 and RM12, the non-low-reflection film 34, and the cap film 33 used as etching masks, the Al nitride alloy film 321 and the AlNiNd film 311 are etched, for example with mixed acid of phosphoric acid, nitric acid, and acetic acid, to pattern the low-reflection film 32 and the low-resistance conductive film 31, respectively.

Figure 56:
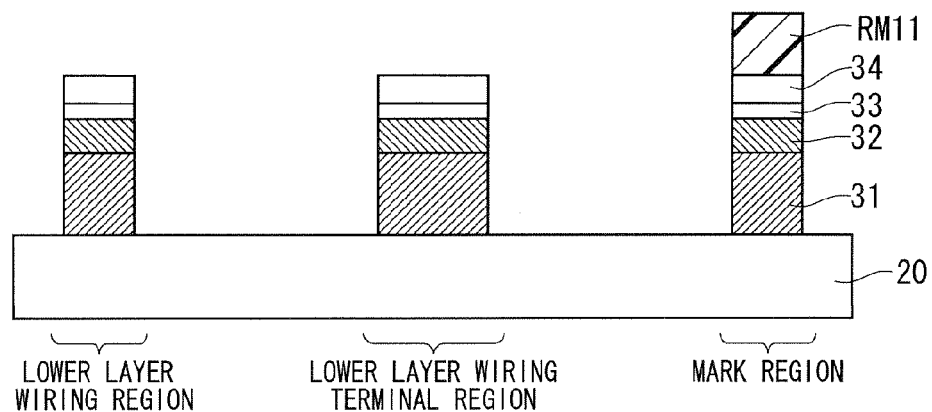

Then, as shown in FIG. 56, the thin resist mask RM12 is removed by ashing under the process condition that the thick resist mask RM11 is left as a pattern.

Figure 57:
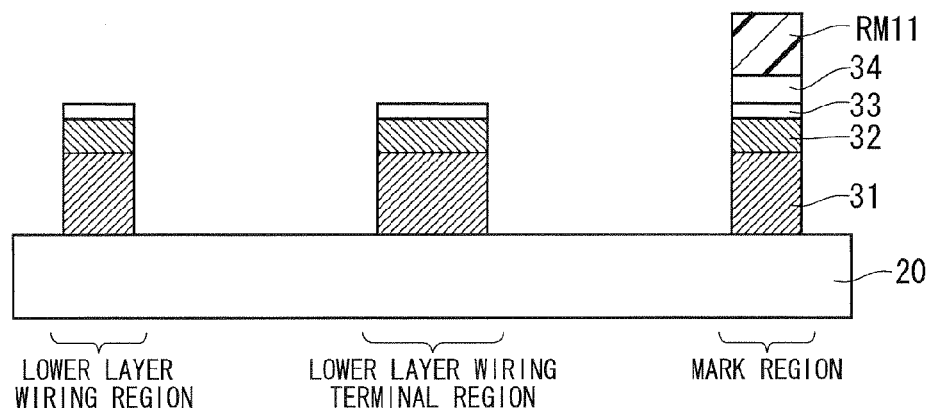

Then, as shown in FIG. 57, the non-low-reflection film 34 not covered with the resist mask is removed, for example with mixed solution of nitrate acid and ceric ammonium nitrate.

Figure 58:
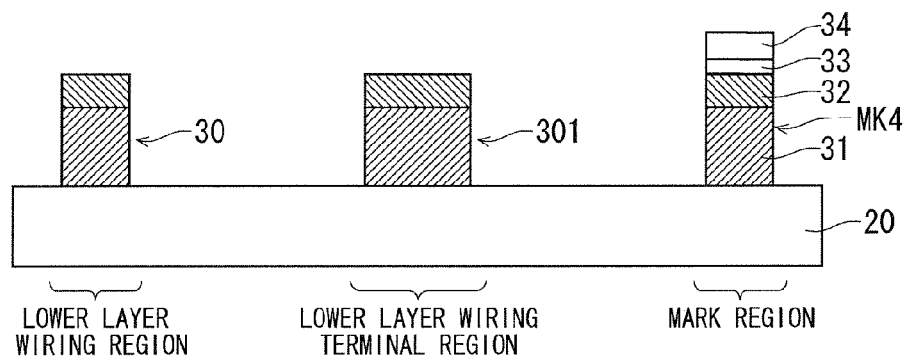

Then, as shown in FIG. 58, the resist mask RM11 is removed with mixed solution of monoethanolamine and dimethylsulfoxide, and then the cap film not covered with the non-low-reflection film 34 is removed with oxalic acid solution.

Then, the interlayer insulating film 21 is formed of a $SiO_2$ film having a thickness of about 600 nm so as to cover the lower layer wiring 30, the lower layer wiring terminal 301, and the mark kind MK4 by CVD, and then the upper layer wiring 40 and the upper layer wiring terminal 401 are formed on the interlayer insulating film 21, but a method is the same as the manufacturing method of the first preferred embodiment described with reference to FIG. 13 to FIG. 18 except that the contact hole is not provided above the mark kind MK4, so that description thereof is omitted.

When the manufacturing method described in the above is employed, the mark kind having the high reflectivity can be formed without adding a new step, so that the photolithography processes for the interlayer insulating film 21 and the protective film 22 can be stably performed, and a manufacturing line can be configured at low costs.

In addition, when the sheet ID is formed on a lower layer, each mother substrate can be recognized during the array process, which can be used for investigation into a cause of a process defect.

<Variation>

According to the above-described fourth preferred embodiment, the wiring and the wiring terminal are formed of the laminated films of the low-resistance conductive film and the low-reflection film, but they may be formed of laminated films of the low-resistance conductive film, the low-reflection film, and the transparent cap film.

Figure 59:
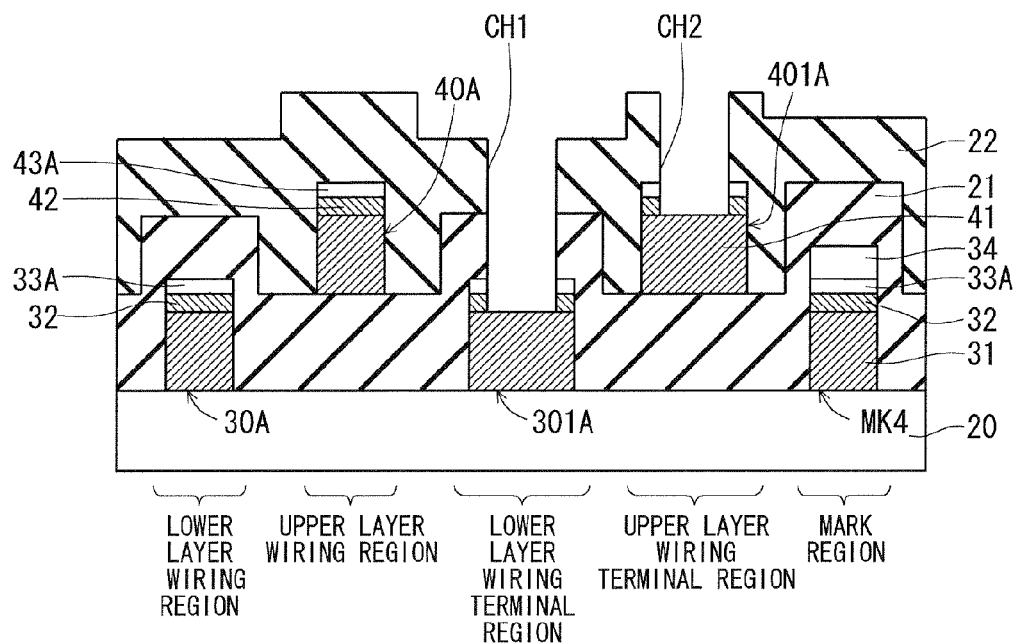
FIG. 59 is a cross-sectional view showing a configuration of a variation of the touch panel of the fourth preferred embodiment according to the present invention.

That is, as shown in FIG. 59, the transparent cap film 33A is arranged on the low-reflection film 32, and the transparent cap film 43A is arranged on the low-reflection film 42. In addition, as for the same configuration as in FIG. 53, the same reference is affixed thereto and its description is omitted.

As shown in FIG. 59, the contact hole CH1 provided above the lower layer wiring terminal 301A penetrates the transparent cap film 33A and the low-reflection film 32 and reaches the low-resistance conductive film 31, and the contact hole CH2 provided above the upper layer wiring terminal 401A penetrates the transparent cap film 43A and the low-reflection film 42 and reaches the low-resistance conductive film 41. Each of the transparent cap films 33A and 43A is composed of amorphous IZO and has a thickness of about 50 nm.

In addition, the mark kind MK4 is formed of laminated films of the low-resistance conductive film 31, the low-reflection film 32, the cap film 33A, and the non-low-reflection film 34.

In this configuration, the same effect as that of the fourth preferred embodiment can be provided, and since the transparent cap film is not removed, the transparent cap film need not regard the etch selectivity with respect to the Al nitride alloy film and low-resistance conductive film, so that choices can be widened for a material of the transparent cap film and its process, and manufacturing costs can be reduced.

<Fifth Preferred Embodiment>

Next, a fifth preferred embodiment according to the present invention will be described with reference to FIG. 60 to FIG. 64. FIG. 60 is a view corresponding to the state of the variation of the third preferred embodiment shown in FIG. 46. Each of a lower layer wiring 30B and a lower layer wiring terminal 301D is formed of laminated films of a transparent film 35 and a translucent film 36 sequentially laminated on the low-resistance conductive film 31, and a mark kind MK6 is formed of laminated films of the transparent film 35 laminated on the low-resistance conductive film 31. In addition, each of an upper layer wiring 40B and an upper layer wiring terminal 401D is formed of laminated films of a transparent film 45 and a translucent film 46 sequentially laminated on the low-resistance conductive film 41.

The contact hole CH1 provided above the lower layer wiring terminal 301D penetrates the translucent film 36 and the transparent film 35 and reaches the low-resistance conductive film 31, and the contact hole CH2 provided above the upper layer wiring terminal 401D penetrates the translucent film 46 and the transparent film 45 and reaches the low-resistance conductive film 41. In addition, the contact hole is not provided above the mark kind MK6. The contact hole may not be provided above the mark kind MK6 as long as the mark kind MK6 is formed of only the planar shape of the low-resistance conductive film 31 such as the alignment mark and does not need the identification mark such as the panel ID. In addition, as for the same configuration as in FIG. 46, the same reference is affixed thereto and its description is omitted.

The low-resistance conductive film 31 is composed of Al series alloy serving as a low resistance material such as AlNiNd, and has a thickness of 300 nm.

The transparent film 35 is composed of IZO to have a thickness of about 50 nm, and the translucent film 36 is composed of molybdenum (Mo) to have a thickness of about 5 nm.

The interlayer insulating film 21 is composed of $SiO_2$, and has a thickness of 600 nm, for example.

The low-resistance conductive film 41 is composed of aluminum (Al) series alloy serving as a low resistance material such as AlNiNd, and has a thickness of 400 nm, for example.

The transparent film 45 is composed of IZO to have a thickness of about 50 nm, and the translucent film 46 is composed of molybdenum (Mo) to have a thickness of about 5 nm.

The protective film 22 is composed of $SiO_2$, and has a thickness of 300 nm, for example.

As described above, the wiring is formed of the laminated films of the low-resistance conductive film, the transparent film, and the translucent film, so that it is possible to offset the externally incident light reflected on the low-resistance conductive film and emitted after passing through the translucent film, and the light reflected on a surface of the translucent film, due to a light interference effect. Consequently, a reflection preventing effect can be further enhanced. In addition, the laminated films of the transparent film and the translucent film prevent the reflection due to the light interference effect, so that they can be referred to as the antireflective film.

Meanwhile, since the mark kind is formed of the laminated films of the low-resistance conductive film and the transparent film, the reflectivity above the mark kind can be increased, so that an alignment operation in the terminal opening step can be stably performed.

In addition, the contact hole may not penetrate the transparent film 36 and the translucent film 35 provided above each terminal as long as connection resistance between the low-resistance conductive film and the transparent film, and between the transparent film and the translucent film do not effect an operation of the touch panel.

In addition, as another configuration, the contact hole may penetrate the translucent film 36 and the transparent film 35 in the mark kind.

Next, a method for manufacturing a display device of the fifth preferred embodiment according to the present invention will be described with reference to FIG. 61 to FIG. 64.

First, in steps to attain a state shown in a cross-sectional view shown in FIG. 61, the AlNiNd film 311 having a thickness of 300 nm is formed with AlNiNd target, on the transparent substrate 20 composed of glass or PET, by sputtering.

Then, an IZO film is formed on the AlNiNd film to have a thickness of 50 nm by sputtering, and a Mo film is formed on the IZO film to have a thickness of 5 nm by sputtering.

Then, a resist material is applied to the Mo film, a thick resist mask (shown as the resist mask RM11 in FIG. 61) is patterned above each of the lower layer wiring region and the lower layer wiring terminal region, and a thin resist mask (shown as the resist mask RM12 in FIG. 61) is patterned above the mark region, by use of multistage exposure (half-tone exposure or gray-tone exposure).

Then, with the resist masks RM11 and RM12 used as etching masks, the Mo film is etched, for example with mixed acid of phosphoric acid, nitric acid, and acetic acid to pattern the translucent film 36.

Then, with the resist masks RM11 and RM12, and the translucent film 36 used as etching masks, the IZO film is etched, for example with oxalic acid solution to pattern the transparent film 35.

Then, with the resist masks RM11 and RM12, the translucent film 36, and the transparent film 35 used as etching masks, the AlNiNd film is etched, for example with mixed acid of phosphoric acid, nitric acid, and acetic acid to pattern the low-resistance conductive film 31, whereby the state shown in FIG. 61 is provided.

Then, as shown in FIG. 62, the thin resist mask RM12 is removed by ashing under the process condition that the thick resist mask RM11 is left as a pattern.

Then, as shown in FIG. 63, the translucent film 36 not covered with the resist mask is removed, for example with mixed solution of phosphoric acid, nitric acid, and acetic acid.

Then, as shown in FIG. 64, the resist mask RM11 is removed, for example with mixed solution of monoethanolamine and dimethylsulfoxide.

Then, the interlayer insulating film 21 is formed of a $SiO_2$ film having a thickness of about 600 nm so as to cover the lower layer wiring 30B, the lower layer wiring terminal 301D, and the mark kind MK6 by CVD, and then the upper layer wiring 40B and the upper layer wiring terminal 401D are formed on the interlayer insulating film 21, but the method is the same as the method for manufacturing the lower layer wiring 30B and the lower layer wiring terminal 301D, so that description thereof is omitted.

Then, the protective film 22 is formed by forming a $SiO_2$ film having a thickness of about 300 nm so as to cover the upper layer wiring 40B, and the upper layer wiring terminal 401D by CVD, for example.

In addition, in the step of thinning the thick resist mask RM11 by the ashing as described with reference to FIG. 62, a part of the translucent film 36 not covered with resist mask may be oxidized so that a mark kind MK7 has a translucent film 37 formed of laminated films of the oxidized Mo film and the Mo film as shown in FIG. 65.

Furthermore, at the time of ashing process of the resist mask, a surface of the translucent film 36 may be etched a little to be thinned to form a mark kind MK8 having a translucent film 38 which is changed in transmittance, as shown in FIG. 66. In addition, the etching at this time is performed so that a film thickness t1 of the translucent film 38 becomes 2 nm to 3 nm which is about a half of a thickness t2 of the translucent film 36.

Thus, by partially oxidizing the translucent film, or thinning the translucent film, an interference balance between the light reflected on the low-resistance conductive film and emitted after passing through the translucent film, and the light reflected on the surface of the translucent film is broken down, so that the reflectivity in the mark kind can be further enhanced.

Figure 67:
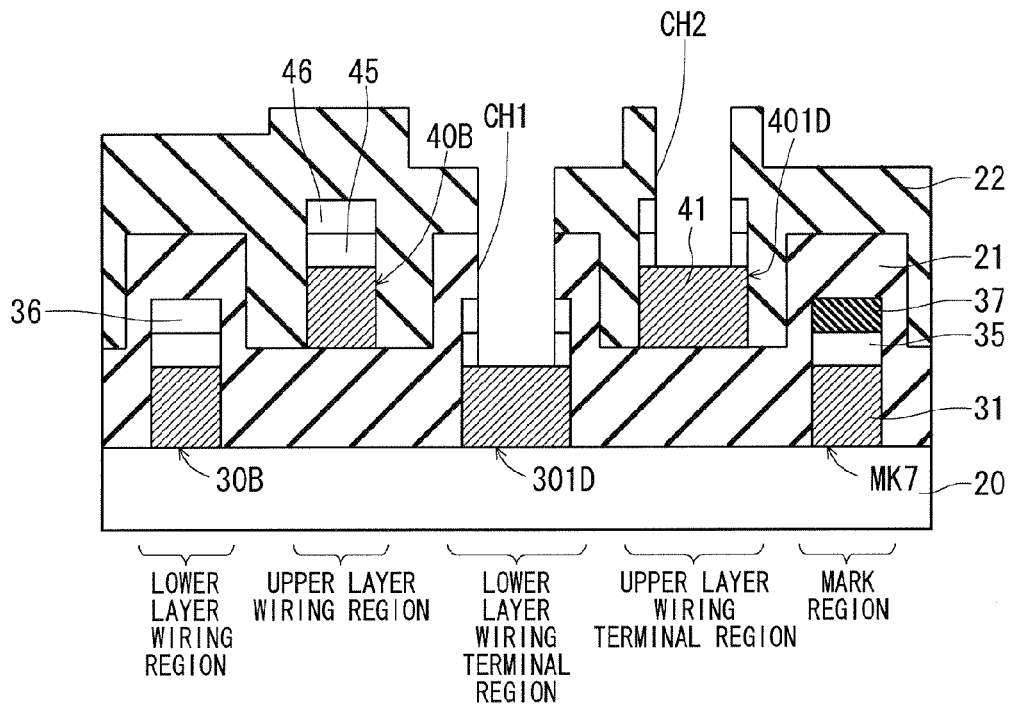
FIG. 67 is a cross-sectional view showing a configuration of a variation of the touch panel of the fifth preferred embodiment according to the present invention.

In addition, FIG. 67 shows a cross-sectional configuration of a display device provided with the mark kind MK7 having the translucent film 37 formed of the laminated films of the oxidized Mo film and the Mo film.

The method for partially oxidizing the translucent film includes a method for oxidizing the translucent film by annealing it within a temperature range at which the resist material is not hardened, as well as ashing, or the oxidized Mo film may be removed to thin the film.

<Sixth Preferred Embodiment>

Figure 68:
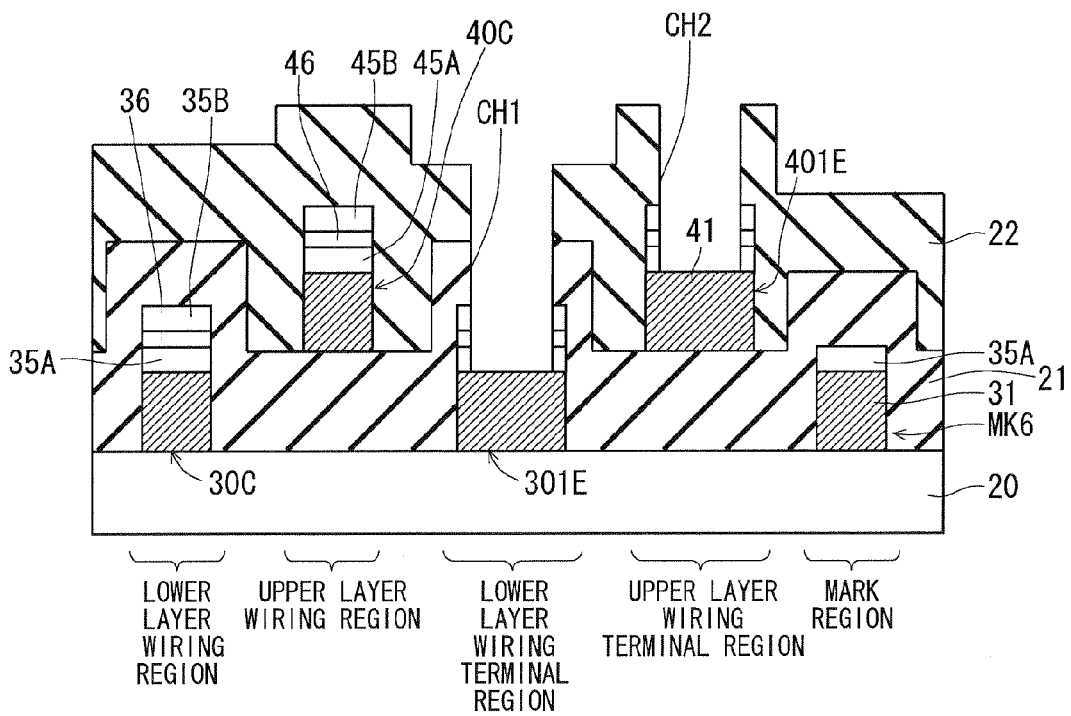
FIG. 68 is a cross-sectional view showing a configuration of a touch panel of a sixth preferred embodiment according to the present invention.

Next, a sixth preferred embodiment according to the present invention will be described with reference to FIG. 68 to FIG. 73. FIG. 68 is a view corresponding to the state of the variation of the third preferred embodiment shown in FIG. 46. Each of a lower layer wiring 30C and a lower layer wiring terminal 301E is formed of laminated films of a transparent film 35A, the translucent film 36, and a transparent film 35B sequentially laminated on the low-resistance conductive film 31, and the mark kind MK6 is formed of laminated films of the transparent film 35A laminated on the low-resistance conductive film 31. In addition, each of an upper layer wiring 40C and an upper layer wiring terminal 401E is formed of laminated films of a transparent film 45A, the translucent film 46, and a transparent film 45B sequentially laminated on the low-resistance conductive film 41.

The contact hole CH1 provided above the lower layer wiring terminal 301E penetrates the transparent film 35B, the translucent film 36, and the transparent film 35A and reaches the low-resistance conductive film 31, and the contact hole CH2 provided above the upper layer wiring terminal 401E penetrates the transparent film 45B, the translucent film 46, and the transparent film 45A and reaches the low-resistance conductive film 41. In addition, the contact hole is not provided above the mark kind MK6. In addition, as for the same configuration as in FIG. 46, the same reference is affixed thereto and its description is omitted.

The low-resistance conductive film 31 is composed of Al series alloy serving as a low resistance material such as AlNiNd, and has a thickness of 300 nm, for example.

The transparent film 35A is composed of IZO to have a thickness of about 50 nm, the translucent film 36 is composed of Mo to have a thickness of about 8 nm, and the transparent film 35B is composed of IZO to have a thickness of about 60 nm.

The interlayer insulating film 21 is composed of $SiO_2$, and has a thickness of 600 nm, for example.

The low-resistance conductive film 41 is composed of Al series alloy serving as a low resistance material such as AlNiNd, and has a thickness of 400 nm, for example.

The transparent film 45A is composed of IZO to have a thickness of about 50 nm, the translucent film 46 is composed of Mo to have a thickness of about 8 nm, and the transparent film 45B is composed of IZO to have a thickness of about 60 nm, for example.

The protective film 22 is composed of $SiO_2$, and has a thickness of 300 nm, for example.

As described above, when the wiring is formed of the laminated films of the low-resistance conductive film, the transparent film, the translucent film, and the transparent film, it becomes possible to further enhance the reflection preventing effect due to a synergetic effect of the interference effect due to the interlayer insulating film (protective film), the transparent film, and the translucent film, and the light interference effect due to the translucent film and the transparent film. In addition, the laminated films in which the transparent films are arranged on the upper and lower sides of the translucent film can be referred to as the antireflective film because they prevent the reflection due to the light interference effect.

Meanwhile, since the mark kind is formed of the laminated films of the low-resistance conductive film and the transparent film, the reflectivity above the mark kind can be increased, so that an alignment operation in the terminal opening step can be stably performed.

In addition, the contact hole may not penetrate the transparent film, the translucent film, and the transparent film provided above each terminal as long as connection resistance between the low-resistance conductive film and the transparent film, between the transparent film and the translucent film, and between the translucent film and the transparent film do not effect an operation of the touch panel.

Next, a method for manufacturing a display device of the sixth preferred embodiment according to the present invention will be described with reference to FIG. 69 to FIG. 73.

Figure 69:
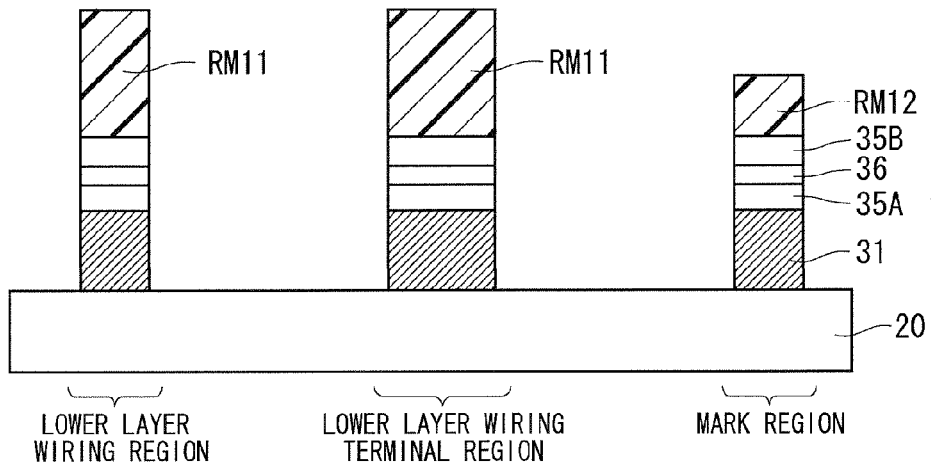
FIG. 69 to FIG. 73 are cross-sectional views for describing steps of manufacturing the touch panel of the sixth preferred embodiment according to the present invention.

First, in steps to attain a state shown in a cross-sectional view shown in FIG. 69, an AlNiNd film having a thickness of 300 nm is formed with AlNiNd target, on the transparent substrate 20 composed of glass or PET, by sputtering.

Then, an IZO film is formed on the AlNiNd film to have a thickness of 50 nm by sputtering, a Mo film is formed on the IZO film to have a thickness of 8 nm by sputtering, and an IZO film is formed on the Mo film to have a thickness of 60 nm by sputtering.

Then, a resist material is applied to the IZO film, a thick resist mask RM11 is patterned above each of the lower layer wiring region and the lower layer wiring terminal region, and a thin resist mask RM12 is patterned above the mark region, by use of multistage exposure (half-tone exposure or gray-tone exposure).

Then, with the resist masks RM11 and RM12 used as etching masks, the IZO film is etched, for example with oxalic acid solution to pattern the transparent film 35B.

Then, with the resist masks RM11 and RM12, and the transparent film 35B used as etching masks, the Mo film is etched, for example with mixed acid of phosphoric acid, nitric acid, and acetic acid to pattern the translucent film 36.

Then, with the resist masks RM11 and RM12, the transparent film 35B, and the translucent film 36 used as etching masks, the IZO film is etched, for example with oxalic acid solution to pattern the transparent film 35A.

Then, with the resist masks RM11 and RM12, the transparent film 35B, the translucent film 36, and the transparent film 35A used as etching masks, AlNiNd film is etched, for example with mixed acid of phosphoric acid, nitric acid, and acetic acid to pattern the low-resistance conductive film 31, whereby the state shown in FIG. 69 is provided.

Figure 70:
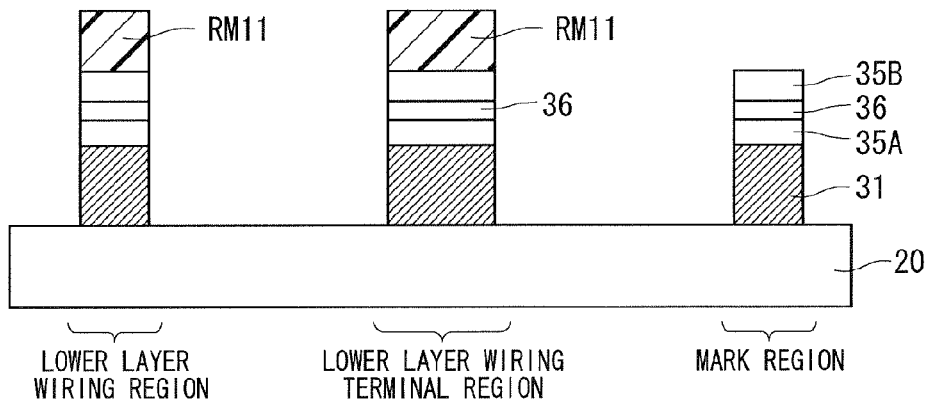

Then, as shown in FIG. 70, the thin resist mask RM12 is removed by ashing under the process condition that the thick resist mask RM11 is left as a pattern.

Figure 71:
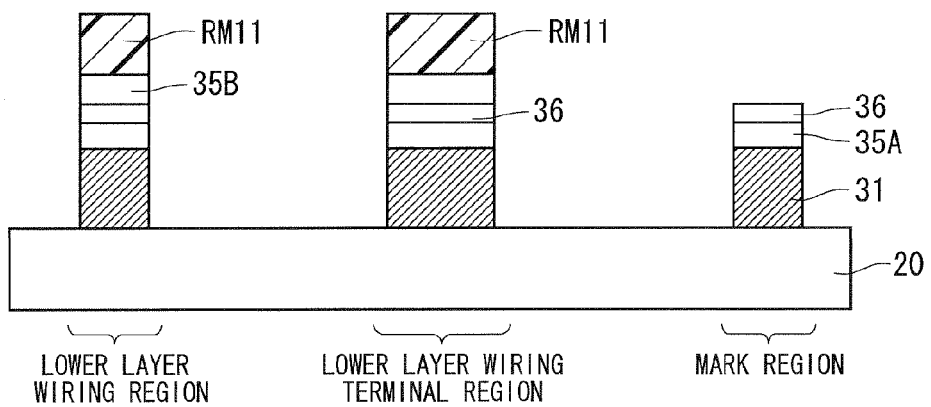

Then, as shown in FIG. 71, the transparent film 35B not covered with the resist mask is removed, for example with oxalic acid solution.

Figure 72:
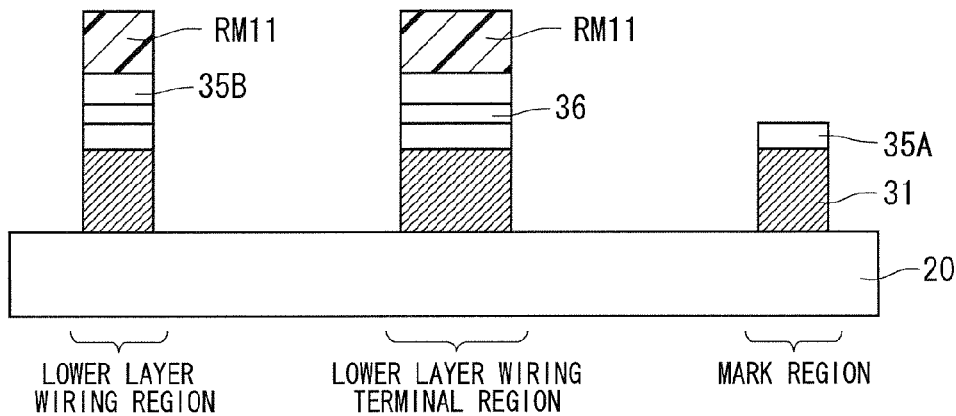

Then, as shown in FIG. 72, the translucent film 36 not covered with the resist mask is removed, for example with mixed solution of phosphoric acid, nitric acid, and acetic acid.

Figure 73:
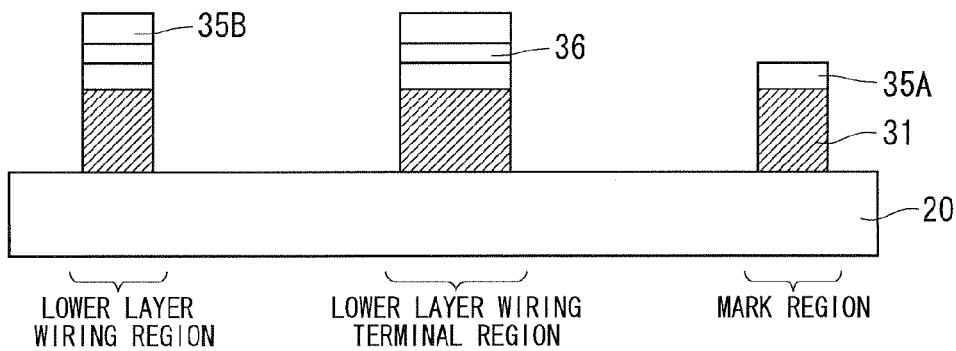

Then, as shown in FIG. 73, the resist mask RM11 is removed, for example with mixed solution of monoethanolamine and dimethylsulfoxide.

Then, the interlayer insulating film 21 is formed of a $SiO_2$ film having a thickness of 600 nm so as to cover the lower layer wiring 30C, the lower layer wiring terminal 301E, and the mark kind MK6 by CVD, and then the upper layer wiring 40C and the upper layer wiring terminal 401E are formed on the interlayer insulating film 21, but the method is the same as the method for manufacturing the lower layer wiring 30C and the lower layer wiring terminal 301E, so that description thereof is omitted.

Then, the protective film 22 is formed by forming a $SiO_2$ film having a thickness of about 300 nm so as to cover the upper layer wiring 40C, and the upper layer wiring terminal 401E by CVD.

Figure 74:
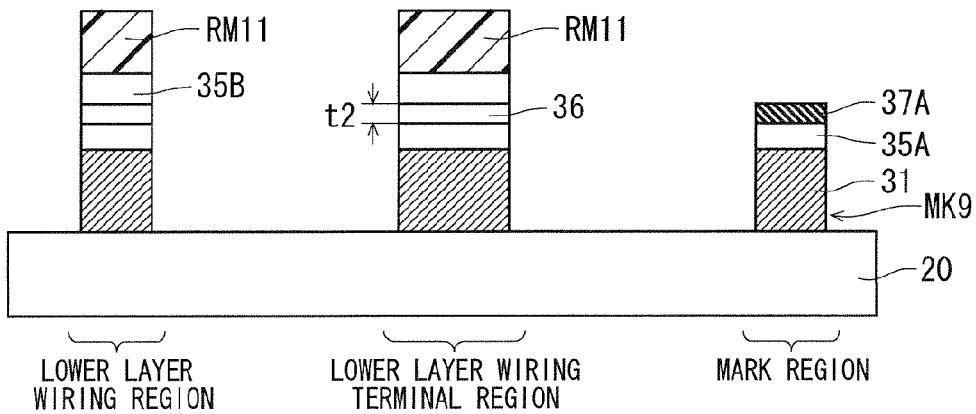
FIG. 74 and FIG. 75 are cross-sectional views for describing steps of manufacturing variations of the touch panel of the sixth preferred embodiment according to the present invention.

In addition, a mark kind MK9 may be formed to have a translucent film 37A which is provided such that after the transparent film 35B has been removed as described with reference to FIG. 71, a surface of the translucent film 36 is annealed to be oxidized at the same time within a temperature range at which the resist material is not hardened, and the translucent film becomes an oxidized Mo film, as shown in FIG. 74.

Figure 75:
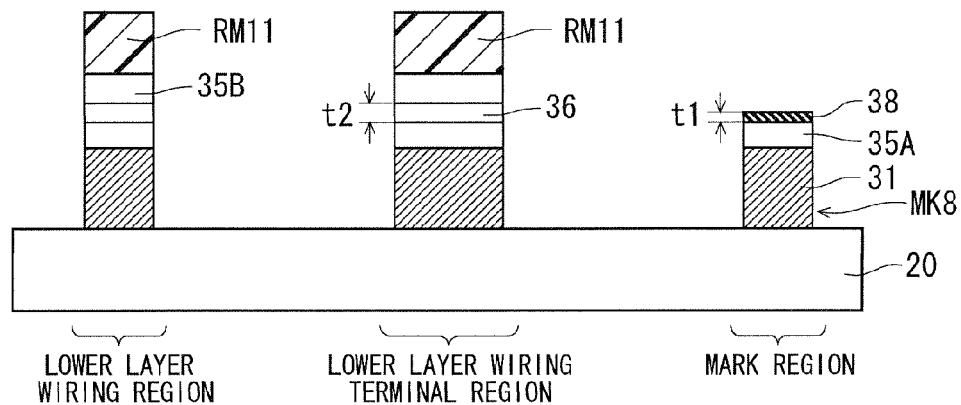

In addition, the mark kind MK8 may be formed to have the translucent film 38 which is provided such that after the transparent film 35B has been removed as described with reference to FIG. 71, the surface of the translucent film 36 is etched a little to be thinned and changed in transmittance, as shown in FIG. 75. The etching at this time is performed such that a film thickness t1 of the translucent film 38 becomes 4 nm to 5 nm which is about a half of a thickness t2 of the translucent film 36.

As described above, by partially oxidizing the translucent film, or thinning the translucent film, an interference balance between the light reflected on the low-resistance conductive film and emitted after passing through the translucent film, and the light reflected on the surface of the translucent film is broken down, so that the reflectivity in the mark kind can be further enhanced.

Figure 76:
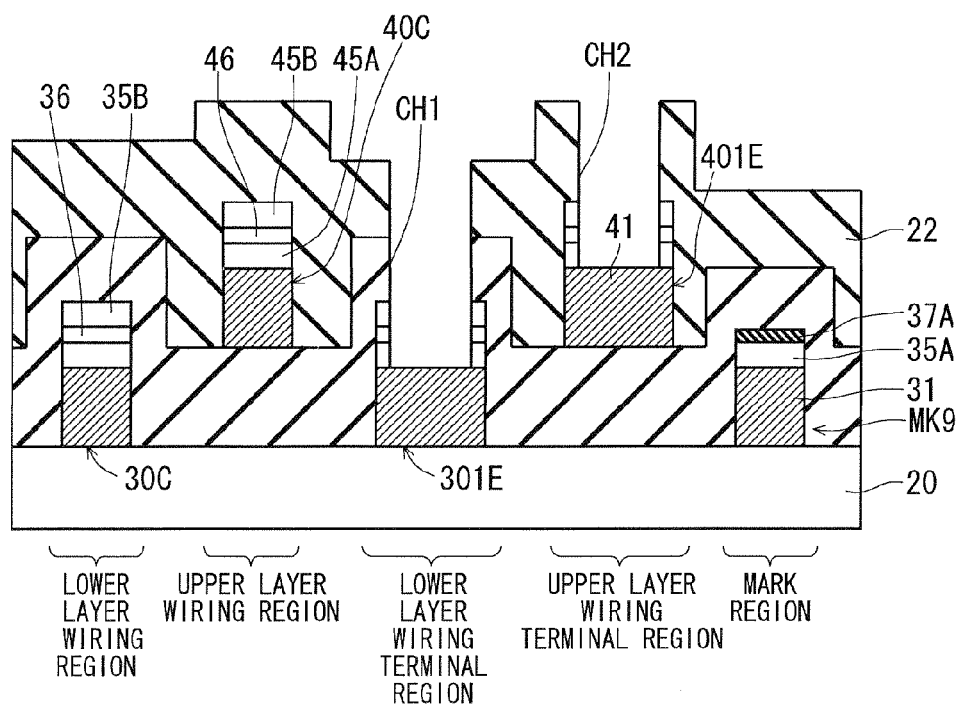
FIG. 76 and FIG. 77 are cross-sectional views showing configurations of variations of the touch panel of the sixth preferred embodiment according to the present invention.

In addition, FIG. 76 shows a cross-sectional configuration of a display device provided with the mark kind MK9 having the translucent film 37A.

Figure 77:
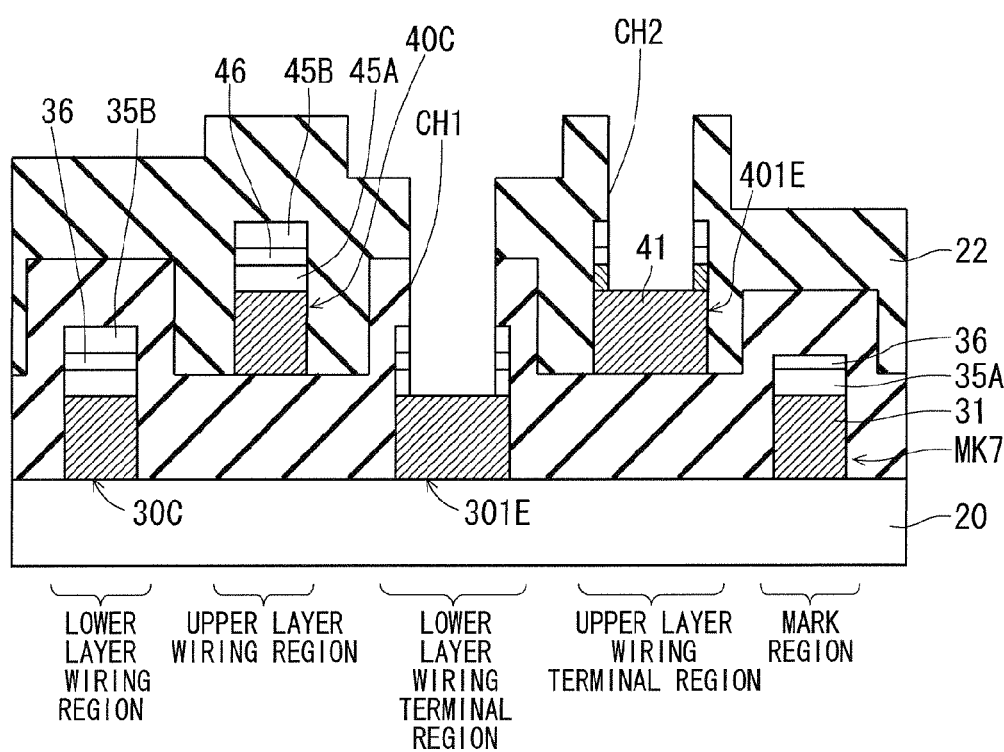

Furthermore, the mark kind MK7 may be formed of the low-resistance conductive film 31, the transparent film 35A, and the translucent film 36 which is not removed after the transparent film 35B has been removed as described with reference to FIG. 71. This configuration is shown in FIG. 77.

In addition, the first to fourth preferred embodiments show the case where the interlayer insulating film 21 and the protective film 22 are composed of $SiO_2$, but they may be formed of an insulating film which does not influence a color of transmitted light in a light transmitting part other than the wiring part, and for example, a coating type spin on glass (SOG) film may be used for them. In addition, when the SOG film is used as the interlayer insulating film 21, the upper layer wiring can be prevented from being broken at the intersection with the lower layer wiring.

In addition, since the Al nitride alloy is used as the low-reflection film, and the cap film is provided to prevent the low-reflection film from being damaged when the resist is removed, but as long as the low-reflection film is not damaged when the resist is removed, the cap film may not be provided.

Still furthermore, in the second, third, fifth, and sixth preferred embodiments, in the case where the panel ID or the like is formed in the post-step, a pad may be formed to have high reflectivity by the same method as that of the mark kind, and may be formed into the same state as that of the terminal opening part.

In addition, while the present invention is applied to the wiring and the mark kind of the touch panel in the above-described first to sixth preferred embodiments, it may be applied to a wiring and a mark kind of a liquid crystal display, and may be also applied to a light-blocking layer for reducing reflection on a display surface side of the liquid crystal display.

In addition, according to the present invention, the above preferred embodiments can be arbitrarily combined, or each preferred embodiment can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A display device comprising:
a laminated wiring comprising a conductive film, and an antireflective film sequentially arranged on a base layer;
a wiring terminal part provided at an end part of said laminated wiring and having a same laminated structure as that of said laminated wiring; and
an insulating film for covering said laminated wiring and said wiring terminal part, in which said insulating film side serves as a display surface side, wherein
said wiring terminal part has a first opening part penetrating said insulating film and said antireflective film and reaching said conductive film, and
an outer peripheral portion of said first opening part has a laminated structure of said conductive film, said antireflective film, and said insulating film, in at least one part.

2. The display device according to claim 1, further comprising:
at least one of a mark and an identification mark covered with said insulating film and used in a manufacturing step, wherein
each of said mark and said identification mark comprises:
a laminated film of said conductive film and said antireflective film, and
a second opening part penetrating said insulating film and said antireflective film and reaching said conductive film, and
an outer peripheral portion of said second opening part has a laminated structure of said conductive film, said antireflective film, and said insulating film, in at least one part.

3. The display device according to claim 1, further comprising:
a mark covered with said insulating film and used in a manufacturing step, wherein
said mark comprises:
a laminated film of said conductive film and said antireflective film, and
a film thickness of said antireflective film of said laminated film is formed to be thinner than a film thickness of said antireflective film of said laminated wiring.

4. The display device according to claim 3, wherein
a film thickness of said antireflective film of said wiring terminal part is formed to be the same as a film thickness of said antireflective film of said mark.

5. The display device according to claim 1, further comprising:
a mark covered with said insulating film and used in a manufacturing step, wherein
said mark comprises:
a laminated film of said conductive film, said antireflective film, a cap film functioning as an etching protective film, and a non-low-reflection film having reflectivity of 30% or more.

6. A display device comprising:
a laminated wiring comprising a conductive film, and an antireflective film sequentially arranged on a base layer;
a wiring terminal part provided at an end part of said laminated wiring; and
an insulating film for covering said laminated wiring and said wiring terminal part, in which said insulating film side serves as a display surface side, wherein
said wiring terminal part comprises said conductive film,
said wiring terminal part has a first opening part penetrating said insulating film and reaching said conductive film, and
an outer peripheral portion of said first opening part has a laminated structure of said conductive film, and said insulating film, in at least one part.

7. The display device according to claim 6, further comprising:
a mark covered with said insulating film and used in a manufacturing step, wherein
said mark comprises said conductive film.

8. A display device comprising:
a laminated wiring comprising a conductive film, and a multilayered reflection reducing film having a reflection preventing effect due to a light interference effect, sequentially arranged on a base layer;
a wiring terminal part provided at an end part of said laminated wiring and having a same laminated structure as that of said laminated wiring; and
an insulating film for covering said laminated wiring and said wiring terminal part, in which said insulating film side serves as a display surface side, wherein
said wiring terminal part has a first opening part penetrating said insulating film and said reflection reducing film and reaching said conductive film, and
an outer peripheral portion of said first opening part has a laminated structure of said conductive film, said reflection reducing film, and said insulating film, in at least one part.

9. The display device according to claim 8, further comprising:
a mark covered with said insulating film and used in a manufacturing step, wherein said mark comprises a laminated film of said conductive film, and said reflection reducing film having at least one layer removed or thinned.

10. The display device according to claim 8, wherein said reflection reducing film comprises a transparent film and a translucent film sequentially arranged on said conductive film.

11. The display device according to claim 8, wherein said reflection reducing film comprises a transparent film, a translucent film, and a transparent film sequentially arranged on said conductive film.

* * * * *